(12) United States Patent
Choi et al.

(10) Patent No.: US 10,910,519 B2
(45) Date of Patent: *Feb. 2, 2021

(54) SEMICONDUCTOR DEVICE HAVING LAYERS INCLUDING ALUMINUM AND SEMICONDUCTOR DEVICE PACKAGE INCLUDING SAME

(71) Applicant: LG INNOTEK CO., LTD., Seoul (KR)

(72) Inventors: Rak Jun Choi, Seoul (KR); Byeoung Jo Kim, Seoul (KR); Hyun Jee Oh, Seoul (KR); Sung Ho Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/331,039

(22) PCT Filed: Sep. 13, 2017

(86) PCT No.: PCT/KR2017/010065
§ 371 (c)(1),
(2) Date: Mar. 6, 2019

(87) PCT Pub. No.: WO2018/052252
PCT Pub. Date: Mar. 22, 2018

(65) Prior Publication Data
US 2019/0267514 A1  Aug. 29, 2019

(30) Foreign Application Priority Data

Sep. 13, 2016 (KR) .................. 10-2016-0118243
Oct. 26, 2016 (KR) .................. 10-2016-0140466
Sep. 11, 2017 (KR) .................. 10-2017-0115836

(51) Int. Cl.
*H01L 33/32* (2010.01)
*H01L 33/06* (2010.01)
(Continued)

(52) U.S. Cl.
CPC ............ *H01L 33/32* (2013.01); *H01L 33/025* (2013.01); *H01L 33/06* (2013.01); *H01L 33/10* (2013.01);
(Continued)

(58) Field of Classification Search
CPC ....... H01L 33/32; H01L 33/025; H01L 33/48; H01L 33/145; H01L 33/10; H01L 33/06; H01L 2224/48091
See application file for complete search history.

(56) References Cited

U.S. PATENT DOCUMENTS 4,910,571 A    3/1990  Kasahara et al.
5,153,889 A   10/1992  Sugawara et al.
(Continued)

FOREIGN PATENT DOCUMENTS

EP    1 385 215 A2   1/2004
EP    1 453 160      9/2004
(Continued)

OTHER PUBLICATIONS

European Search Report dated May 14, 2019 issued in Application No. 17815692.3.
(Continued)

*Primary Examiner* — Laura M Menz
*Assistant Examiner* — Candice Chan
(74) *Attorney, Agent, or Firm* — KED & Associates, LLP

(57) ABSTRACT

An embodiment discloses a semiconductor device including a light emitting structure including a first conductive semiconductor layer, a second conductive semiconductor layer, and an active layer disposed between the first conductive semiconductor layer and the second conductive semiconductor layer; a first electrode electrically connected with the first conductive semiconductor layer; and a second electrode electrically connected with the second conductive semicon-
(Continued)

ductor layer, and a semiconductor device package including the same. The second conductive semiconductor layer includes a first surface on which the second electrode is disposed. The second conductive semiconductor layer has a ratio of a second shortest distance W2, which is a distance from the first surface to a second point, to a first shortest distance W1, which is a distance from the first surface to a first point, (W2:W1) ranging from 1:1.25 to 1:100. The first point is a point at which the second conductive semiconductor layer has the same aluminum composition as a well layer of the active layer closest to the second conductive semiconductor layer. The second point is a point at which the second conductive semiconductor layer has the same dopant composition as the aluminum composition.

20 Claims, 31 Drawing Sheets

(51) Int. Cl.
  *H01L 33/10* (2010.01)
  *H01L 33/14* (2010.01)
  *H01L 33/48* (2010.01)
  *H01L 33/02* (2010.01)

(52) U.S. Cl.
  CPC ............ *H01L 33/145* (2013.01); *H01L 33/48* (2013.01); *H01L 2224/48091* (2013.01)

(56) References Cited

U.S. PATENT DOCUMENTS

| | | |
|---|---|---|
| 6,614,119 B1 | 9/2003 | Asahina et al. |
| 6,777,253 B2 | 8/2004 | Ishibashi et al. |
| 7,065,117 B2 | 6/2006 | Yamanaka |
| 8,154,042 B2 | 4/2012 | Aldaz et al. |
| 8,269,410 B2 | 9/2012 | Kijima et al. |
| 8,476,666 B2 | 7/2013 | Kim et al. |
| 8,488,644 B2 | 7/2013 | Imai et al. |
| 8,592,954 B2 | 11/2013 | Emura et al. |
| 8,969,898 B2 | 3/2015 | Onishi et al. |
| 8,994,001 B2 | 3/2015 | Son |
| 9,276,167 B2 | 3/2016 | Höppel |
| 9,401,452 B2 | 7/2016 | Northrup et al. |
| 9,450,151 B2 | 9/2016 | Choi et al. |
| 9,537,055 B2 | 1/2017 | Park et al. |
| 9,540,252 B1 | 1/2017 | Collins et al. |
| 9,590,141 B2 | 3/2017 | Tachibana et al. |
| 9,711,682 B2 | 7/2017 | Han et al. |
| 9,748,410 B2 | 8/2017 | Kinoshita et al. |
| 10,347,804 B2 | 7/2019 | Yoo et al. |
| 2002/0088985 A1 | 7/2002 | Komoto et al. |
| 2003/0006418 A1 | 1/2003 | Emerson et al. |
| 2003/0141506 A1 | 7/2003 | Sano et al. |
| 2005/0127391 A1 | 6/2005 | Yanamoto |
| 2005/0179045 A1 | 8/2005 | Ryu et al. |
| 2006/0131558 A1 | 6/2006 | Sato et al. |
| 2006/0260671 A1 | 11/2006 | Ohta et al. |
| 2007/0023777 A1 | 2/2007 | Sonobe et al. |
| 2007/0205375 A1 | 9/2007 | Ward et al. |
| 2008/0061308 A1 | 3/2008 | Yoon |
| 2008/0185606 A1 | 8/2008 | Sano et al. |
| 2008/0247435 A1 | 10/2008 | Choi |
| 2010/0006884 A1 | 1/2010 | Ou et al. |
| 2010/0051987 A1 | 3/2010 | Katsuno et al. |
| 2010/0096652 A1 | 4/2010 | Choi et al. |
| 2011/0266568 A1 | 11/2011 | Aldaz et al. |
| 2012/0040480 A1 | 2/2012 | Shieh et al. |
| 2012/0085986 A1 | 4/2012 | Iwanaga et al. |
| 2012/0112218 A1 | 5/2012 | Teng et al. |
| 2012/0141771 A1 | 6/2012 | Pan et al. |
| 2012/0292631 A1 | 11/2012 | Katsuno et al. |
| 2013/0082237 A1 | 4/2013 | Northrup et al. |
| 2013/0214320 A1 | 8/2013 | Onishi et al. |
| 2014/0034981 A1 | 2/2014 | Hung et al. |
| 2014/0084274 A1 | 3/2014 | Yamazaki et al. |
| 2014/0183446 A1 | 7/2014 | Nago et al. |
| 2014/0209955 A1 | 7/2014 | Kim et al. |
| 2014/0219304 A1 | 8/2014 | Lee et al. |
| 2014/0225143 A1 | 8/2014 | Kususe et al. |
| 2014/0239341 A1 | 8/2014 | Matsumura |
| 2015/0263305 A1 | 9/2015 | Premutico et al. |
| 2015/0318435 A1 | 11/2015 | Nago et al. |
| 2015/0380621 A1 | 12/2015 | Chae et al. |
| 2016/0005919 A1 | 1/2016 | Obata |
| 2016/0056338 A1 | 2/2016 | Park et al. |
| 2016/0111600 A1 | 4/2016 | Chae et al. |
| 2016/0149078 A1 | 5/2016 | Takeuchi et al. |
| 2016/0218262 A1 | 7/2016 | Aketa et al. |
| 2016/0247971 A1 | 8/2016 | Lee et al. |
| 2016/0284941 A1 | 9/2016 | Seo et al. |
| 2016/0365486 A1 | 12/2016 | Kim et al. |
| 2017/0025566 A1 | 1/2017 | Song et al. |
| 2017/0098736 A1 | 4/2017 | Lee et al. |
| 2017/0170360 A1 | 6/2017 | Bour et al. |
| 2017/0317236 A1 | 11/2017 | Lee et al. |
| 2018/0069150 A1* | 3/2018 | Oh ..................... H01L 33/32 |
| 2018/0076355 A1 | 3/2018 | Hayashi et al. |
| 2018/0145219 A1 | 5/2018 | Kim et al. |
| 2018/0151778 A1 | 5/2018 | Park et al. |
| 2019/0326473 A1 | 10/2019 | Choi et al. |

FOREIGN PATENT DOCUMENTS

| | | |
|---|---|---|
| EP | 2 955 763 | 12/2015 |
| EP | 2 988 339 | 2/2016 |
| EP | 3 043 395 | 7/2016 |
| EP | 3 073 539 | 9/2016 |
| EP | 3 291 314 | 3/2018 |
| JP | H 07-106631 | 4/1995 |
| JP | 2001-203385 | 7/2001 |
| JP | 2003-110140 | 4/2003 |
| JP | 2003-115642 | 4/2003 |
| JP | 2004-104157 | 4/2004 |
| JP | 2006-032779 | 2/2006 |
| JP | 2007-103690 | 4/2007 |
| JP | 2007-134533 | 5/2007 |
| JP | 2008-285758 | 11/2008 |
| JP | 2010-171272 | 8/2010 |
| JP | 2011-187591 | 9/2011 |
| JP | 2012-049337 | 3/2012 |
| JP | 2012-216603 | 11/2012 |
| JP | 2013-105917 | 5/2013 |
| JP | 2013-149889 | 8/2013 |
| JP | 2013-171982 | 9/2013 |
| JP | 2013-243254 | 12/2013 |
| JP | 5474292 | 4/2014 |
| JP | 2014-195055 | 10/2014 |
| JP | 2014-241397 | 12/2014 |
| JP | 2015-177023 | 10/2015 |
| JP | 2015-216352 | 12/2015 |
| JP | 2016-044095 | 4/2016 |
| JP | 2016-066691 | 4/2016 |
| JP | 2016-084822 | 5/2016 |
| JP | 2016-184724 | 10/2016 |
| JP | 2016-213448 | 12/2016 |
| KR | 10-2010-0044726 | 4/2010 |
| KR | 10-2014-0003351 | 1/2014 |
| KR | 10-2014-0006429 | 1/2014 |
| KR | 10-2014-0099379 | 8/2014 |
| KR | 10-1458389 | 11/2014 |
| KR | 10-2016-0037060 | 4/2016 |
| KR | 10-2016-0056524 | 5/2016 |
| KR | 10-2016-0062659 | 6/2016 |
| KR | 10-2016-0102774 | 8/2016 |
| KR | 10-2016-0103686 | 9/2016 |
| KR | 10-2016-0105126 | 9/2016 |
| KR | 10-2016-0117010 | 10/2016 |
| WO | WO 2005/101532 | 10/2005 |
| WO | WO 2006/043422 | 4/2006 |
| WO | WO 2010/146808 | 12/2010 |
| WO | WO 2014/123092 | 8/2014 |

(56) References Cited

FOREIGN PATENT DOCUMENTS

| WO | WO 2015/156588 | 10/2015 |
|----|----------------|---------|
| WO | WO 2016/004374 A1 | 1/2016 |
| WO | WO 2016/159638 | 10/2016 |
| WO | WO 2016/163083 | 10/2016 |
| WO | WO 2017/049053 | 3/2017 |

OTHER PUBLICATIONS

European Search Report dated Jul. 24, 2019 issued in EP Application No. 17851126.7.
European Search Report dated Jul. 11, 2019 issued in EP Application No. 17849159.3.
U.S. Office Action dated Aug. 22, 2019 issued in U.S. Appl. No. 15/821,519.
Japanese Office Action dated Mar. 27, 2019 issued in Application No. 2017-168498.
International Search Report (with English Translation) and Written Opinion dated Dec. 19, 2017 issued in Application No. PCT/KR2017/010065.
International Search Report (with English Translation) and Written Opinion dated Sep. 20, 2017 issued in Application No. PCT/KR2017/006473.
International Search Report (with English Translation) and Written Opinion dated Dec. 15, 2017 issued in Application No. PCT/KR2017/009954.
European Search Report dated Dec. 21, 2017 issued in EP Application No. 17 18 8926.
European Search Report dated Mar. 28, 2018 issued in EP Application No. 17203483.7.
U.S. Ex parte Quayle Office Action dated Apr. 26, 2018 issued in U.S. Appl. No. 15/692,617.
U.S. Office Action dated Aug. 31, 2018 issued in U.S. Appl. No. 15/692,617.
European Search Report dated Dec. 13, 2018 issued in EP Application No. 18188482.6.
U.S. Notice of Allowance dated Feb. 15, 2019 issued in U.S. Appl. No. 15/692,617.
U.S. Office Action dated Feb. 21, 2019 issued in U.S. Appl. No. 15/821,519.
Japanese Office Action dated Oct. 8, 2019 issued in Application No. 2018-152495.
United States Office Action dated Dec. 19, 2019 issued in co-pending related U.S. Appl. No. 16/310,340.
U.S. Office Action dated May 17, 2019 issued in U.S. Appl. No. 16/100,785.
United States Notice of Allowance dated Oct. 23, 2019 issued in co-pending related U.S. Appl. No. 16/100,785.
Japanese Office Action dated Sep. 3, 2019 issued in JP Application No. 2017-168498.
Japanese Office Action dated Feb. 4, 2020 issued in Application No. 2018-152495.
United States Office Action dated Feb. 21, 2020 issued in U.S. Appl. No. 15/821,519.
European Office Action dated May 7, 2020 issued in EP Application No. 17849159.3.
United States Office Action dated May 22, 2020 issued in U.S. Appl. No. 16/415,245.
United States Notice of Allowance dated Oct. 16, 2020 issued in U.S. Appl. No. 16/415,245.
U.S. Appl. No. 15/692,617, filed Aug. 31, 2017.
U.S. Appl. No. 15/821,519, filed Nov. 22, 2017.
U.S. Appl. No. 16/100,785, filed Aug. 10, 2018.
U.S. Appl. No. 16/310,340, filed Dec. 14, 2018.
U.S. Appl. No. 16/331,015, filed Mar. 6, 2019.
U.S. Appl. No. 16/415,245, filed May 17, 2019.
U.S. Appl. No. 16/331,039, filed Mar. 6, 2019.

* cited by examiner

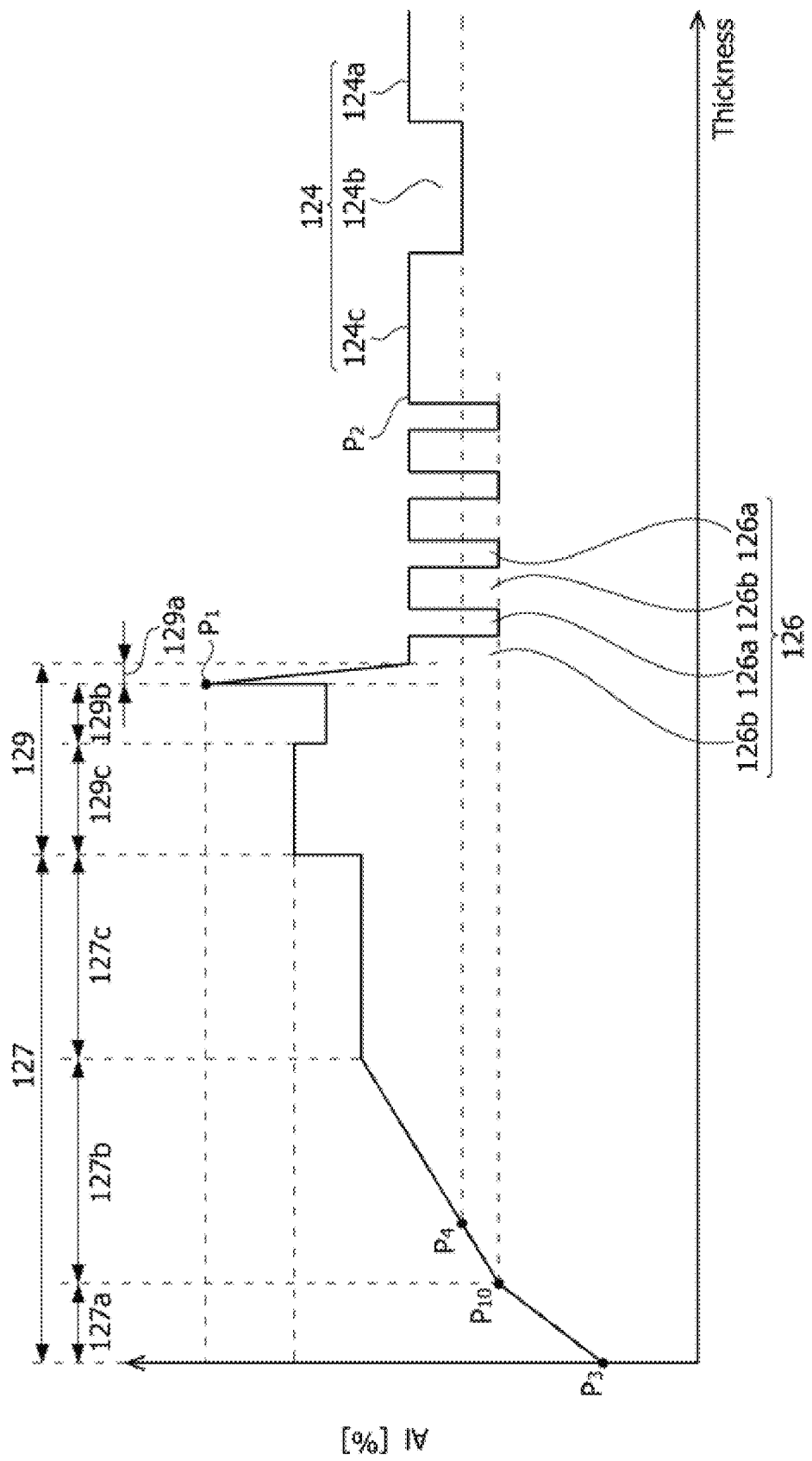

FIG. 31
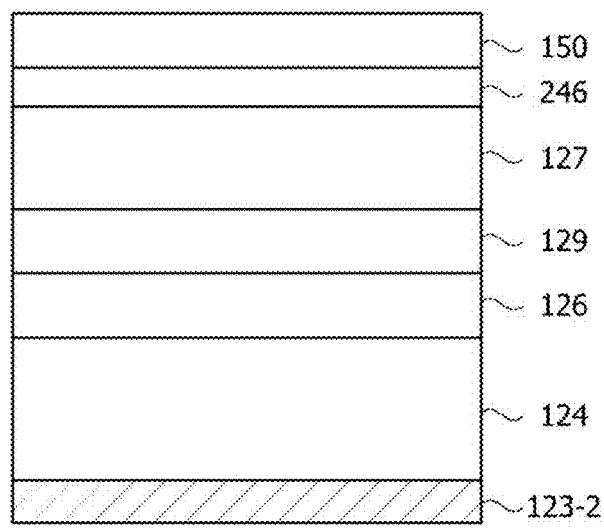
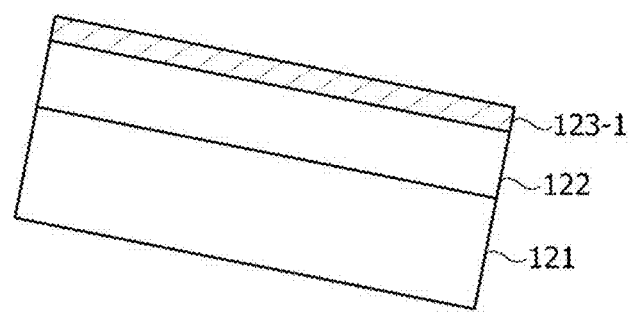
FIG. 32
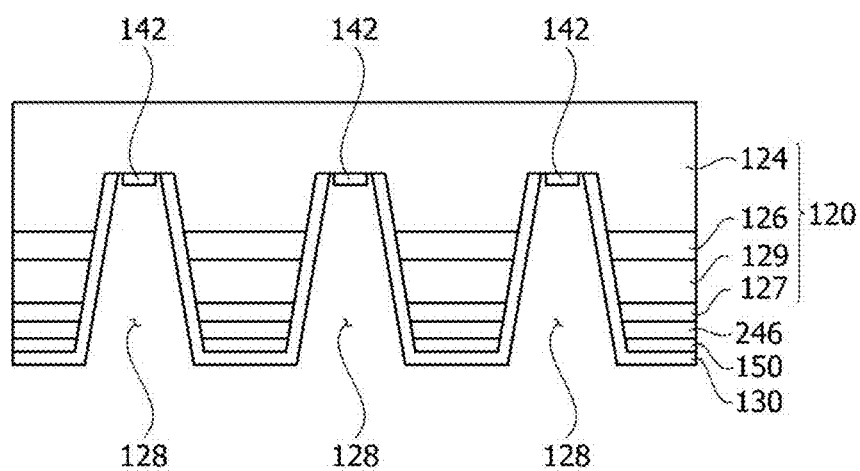

SEMICONDUCTOR DEVICE HAVING LAYERS INCLUDING ALUMINUM AND SEMICONDUCTOR DEVICE PACKAGE INCLUDING SAME

CROSS-REFERENCE TO RELATED PATENT APPLICATIONS

This application is a U.S. National Stage Application under 35 U.S.C. § 371 of PCT Application No. PCT/KR2017/010065, filed Sep. 13, 2017, which claims priority to Korean Patent Application No. 10-2016-0118243, filed Sep. 13, 2016, Korean Patent Application No. 10-2016-0140466, filed Oct. 26, 2016, and Korean Patent Application No. 10-2017-0115836, filed Sep. 11, 2017, whose entire disclosures are hereby incorporated by reference. This application is related to U.S. application Ser. No. 15/692,617, filed Aug. 31, 2017, U.S. application Ser. No. 16/310,340, filed Dec. 14, 2018, U.S. application Ser. No. 16/331,015, filed Mar. 6, 2019, U.S. application Ser. No. 15/821,519, filed Nov. 22, 2017, and U.S. application Ser. No. 16/100,785, filed Aug. 10, 2018 whose disclosures are also incorporated by reference.

TECHNICAL FIELD

Embodiments relate to a semiconductor device and a semiconductor device package including the same.

BACKGROUND ART

Semiconductor devices including compounds such as GaN and AlGaN have many merits such as wide and adjustable band gap energy and thus may be variously used as light emitting devices, light receiving devices, various kinds of diodes, or the like.

In particular, light emitting devices using group III-V or II-VI compound semiconductors or light emitting devices such as a laser diode may implement various colors such as red, green, blue, and ultraviolet due to the development of thin film growth technology and device materials and may implement efficient white light rays by using fluorescent materials or combining colors. These light emitting devices also have advantages with respect to low power consumption, semi-permanent life span, fast response time, safety, and environmental friendliness, compared to conventional light sources such as a fluorescent lamp, an incandescent lamp, or the like.

In addition, when light receiving devices such as optical detectors or solar cells are produced using group III-V or II-VI compound semiconductors, an optical current may be generated by light absorption in various wavelength ranges through development of device materials. Thus, light may be used in various wavelength ranges from gamma rays to radio wavelength regions. Also, the light receiving devices have the advantages of fast response time, stability, environmental friendliness, and ease of adjustment of device materials and may be easily used to power control or microwave circuits or communication modules.

Accordingly, semiconductor devices are being extensively used in the transmission modules of optical communication means, light emitting diode backlights substituted for cold cathode fluorescence lamps (CCFL) forming the backlights of liquid crystal display (LCD) devices, white light emitting diode lamps to be substituted for fluorescent bulbs or incandescent bulbs, car headlights, traffic lights, and sensors for detecting gas or fire. In addition, semiconductor devices may also be extensively used in high-frequency application circuits or other power control devices and even communication modules.

In particular, a light emitting device that emits light in an ultraviolet wavelength range may be used for curing, medical, and sterilization purposes due to its curing or sterilizing action.

Recently, research on ultraviolet light emitting devices has been actively conducted, but the ultraviolet light emitting devices are difficult to implement vertically and also have decreased crystallinity during the substrate separation process.

DETAILED DESCRIPTION OF THE INVENTION

Technical Problem

An embodiment provides a vertical ultraviolet light emitting device.

An embodiment also provides a light emitting device having enhanced optical output power.

Problems to be solved in the embodiments are not limited thereto, and include the following technical solutions and objectives of effects understandable from the embodiments.

Technical Solution

A semiconductor device according to an embodiment of the present invention includes a light emitting structure including a first conductive semiconductor layer, a second conductive semiconductor layer, and an active layer disposed between the first conductive semiconductor layer and the second conductive semiconductor layer; a first electrode electrically connected with the first conductive semiconductor layer; and a second electrode electrically connected with the second conductive semiconductor layer. The second conductive semiconductor layer may include a first surface on which the second electrode is disposed. The second conductive semiconductor layer may have a ratio of a second shortest distance $W2$, which is a distance from the first surface to a second point, to a first shortest distance $W1$, which is a distance from the first surface to a first point, ($W2:W1$) ranging from 1:1.25 to 1:100. The first point may be a point at which the second conductive semiconductor layer has the same aluminum composition as a well layer of the active layer closest to the second conductive semiconductor layer. The second point may be a point at which the second conductive semiconductor layer has the same dopant composition as the same aluminum composition.

Advantageous Effects of the Invention

According to an embodiment, it is possible to produce a vertical ultraviolet light emitting device.

It is also possible to enhance optical output power.

Various advantageous merits and effects of the present invention are not limited to the above-descriptions and will be easily understood while embodiments of the present invention are described in detail.

DESCRIPTION OF THE DRAWINGS

FIG. 10 is a graph showing an aluminum composition of a semiconductor structure according to an embodiment of the present invention.

FIG. 31 is a view illustrating a process of separating a substrate.

FIG. 32 is a view illustrating a process of etching a light emitting structure.

MODE OF THE INVENTION

The following embodiments may be modified or combined with each other, and the scope of the present invention is not limited to the embodiments.

Details described in a specific embodiment may be understood as descriptions associated with other embodiments unless otherwise stated or contradicted even if there is no description thereof in the other embodiments.

For example, when features of element A are described in a specific embodiment and features of element B are described in another embodiment, an embodiment in which element A and element B are combined with each other should be understood as falling within the scope of the present invention unless otherwise stated or contradicted even if not explicitly stated.

In the descriptions of embodiments, when an element is referred to as being over or under another element, the two elements may be in direct contact with each other, or one or more other elements may be disposed between the two elements. In addition, the term "over or under" used herein may represent a downward direction in addition to an upward direction with respect to one element.

Hereinafter, example embodiments will be described in detail with reference to the accompanying drawings so that they can be easily practiced by those skilled in the art.

A light emitting structure according to an embodiment of the present invention may output ultraviolet wavelength light. For example, the light emitting structure may output near-ultraviolet wavelength light (UV-A), far-ultraviolet wavelength light (UV-B), or deep-ultraviolet wavelength light (UV-C). The wavelength range may be determined by the aluminum composition of a light emitting structure 120.

For example, the near-ultraviolet wavelength light (UV-A) may have wavelengths ranging from 320 nm to 420 nm, the far-ultraviolet wavelength light (UV-B) may have wavelengths ranging from 280 nm to 320 nm, and the deep-ultraviolet wavelength light (UV-C) may have wavelengths ranging from 100 nm to 280 nm.

Figure 1:
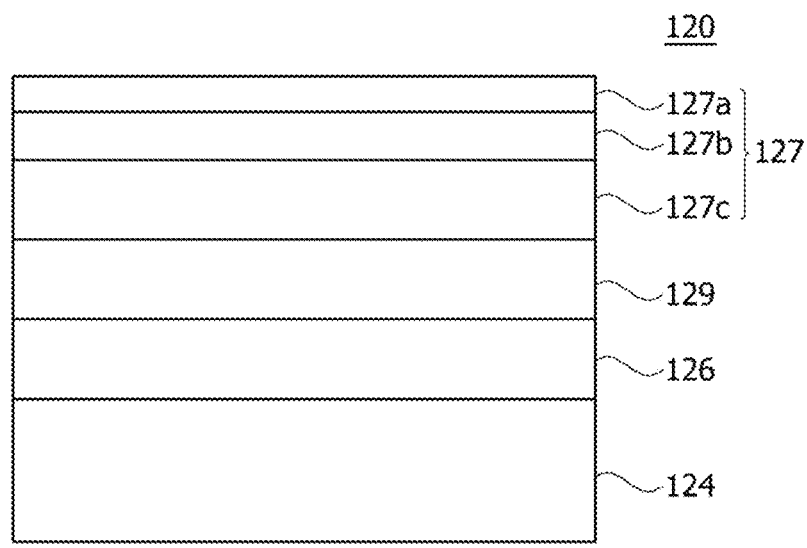
FIG. 1 is a conceptual view of a light emitting structure according to an embodiment of the present invention.
Figure 2:
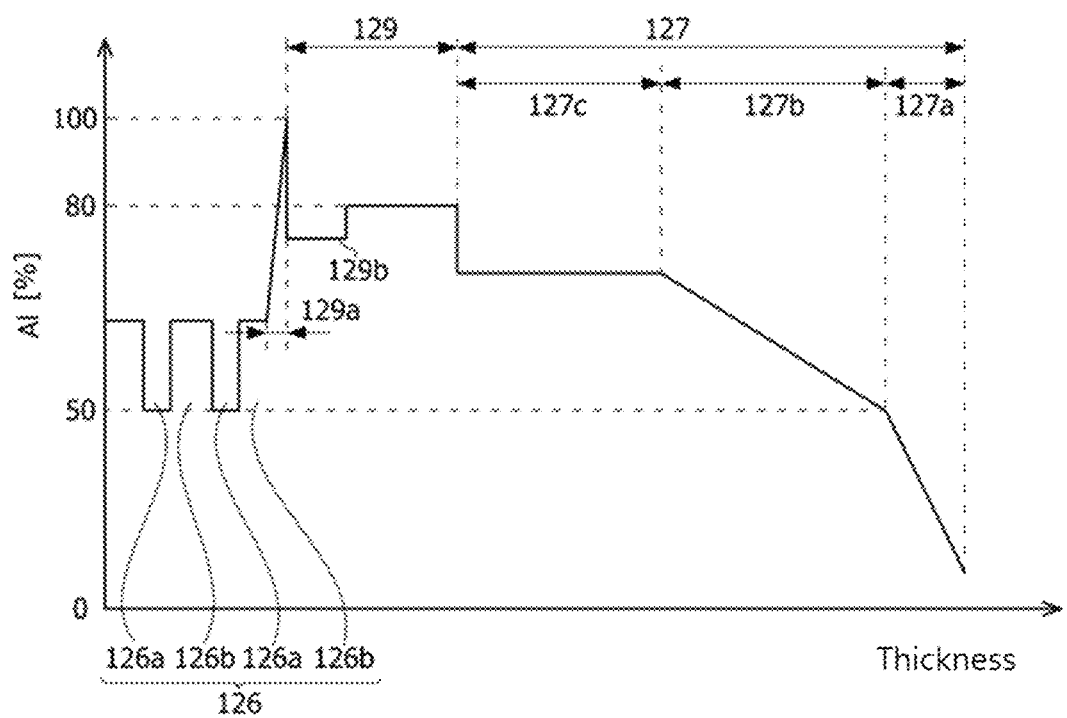
FIG. 2 is a graph showing an aluminum composition of a light emitting structure according to an embodiment of the present invention.

FIG. 1 is a conceptual diagram of a light emitting structure according to an embodiment of the present invention, and FIG. 2 is a graph showing the aluminum composition of the semiconductor structure according to an embodiment of the present invention.

Referring to FIG. 1, a semiconductor device according to an embodiment includes a light emitting structure including a first conductive semiconductor layer 124, a second conductive semiconductor layer 127, and an active layer 126 disposed between the first conductive semiconductor layer 124 and the second conductive semiconductor layer 127.

The first conductive semiconductor layer 124 may be made of a group III-V or group II-VI compound semiconductor and may be doped with a first dopant. The first conductive semiconductor layer 124 may be made of a material selected from among semiconductor materials having an empirical formula Inx1Aly1Ga1-x1-y1N (0≤x1≤1, 0≤y1≤1, and 0≤x1+y1≤1), for example, GaN, AlGaN, InGaN, InAlGaN, and so on. Also, the first dopant may be an n-type dopant such as Si, Ge, Sn, Se, and Te. When the first dopant is an n-type dopant, the first conductive semiconductor layer 124 doped with the first dopant may be an n-type semiconductor layer.

The active layer 126 is disposed between the first conductive semiconductor layer 124 and the second conductive semiconductor layer 127. The active layer 126 is a layer in which electrons (or holes) injected through the first conductive semiconductor layer 124 are combined with holes (or electrons) injected through the second conductive semiconductor layer 127. The active layer 126 may transition to a lower energy level due to recombination between an electron and a hole and generate light having an ultraviolet wavelength.

The active layer 126 may have, but is not limited to, any one of a single-well structure, a multi-well structure, a single-quantum-well structure, a multi-quantum-well (MQW) structure, a quantum dot structure, and a quantum wire structure.

The second conductive semiconductor layer 127 may be formed on the active layer 126 and may be made of a group III-V or group II-VI compound semiconductor. Also, the second conductive semiconductor layer 127 may be doped with a second dopant. The second conductive semiconductor layer 127 may be made of a semiconductor material having an empirical formula Inx5Aly2Ga1-x5-y2N (0≤x5≤1, 0≤y2≤1, and 0≤x5+y2≤1) or a material selected from among AlInN, AlGaAs, GaP, GaAs, GaAsP, and AlGaInP. When the second dopant is a p-type dopant such as Mg, Zn, Ca, Sr, and Ba, the second conductive semiconductor layer 127 doped with the second dopant may be a p-type semiconductor layer.

The second conductive semiconductor layer 127 may include a 2-1(second-prime) conductive semiconductor layer 127a, a 2-2(second-double-prime) conductive semiconductor layer 127b, and a 2-3(second-triple-prime) conductive semiconductor layer 127c. The 2-1 conductive semiconductor layer 127a may have a lower aluminum composition than the 2-2 conductive semiconductor layer 127b.

An electron-blocking layer 129 may be disposed between the active layer 126 and the second conductive semiconductor layer 127. The electron-blocking layer 129 may block electrons supplied from the first conductive semiconductor layer 124 from flowing out to the second conductive semiconductor layer 127, thus increasing the probability that electrons and holes will be recombined with each other in the active layer 126. The electron-blocking layer 129 may have a higher energy band gap than the active layer 126 and/or the second conductive semiconductor layer 127.

The electron-blocking layer 129 may be made of a material selected from among semiconductor materials having an empirical formula Inx1Aly1Ga1-x1-y1N (0≤x1≤1, 0≤y1≤1, and 0≤x1+y1≤1), for example, AlGaN, InGaN, InAlGaN, and so on, but is not limited thereto. A first layer 129b having a high aluminum composition and a second layer 129a having a low aluminum composition may be alternately disposed in the electron-blocking layer 129.

Referring to FIG. 2, the first conductive semiconductor layer 124, a barrier layer 126b, a well layer 126a, the 2-1 conductive semiconductor layer 127a, the 2-2 conductive semiconductor layer 127b, and the 2-3 conductive semiconductor layer 127c may all contain aluminum. Accordingly, the first conductive semiconductor layer 124, the barrier layer 126b, the well layer 126a, the 2-1 conductive semiconductor layer 127a, the 2-2 conductive semiconductor layer 127b, and the 2-3 conductive semiconductor layer 127c may all be made of AlGaN. However, the present invention is not limited thereto.

The electron-blocking layer 129 may have an aluminum composition ranging from 50% to 90%. The blocking layer 129 may have a plurality of first blocking layers 129a having a relatively high aluminum composition and a plurality of second layers 129a having a relatively low aluminum composition, which are alternately disposed therein. When the aluminum composition of the blocking layer 129 is less than 50%, an energy barrier for blocking electrons may be insufficient in height, and the blocking layer 129 may absorb light emitted from the active layer 126. When the aluminum composition of the blocking layer 129 is greater than 90%, the electrical characteristics of the semiconductor device may deteriorate.

The electron-blocking layer 129 may include a 1-1 section 129-1 and a 1-2 section 129-2. The 1-1 section 129-1 may have an aluminum composition increasing toward the blocking layer 129. The aluminum composition of the 1-1 section 129-1 may range from 80% to 100%. That is, the 1-1 section 129-1 may be made of AlGaN or AlN. Alternatively, the 1-1 section 129-1 may be a superlattice layer in which AlGaN and AlN are alternately disposed.

The 1-1 section 129-1 may have a thickness ranging from about 0.1 nm to about 4 nm. When the 1-1 section 129-1 has a thickness less than 0.1 nm, it may not be possible to efficiently block the movement of electrons. When the 1-1 section 129-1 has a thickness greater than 4 nm, it may be possible to reduce an efficiency with which holes are injected into the active layer 126.

The 1-2 section 129-2 may include an undoped section. The 1-2 section 129-2 may serve to prevent dopants from spreading from the second conductive semiconductor layer 127 to the active layer 126.

The 2-2 conductive semiconductor layer 127b may have a thickness greater than 10 nm and less than 200 nm. For example, the thickness of the 2-2 conductive semiconductor layer 127b may be equal to 25 nm. When the thickness of the 2-2 conductive semiconductor layer 127b is less than 10 nm, resistance increases in a horizontal direction, and thus it is possible to reduce electric current injection efficiency. When the thickness of the 2-2 conductive semiconductor layer 127b is greater than 200 nm, resistance increases in a vertical direction, and thus it is possible to reduce electric current injection efficiency.

The 2-2 conductive semiconductor layer 127b may have a higher aluminum composition than the well layer 126a. In order to generate ultraviolet light, the aluminum composition of the well layer 126a may range from about 30% to about 70%. When the 2-2 conductive semiconductor layer 127b has a lower aluminum composition than the well layer 126a, the 2-2 conductive semiconductor layer 127b absorbs light, and thus it is possible to reduce light extraction efficiency. However, in order to prevent a deterioration in crystallinity of the light emitting structure, the present invention is not limited thereto. For example, in some sections, the 2-2 conductive semiconductor layer 127b may have a lower aluminum composition than the well layer 126a.

The 2-2 conductive semiconductor layer 127b may have an aluminum composition greater than 40% and less than 80%. When the aluminum composition of the 2-2 conductive semiconductor layer 127b is less than 40%, light may be absorbed. When the aluminum composition of the 2-2 conductive semiconductor layer 127b is greater than 80%, electric current injection efficiency may deteriorate. For example, when the aluminum composition of the well layer 126a is equal to 30%, the aluminum composition of the 2-2 conductive semiconductor layer 127b may be equal to 40%.

The 2-1 conductive semiconductor layer 127a may have a lower aluminum composition than the well layer 126a. When the 2-1 conductive semiconductor layer 127a has a higher aluminum composition than the well layer 126a, the 2-1 conductive semiconductor layer 127a is unable to be sufficiently ohmic with a p-ohmic electrode due to an increase in resistance therebetween, and thus it is possible to reduce electric current injection efficiency.

The 2-1 conductive semiconductor layer 127a may have an aluminum composition greater than 1% and less than 50%. When the aluminum composition is greater than 50%, the 2-1 conductive semiconductor layer 127a may be unable to be sufficiently ohmic with a p-ohmic electrode. When the aluminum composition is less that about 1%, the 2-1 conductive semiconductor layer 127a may have a composition close to GaN and thus absorb light.

The 2-1 conductive semiconductor layer 127a may have a thickness ranging from 1 nm to 30 nm or ranging from 1 nm to 10 nm. As described above, the 2-1 conductive semiconductor layer 127a has an aluminum composition low enough to be ohmic and thus may absorb ultraviolet light. Accordingly, it may be advantageous, in terms of optical output power, that the 2-1 conductive semiconductor layer 127a be adjusted to be as thin as possible.

However, when the thickness of the 2-1 conductive semiconductor layer 127a is controlled to be 1 nm or less, the 2-1 conductive semiconductor layer 127a may not be disposed in some sections, and there may be a region in which the 2-2 conductive semiconductor layer 127b is exposed outside the light emitting structure 120. Also, when the thickness is greater than 30 nm, the absorbed quantity of light is so large that optical output power efficiency may decrease.

The 2-1 conductive semiconductor layer 127a may have a smaller thickness than the 2-2 conductive semiconductor layer 127b. A thickness ratio of the 2-2 conductive semiconductor layer 127b to the 2-1 conductive semiconductor layer 127a may range from 1.5:1 to 20:1. When the thickness ratio is less than 1.5:1, the 2-2 conductive semiconductor layer 127b is so thin that the electric current injection efficiency may decrease. When the thickness ratio is greater than 20:1, the 2-1 conductive semiconductor layer 127a is so thin that there may be a reduction in ohmic reliability.

The aluminum composition of the 2-2 conductive semiconductor layer 127b may decrease as the 2-2 conductive semiconductor layer 127b gets farther away from the active layer 126. Also, the aluminum composition of the 2-1 conductive semiconductor layer 127a may decrease as the 2-1 conductive semiconductor layer 127a gets farther away from the active layer 126.

In this case, the 2-1 conductive semiconductor layer 127a may have a greater reduction in aluminum composition than the 2-2 conductive semiconductor layer 127b. That is, the 2-1 conductive semiconductor layer 127a may have a greater variation in aluminum composition in the direction of thickness than the 2-2 conductive semiconductor layer 127b.

The 2-2 conductive semiconductor layer 127b has a greater thickness than the 2-1 conductive semiconductor layer 127a and has a higher aluminum composition than the well layer 126a. Accordingly, the 2-2 conductive semiconductor layer 127b may have a relatively gradual reduction in aluminum composition.

However, the 2-1 conductive semiconductor layer 127a has a small thickness and has a large variation in aluminum composition. Accordingly, the 2-1 conductive semiconductor layer 127a may have a relatively high reduction in aluminum composition.

The 2-3 conductive semiconductor layer 127c may have a uniform aluminum composition. The 2-3 conductive semiconductor layer 127c may have a thickness ranging from 20 nm to 60 nm. The aluminum composition of the 2-3 conductive semiconductor layer 127c may range from 40% to 70%.

Figure 3:
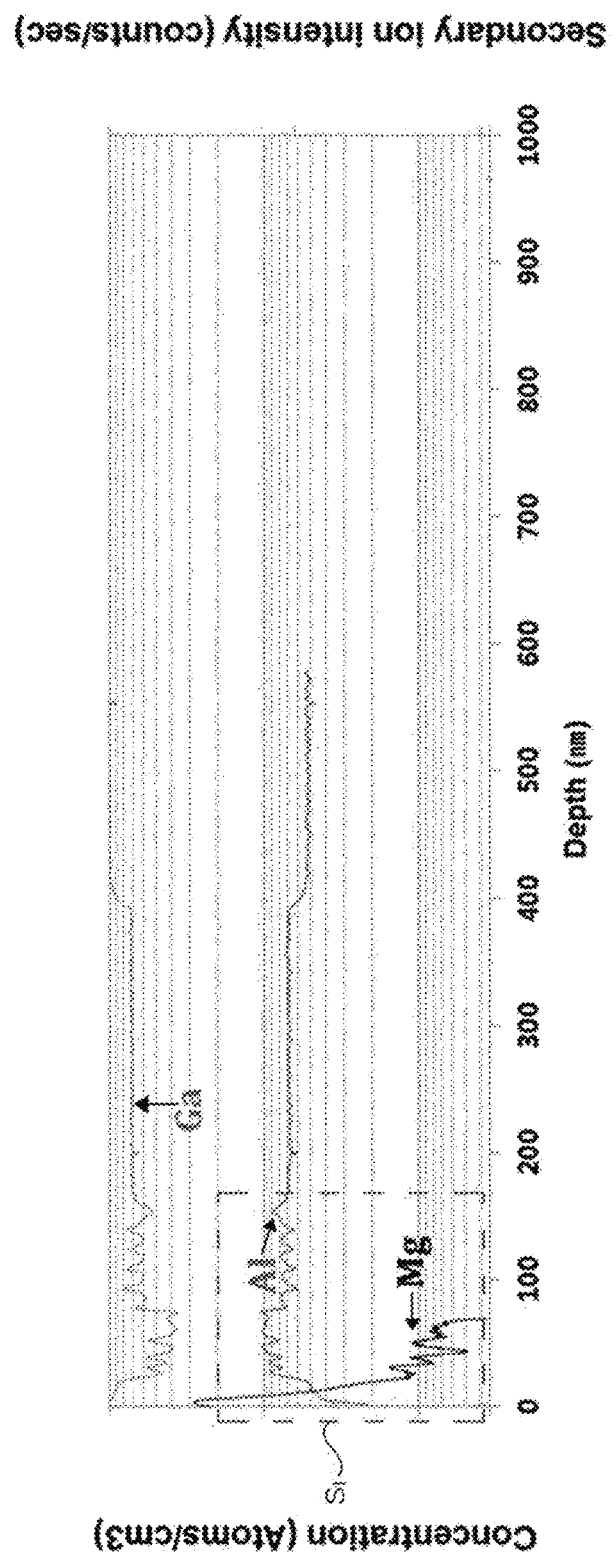
FIG. 3 is a secondary ion mass spectrometry (SIMS) graph of a light emitting structure according to a first embodiment of the present invention.
Figure 4:
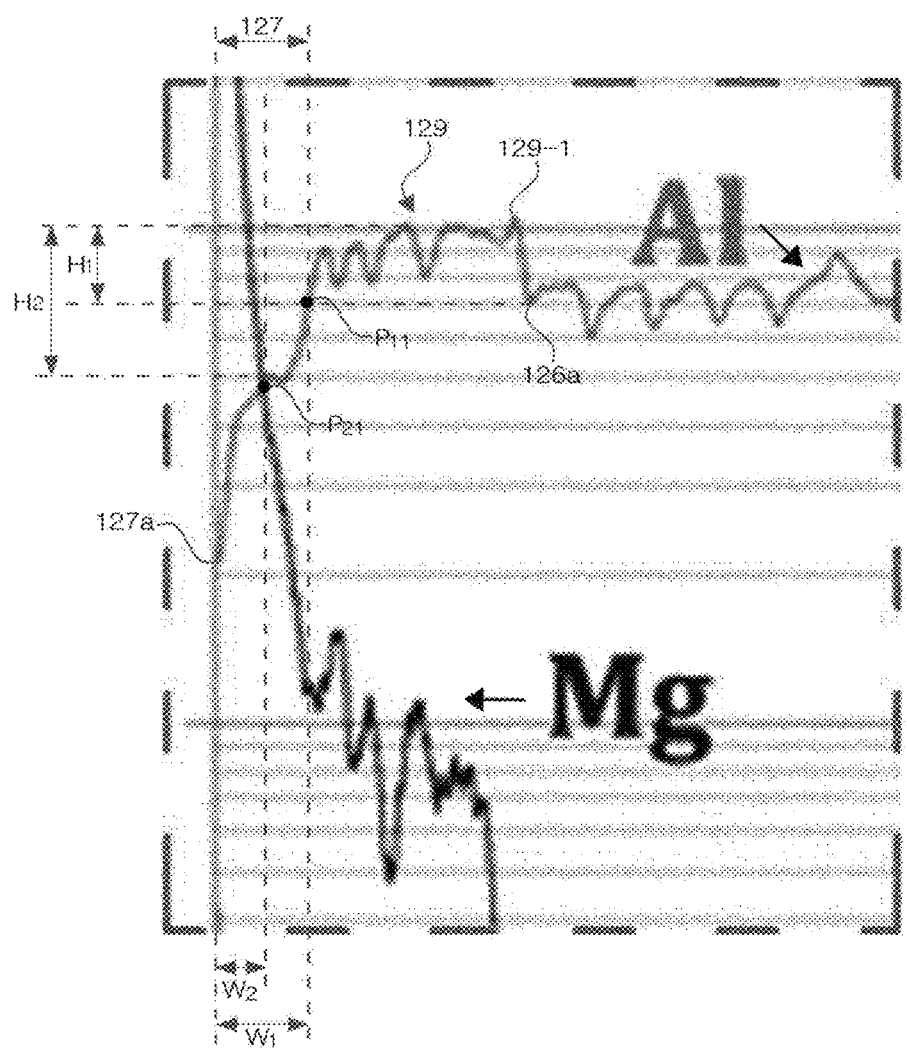
FIG. 4 is a partially enlarged view of FIG. 3.

FIG. 3 is a secondary ion mass spectrometry (SIMS) graph of a light emitting structure according to a first embodiment of the present invention, and FIG. 4 is a partially enlarged view of FIG. 3.

Referring to FIGS. 3 and 4, the light emitting structure may have an aluminum composition and a p-type impurity (Mg) composition changing as the thickness thereof decreases. The aluminum composition of the second conductive semiconductor layer 127 may decrease and the p-type impurity (Mg) composition of the second conductive semiconductor layer 127 may increase toward the surface thereof.

The second conductive semiconductor layer 127 may have a ratio of a second shortest distance W2, which is a distance between the surface (a first surface, which has a thickness of zero) and a second point P21, to a first shortest distance W1, which is a distance between the surface and a first point P11, (W2:W1) ranging from 1:1.25 to 1:100 or from 1:1.25 to 1:10.

When the ratio of the second shortest distance W2 to the first shortest distance W1 (W2:W1) is smaller than 1:1.25, the first shortest distance W1 and the second shortest distance W2 are so close that the aluminum composition may rapidly change. When the ratio W2:W1 is greater than 1:100, the thickness of the second conductive semiconductor layer 127 is so great that the crystallinity of the second conductive semiconductor layer 127 may deteriorate or a stress applied toward a substrate may increase, thus causing a change in wavelength of light emitted from the active layer.

Here, the first point P11 may be a point at which the second conductive semiconductor has the same aluminum composition as the well layer 126a, which is a part of the active layer closest to the second conductive semiconductor. The range of the first point P11 may be defined as a spectrum measured through SIMS. The range of the first point P11 may be defined as a portion of the second conductive semiconductor layer having the same aluminum composition as the well layer of the active layer.

In order to measure the first point P11, a method of using the SIMS spectrum may be applied, but the present invention is not limited thereto. As another example, TEM and XRD measurement methods may be applied thereto. Simply, the first point P11 may be defined through the SIMS spectrum.

The second point P21 may be a point of the SIMS spectrum at which a spectrum for a dopant (e.g., Mg) of the second conductive semiconductor layer and a spectrum for aluminum intersect.

During the measurement, a unit of value for the dopant of the second conductive semiconductor layer may be different depending on the case. However, a boundary region between the 2-1 conductive semiconductor layer 127a and the 2-2 conductive semiconductor layer 127b may be included in a range of a point at which a region including an inflection point for the aluminum composition of the second conductive semiconductor layer and a spectrum for the dopant of the second conductive semiconductor layer intersect. Accordingly, it is possible to measure the boundary region between the 2-1 conductive semiconductor layer 127a and the 2-2 conductive semiconductor layer 127b and define a range thereof.

However, the present invention is not limited thereto, and the second point P21 may be a point positioned within a region having an aluminum composition ranging from 5% to 55%. When the aluminum composition of the second point P21 is less than 5%, the 2-1 conductive semiconductor layer 127a is so thin that power consumption efficiency of the semiconductor may deteriorate. When the aluminum composition of the second point P21 is greater than 55%, the 2-1 conductive semiconductor layer 127a is so thick that light extraction efficiency may deteriorate. In this case, the aluminum composition of the second point P21 may be smaller than that of the first point P11. For example, the aluminum composition of the second point P21 may range from 40% to 70%.

For example, the first shortest distance W1 may range from 25 nm to 100 nm, and the second shortest distance W2 may range from 1 nm to 20 nm.

A ratio of a first difference H1 between an average aluminum composition of the electron-blocking layer 129 and the aluminum composition of the first point P11 and a second difference H2 between an average aluminum composition of the electron-blocking layer 129 and the aluminum composition of the second point P21 (H1:H2) may range from 1:1.2 to 1:10.

When the ratio of the first difference to the second difference (H1:H2) is less than 1:1.2, a change in aluminum composition of a section between the first point P11 and the second point P21 is slow and thus it is difficult to sufficiently decrease the aluminum composition of the contact layer. Also, when the ratio of the first difference to the second difference (H1:H2) is greater than 1:10, the change in aluminum composition is rapid and thus it is possible for there to be an increase in probability of absorption of light emitted from the active layer.

Figure 5:
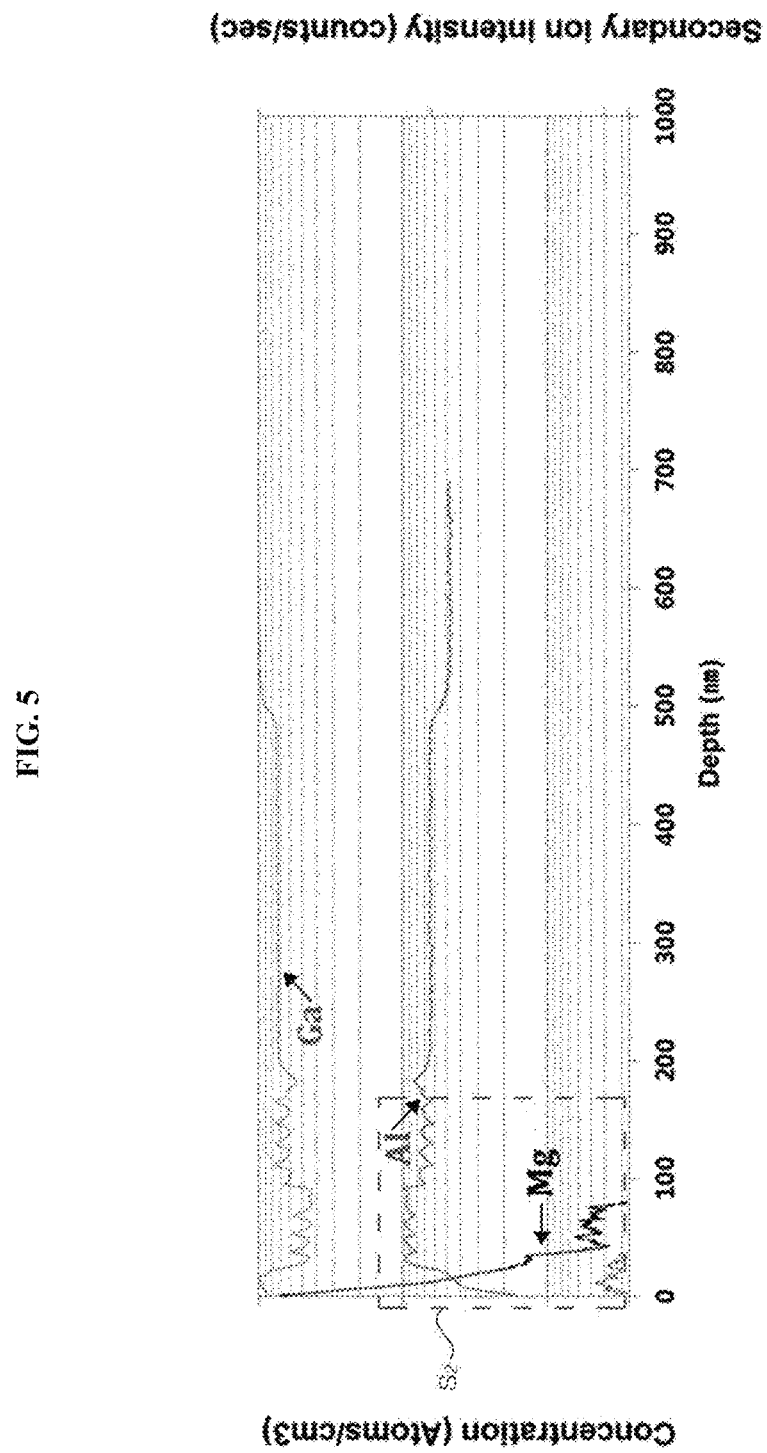
FIG. 5 is a SIMS graph of a light emitting structure according to a second embodiment of the present invention.
Figure 6:
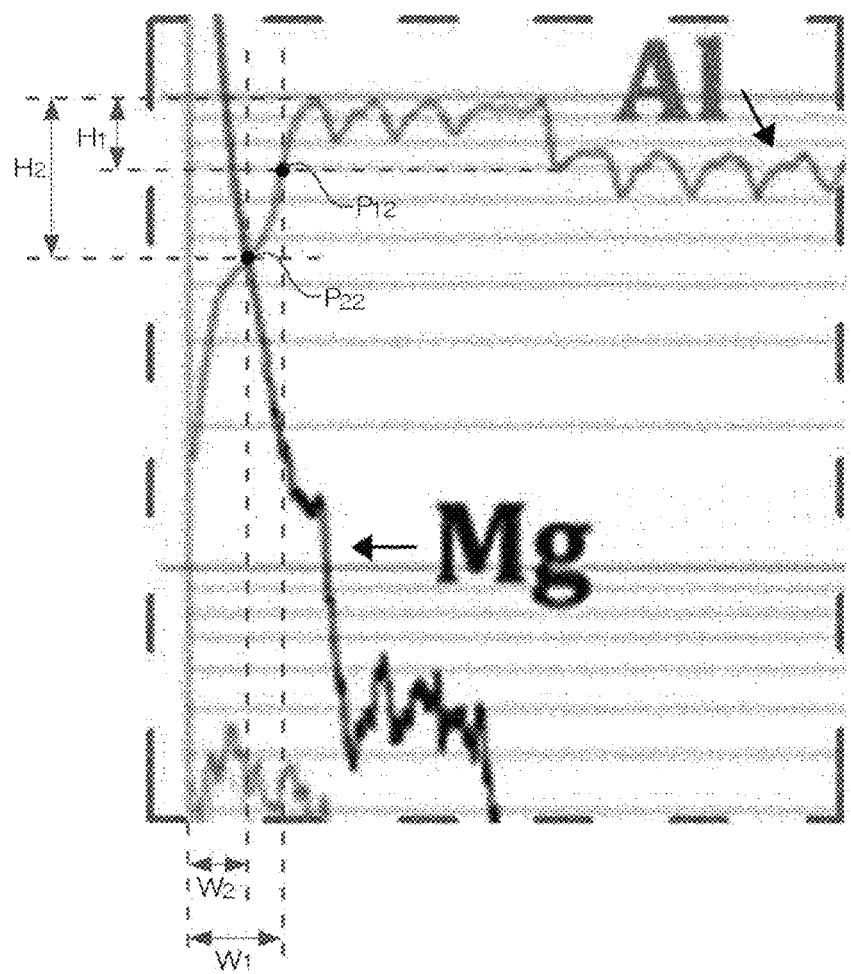
FIG. 6 is a partially enlarged view of FIG. 5.
Figure 7:
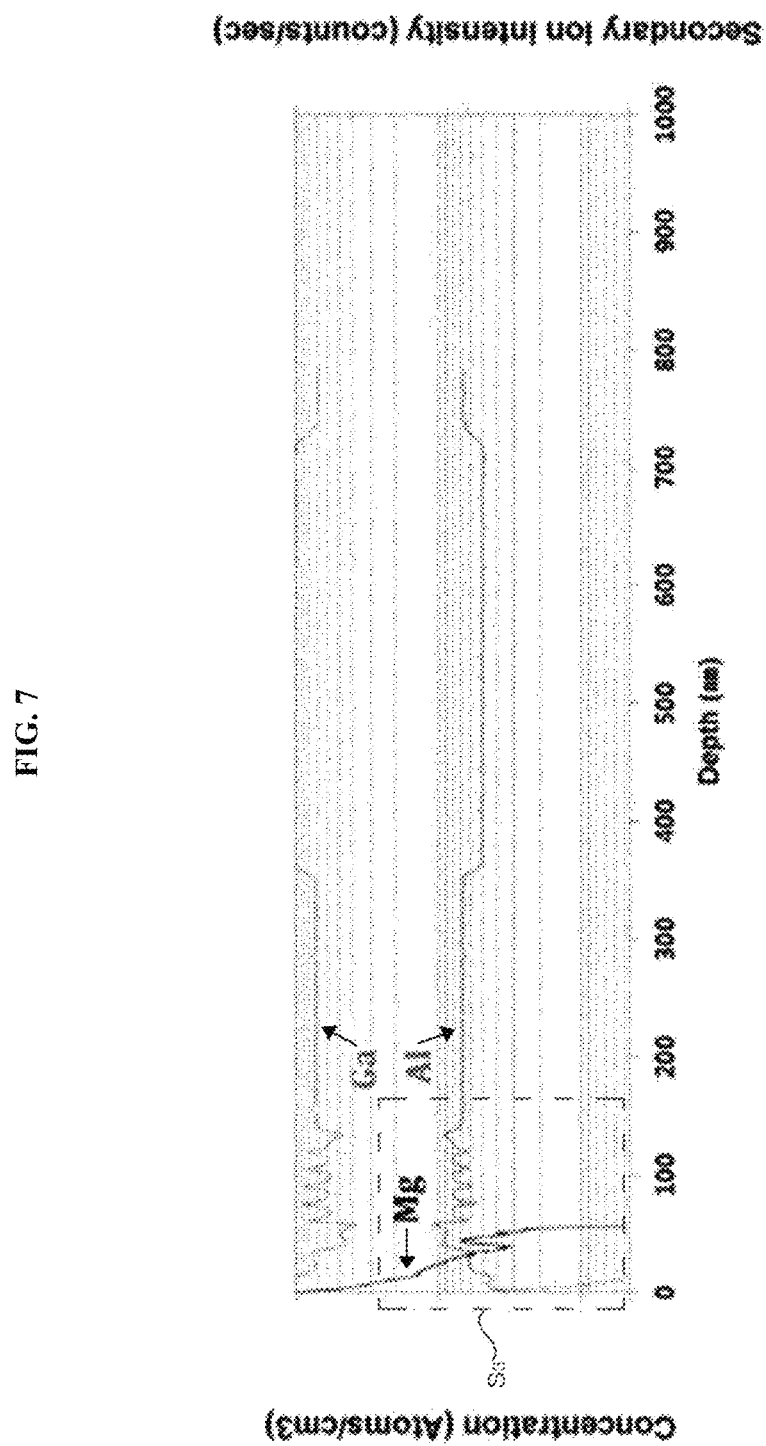
FIG. 7 is a SIMS graph of a light emitting structure according to a third embodiment of the present invention.
Figure 8:
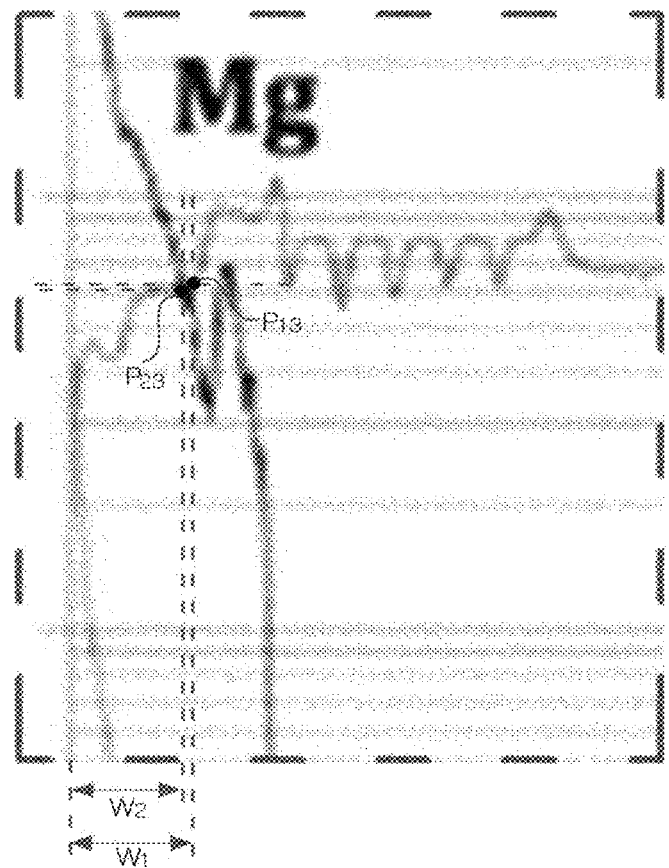
FIG. 8 is a partially enlarged view of FIG. 7.

FIG. 5 is a SIMS graph of a light emitting structure according to a second embodiment of the present invention, FIG. 6 is a partially enlarged view of FIG. 5, FIG. 7 is a SIMS graph of a light emitting structure according to a third embodiment of the present invention, and FIG. 8 is a partially enlarged view of FIG. 7.

Even referring to FIGS. 5 to 8, it can be seen that the ratio of the second shortest distance W2 to the first shortest distance W1 ranges from 1:1.25 to 1:100 or from 1:1.25 to 1:10. For example, referring to FIG. 8, it can be seen that a first point P13 and a second point P23 are located very close to each other.

Also, it can be seen that the ratio of the first difference H1 between the average aluminum composition of the electron-blocking layer 129 and the aluminum composition of the first points P12 and P13 and the second difference H2 between the average aluminum composition of the electron-blocking layer 129 and the aluminum composition of the second points P22 and P23 (H1:H2) may range from 1:1.2 to 1:10.

When such a condition is satisfied, the aluminum composition of the surface of the second conductive semiconductor layer 127 may be adjusted to a range from 1% to 10%.

Figure 9:
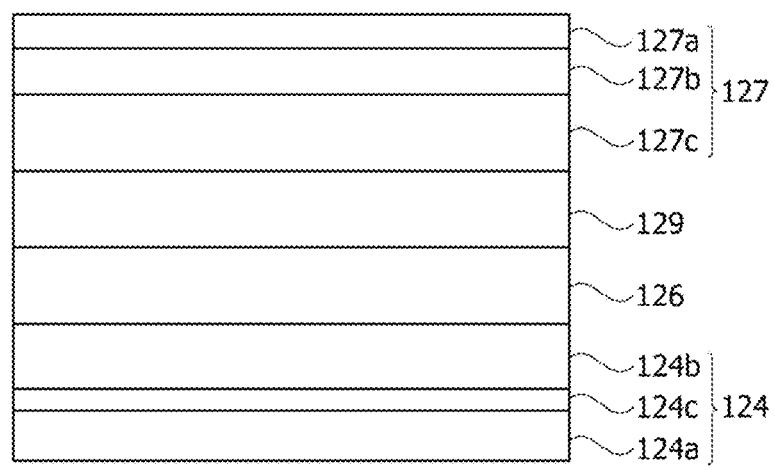
FIG. 9 is a conceptual view of a semiconductor device according to an embodiment of the present invention.

FIG. 9 is a conceptual diagram of a semiconductor structure according to an embodiment of the present invention, and FIG. 10 is a graph showing an aluminum composition of the semiconductor structure according to an embodiment of the present invention.

Referring to FIGS. 9 and 10, a semiconductor device according to an embodiment includes a semiconductor structure 120 including a first conductive semiconductor layer 124, a second conductive semiconductor layer 127, and an active layer 126 disposed between the first conductive semiconductor layer 124 and the second conductive semiconductor layer 127.

The semiconductor structure 120 according to an embodiment of the present invention may output ultraviolet wavelength light. For example, the semiconductor structure 120 may output near-ultraviolet wavelength light (UV-A), far-ultraviolet wavelength light (UV-B), or deep-ultraviolet wavelength light (UV-C). The wavelength range may be determined by the aluminum composition of the semiconductor structure 120.

For example, the near-ultraviolet wavelength light (UV-A) may have a wavelength ranging from 320 nm to 420 nm, the far-ultraviolet wavelength light (UV-B) may have a wavelength ranging from 280 nm to 320 nm, and the deep-ultraviolet wavelength light (UV-C) may have a wavelength ranging from 100 nm to 280 nm.

When the semiconductor structure 120 emits ultraviolet wavelength light, each semiconductor layer of the semiconductor structure 120 may include materials $In_{x1}Al_{y1}Ga_{1-x1-y1}N$ ($0 \le x1 \le 1$, $0 < y1 \le 1$, $0 \le x1+y1 \le 1$) containing aluminum. Here, the aluminum composition may be represented as a ratio of the atomic weight of Al to the total atomic weight including the atomic weight of In, the atomic weight of Ga, and the atomic weight of Al. For example, when the aluminum composition is 40%, the composition of Ga is 60%. That is, the material may be $Al_{40}Ga_{60}N$.

Also, in the description of the embodiments, a composition being low or high may be understood by a difference in composition % (and/or % point) of each semiconductor layer. For example, when a first semiconductor layer has an aluminum composition of 30% and a second conductive semiconductor layer has an aluminum composition of 60%, the aluminum composition of the second conductive semiconductor layer may be represented as being higher than that of the first semiconductor layer by 30%.

The first conductive semiconductor layer 124 may be made of a group III-V or group II-VI compound semiconductor and may be doped with a first dopant. The first conductive semiconductor layer 124 may be made of a material selected from among semiconductor materials having an empirical formula $In_{x1}Al_{y1}Ga_{1-x1-y1}N$ ($0 \le x1 \le 1$, $0 < y1 \le 1$, and $0 \le x1+y1 \le 1$), for example, AlGaN, AlN, InAlGaN, and so on. Also, the first dopant may be an n-type dopant such as Si, Ge, Sn, Se, and Te. When the first dopant is an n-type dopant, the first conductive semiconductor layer 124 doped with the first dopant may be an n-type semiconductor layer. However, the present invention is not limited thereto, and the first conductive semiconductor layer 124 may be a p-type semiconductor layer.

The first conductive semiconductor layer 124 may include a 1-1 conductive semiconductor layer 124a, a 1-2 conductive semiconductor layer 124c, and an intermediate layer 124b disposed between the 1-1 conductive semiconductor layer 124a and the 1-2 conductive semiconductor layer 124c.

The 1-1 conductive semiconductor layer 124a may have an aluminum composition ranging from 50% to 80%. When the aluminum composition of the 1-1 conductive semiconductor layer 124a is greater than 50%, it is possible to improve light extraction efficiency by decreasing an absorption rate of deep-ultraviolet wavelength light (UV-C) emitted from the active layer 126. When the aluminum composition of the 1-1 conductive semiconductor layer 124a is less than 80%, it is possible to secure electric current injection characteristics for the active layer 126 and electric current spreading characteristics in the 1-1 conductive semiconductor layer 124a.

The 1-2 conductive semiconductor layer 124c may be disposed closer to the active layer 126 than the 1-1 conductive semiconductor layer 124a. The 1-2 conductive semiconductor layer 124c may have a lower aluminum composition than the 1-1 conductive semiconductor layer 124a.

When the semiconductor structure 120 emits deep-ultraviolet wavelength light (UV-C), the aluminum composition of the 1-2 conductive semiconductor layer 124c may range from 40% to 70%.

When the aluminum composition of the 1-2 conductive semiconductor layer 124c is greater than or equal to 40%, it is possible to improve light extraction efficiency by decreasing an absorption rate of deep-ultraviolet wavelength light (UV-C) emitted from the active layer 126. When the aluminum composition of the 1-2 conductive semiconductor layer 124c is less than or equal to 70%, it is possible to secure electric current injection characteristics for the active layer 126 and electric current spreading characteristics in the 1-2 conductive semiconductor layer 124c.

The 1-1 conductive semiconductor layer 124a and the 1-2 conductive semiconductor layer 124c may have higher aluminum compositions than the well layer 126a. Accordingly, when the active layer 126 emits ultraviolet wavelength light, it is possible to reduce the absorption rate of ultraviolet wavelength light in the semiconductor structure 120.

Also, when the 1-2 conductive semiconductor layer 124c has a higher aluminum composition than the 1-1 conductive semiconductor layer 124a, it may be easy to extract light from the active layer 126 to the outside of the semiconductor structure 120 due to a difference in refractive index. Accordingly, it is possible to improve the light extraction efficiency of the semiconductor structure 120.

The 1-2 conductive semiconductor layer 124c may be thinner than the 1-1 conductive semiconductor layer 124a. The 1-1 conductive semiconductor layer 124a may have a thickness greater than or equal to 130% of that of the 1-2 conductive semiconductor layer 124c. According to such a configuration, the intermediate layer 124b is disposed after the thickness of the 1-1 conductive semiconductor layer 124a, which has a high aluminum composition, is sufficiently secured. Accordingly, it is possible to enhance the overall crystallinity of the semiconductor structure 120.

The intermediate layer 124b may have a lower aluminum composition than the first conductive semiconductor layer 124 and the second conductive semiconductor layer 127. During a laser lift-off (LLO) process for removing a growth substrate, the intermediate layer 124b may serve to absorb laser emitted to the semiconductor structure 120 to prevent damage to the active layer 126. Accordingly, the semiconductor device according to an embodiment can prevent damage to the active layer 126 during the LLO process, thereby enhancing optical output power and electrical characteristics.

Also, when the intermediate layer 124b is in contact with a first electrode, the intermediate layer 124b may have a lower aluminum composition than the 1-1 conductive semiconductor layer 124a and the 1-2 semiconductor layer 124c in order to decrease resistance between the intermediate layer 124b and the first electrode and thus secure electric current injection efficiency.

The thickness and aluminum composition of the intermediate layer 124b may be appropriately adjusted to absorb laser light emitted to the semiconductor structure 120 during the LLO process. Accordingly, the aluminum composition of the intermediate layer 124b may correspond to the wavelength of the laser light used during the LLO process.

When the LLO laser light has a wavelength ranging from 200 nm to 300 nm, the intermediate layer 124b may have an aluminum composition ranging from 30% to 70% and a thickness ranging from 1 nm to 10 nm.

For example, when the wavelength of the LLO laser light is smaller than 270 nm, the aluminum composition of the intermediate layer 124b may increase to correspond to the wavelength of the LLO laser light. For example, the aluminum composition of the intermediate layer 124b may increase to a range from 50% to 70%.

When the aluminum content of the intermediate layer 124b is higher than that of the well layer 126a, the intermediate layer 124b may be unable to absorb light emitted from the active layer 126. Accordingly, it is possible to enhance light extraction efficiency. According to an embodiment of the present invention, LLO laser light may have a wavelength less than that of light emitted from the well layer 126a. Accordingly, the intermediate layer 124b may have an appropriate aluminum composition such that the intermediate layer 124b absorbs the LLO laser light but does not absorb light emitted from the well layer 126a.

The intermediate layer 124b may include a first intermediate layer (not shown) having a lower aluminum composition than the first conductive semiconductor layer 124 and a second intermediate layer (not shown) having a higher aluminum composition than the first conductive semiconductor layer 124. A plurality of first intermediate layers and a plurality of second intermediate layers may be alternately disposed.

The active layer 126 may be disposed between the first conductive semiconductor layer 124 and the second conductive semiconductor layer 127. The active layer 126 may include a plurality of well layers 126a and a plurality of barrier layers 126b. The well layer 126a is a layer in which first carriers (electrons or holes) injected through the first conductive semiconductor layer 124 are combined with second carriers (holes or electrons) injected through the second conductive semiconductor layer 127. When first carriers (or second carriers) in a conduction band and second carriers (or first carriers) in a valence band are recombined in the well layer 126a of the active layer 126, light having a wavelength corresponding to a difference in energy level (an energy band gap) between the conduction band and the valence band of the well layer 126a may be generated.

The active layer 126 may have, but is not limited to, any one of a single-well structure, a multi-well structure, a single-quantum-well structure, a multi-quantum-well (MQW) structure, a quantum dot structure, and a quantum wire structure.

The active layer 126 may include a plurality of well layers 126a and a plurality of barrier layers 126b. Each of the well layers 126a and the barrier layers 126b may have an empirical formula $In_{x2}Al_{y2}Ga_{1-x2-y2}N$ ($0 \leq x2 \leq 1$, $0 < y2 \leq 1$, and $0 \leq x2+y2 \leq 1$). The well layer 126a may have a different aluminum composition depending on the light-emitting wavelength.

The second conductive semiconductor layer 127 may be formed on the active layer 126 and may be made of a group III-V or group II-VI compound semiconductor. Also, the second conductive semiconductor layer 127 may be doped with a second dopant.

The second conductive semiconductor layer 127 may be made of a semiconductor material having an empirical formula $In_{x5}Al_{y2}Ga_{1-x5-y2}N$ ($0 \leq x5 \leq 1$, $0 < y2 \leq 1$, and $0 \leq x5+y2 \leq 1$) or a material selected from among AlInN, AlGaAs, GaP, GaAs, GaAsP, and AlGaInP.

When the second dopant is a p-type dopant such as Mg, Zn, Ca, Sr, and Ba, the second conductive semiconductor layer 127 doped with the second dopant may be a p-type semiconductor layer. However, the present invention is not limited thereto, and the second conductive semiconductor layer 124 may be an n-type semiconductor layer.

The second conductive semiconductor layer 127 may include a 2-1 conductive semiconductor layer 127a, a 2-2 conductive semiconductor layer 127b, and a 2-3 conductive semiconductor layer 127c. The 2-1 conductive semiconductor layer 127a may have a lower aluminum composition than the 2-2 conductive semiconductor layer 127b and the 2-3 conductive semiconductor layer 127c.

A blocking layer 129 may be disposed between the active layer 126 and the second conductive semiconductor layer 127. The blocking layer 129 may block electrons supplied from the first conductive semiconductor layer 124 from flowing out to the second conductive semiconductor layer 127, thus increasing the probability that electrons and holes will be recombined with each other in the active layer 126. The blocking layer 129 may have a higher energy band gap than the active layer 126 and/or the second conductive semiconductor layer 127. The blocking layer 129 is doped with the second dopant, and thus may be defined as a partial region of the second conductive semiconductor layer 127.

The blocking layer 129 may be made of a material selected from among semiconductor materials having an empirical formula $In_{x1}Al_{y1}Ga_{1-x1-y1}N$ ($0 \leq x1 \leq 1$, $0 \leq y1 \leq 1$, and $0 \leq x1+y1 \leq 1$), for example, AlGaN, AlN, InAlGaN, and so on, but is not limited thereto.

According to an embodiment, the first conductive semiconductor layer 124, the active layer 126, the second conductive semiconductor layer 127, and the blocking layer 129 may all contain aluminum. Accordingly, the first conductive semiconductor layer 124, the active layer 126, the second conductive semiconductor layer 127, and the blocking layer 129 may have a composition of AlGaN, InAlGaN, or AlN.

The blocking layer 129 may have a higher aluminum composition than the well layer 126a. For example, the aluminum composition of the blocking layer 129 may range from 50% to 100%. When the aluminum composition of the blocking layer 129 is greater than or equal to 50%, the blocking layer 129 may have an enough energy barrier to block first carriers and may be unable to absorb light emitted from the active layer 126.

The blocking layer 129 may include a 1-1 section 129a and a 1-2 section 129c.

The 1-1 section 129a may have an aluminum composition increasing from the first conductive semiconductor layer 124 toward the second conductive semiconductor layer 127.

The aluminum composition of the 1-1 section 129a may range from 80% to 100%. Accordingly, the 1-1 section 129a of the blocking layer 129 may be a part having the highest aluminum composition in the semiconductor structure 120.

The 1-1 129a may include AlGaN or AlN. Alternatively, the 1-1 section 129a may be a superlattice layer in which AlGaN and AlN are alternately disposed.

The 1-1 section 129a may have a thickness ranging from about 0.1 nm to about 4 nm. In order to efficiently block the movement of first carriers to the second conductive semiconductor layer 127, the 1-1 section 129a may be formed to a thickness of 0.1 nm or greater. Also, in order to secure injection efficiency for second carriers injected from the second conductive semiconductor layer 127 to the active layer 126, the 1-1 section 129a may be formed to a thickness of 4 nm or less.

In an embodiment, the 1-1 section 129a is formed to a thickness ranging from 0.1 nm to 4 nm in order to secure hole injection efficiency and electron blocking efficiency, but is not limited thereto. For example, when it is necessary to selectively further secure any one of the first-carrier blocking function and the second-carrier injection function, there may be a deviation from the aforementioned numerical range.

A 1-3 section 129b disposed between the 1-1 section 129a and the 1-2 section 129c may include an undoped section, which contains no dopant. Accordingly, the 1-3 section 129b may serve to prevent the second dopant from spreading from the second conductive semiconductor layer 127 to the active layer 126.

The second conductive semiconductor layer 127 may include a 2-1 conductive semiconductor layer 127a, a 2-2 conductive semiconductor layer 127b, and a 2-3 conductive semiconductor layer 127c.

The 2-2 conductive semiconductor layer 127b may have a thickness greater than 10 nm and less than 50 nm. For example, the thickness of the 2-2 conductive semiconductor layer 127b may be equal to 25 nm. When the thickness of the 2-2 conductive semiconductor layer 127b is greater than or equal to 10 nm, it is possible to secure electric current spreading characteristics of the 2-2 conductive semiconductor layer 127b. Also, when the thickness is less than or equal to 50 nm, it is possible to secure injection efficiency for second carriers injected into the active layer 126 and reduce an absorption rate of light emitted from the active layer 126 in the 2-2 conductive semiconductor layer 127b.

The 2-2 conductive semiconductor layer 127b may have a higher aluminum composition than the well layer 126a. In order to generate ultraviolet light, the aluminum composition of the well layer 126a may range from about 30% to about 70%. Accordingly, the aluminum composition of the 2-2 conductive semiconductor layer 127b may range from 40% to 80%.

It is possible to reduce absorption of light when the aluminum composition of the 2-2 conductive semiconductor layer 127b is greater than or equal to 40% and also possible to reduce deterioration of electric current injection efficiency when the aluminum composition of the 2-2 conductive semiconductor layer 127b is less than or equal to 80%. For example, when the aluminum composition of the well layer 126a is equal to 30%, the aluminum composition of the 2-2 conductive semiconductor layer 127b may be equal to 40%.

The 2-1 conductive semiconductor layer 127a may have a lower aluminum composition than the well layer 126a. When the 2-1 conductive semiconductor layer 127a has a higher aluminum composition than the well layer 126a, the 2-1 conductive semiconductor layer 127a is unable to be sufficiently ohmic with a second electrode due to an increase in resistance therebetween, and also it is possible to reduce electric current injection efficiency.

The aluminum composition of the 2-1 conductive semiconductor layer 127a may range from 1% to 50%. When the aluminum composition is less than or equal to 50%, it is possible to reduce resistance with the second electrode. When the aluminum composition is greater than or equal to 1%, it is possible to reduce absorption of light in the 2-1 conductive semiconductor layer 127a. The 2-1 conductive semiconductor layer 127a may have a lower aluminum composition than the intermediate layer 124.

The 1-1 conductive semiconductor layer 127a may have a thickness ranging from 1 nm to 30 nm. Accordingly, it may be advantageous, in terms of optical output power, that the 2-1 conductive semiconductor layer 127a be adjusted to be as thin as possible because the 2-1 conductive semiconductor layer 127a is able to absorb ultraviolet light.

However, when the thickness of the 2-1 conductive semiconductor layer 127a is greater than or equal to 1 nm, it is possible to decrease resistance of the 2-1 conductive semiconductor layer 127a and thus improve electrical characteristics of the semiconductor device. Also, when the thickness is less than or equal to 30 nm, it is possible to improve optical output power efficiency by decreasing the quantity of light absorbed by the 2-1 conductive semiconductor layer 127a.

The 2-1 conductive semiconductor layer 127a may have a smaller thickness than the 2-2 conductive semiconductor layer 127b. A thickness ratio of the 2-1 conductive semiconductor layer 127a to the 2-2 conductive semiconductor layer 127b may range from 1:1.5 to 1:20. When the thickness ratio is greater than 1:1.5, the thickness of the 2-2 conductive semiconductor layer 127b increases, and thus it is possible to improve electric current injection efficiency. Also, when the thickness ratio is less than 1:20, the thickness of the 2-1 conductive semiconductor layer 127a increases, and thus it is possible to reduce deterioration of crystallinity. When the 2-1 conductive semiconductor layer 127a is too thin, it is necessary for the aluminum composition to be quickly changed in the range of the thickness, and thus it is possible to reduce the crystallinity.

The 2-2 conductive semiconductor layer 127b may have an aluminum composition decreasing away from the active layer 126. Also, the 2-1 conductive semiconductor layer 127a may have an aluminum composition decreasing away from the active layer 126.

In this case, the 2-1 conductive semiconductor layer 127a may have a greater reduction of aluminum with respect to thickness than the 2-2 conductive semiconductor layer 127b. That is, the 2-1 conductive semiconductor layer 127a may have a greater variation in aluminum composition in the direction of thickness than the 2-2 conductive semiconductor layer 127b.

The 2-1 conductive semiconductor layer 127a may have a lower aluminum composition than the well layer 126a in order to achieve low contact resistance with the second electrode. Accordingly, the 2-1 conductive semiconductor layer 127a may absorb a portion of the light emitted from the well layer 126a.

Accordingly, in order to suppress absorption of light, the 2-1 conductive semiconductor layer 127a may be formed to a thickness ranging from 1 nm to 30 nm.

As a result, the 2-1 conductive semiconductor layer 127a has a small thickness but a relatively high variation in aluminum. Thus, the 2-1 conductive semiconductor layer 127a may have a relatively high reduction in aluminum with respect to thickness.

On the other hand, the 2-2 conductive semiconductor layer 127b is thicker than the 2-1 conductive semiconductor layer 127a and has a higher aluminum composition than the well layer 126a. Thus, the 2-2 conductive semiconductor layer 127b may have a relatively slow reduction in aluminum.

Since the 2-1 conductive semiconductor layer 127a is thin and has a large change in aluminum composition with respect to thickness, it is possible to change the aluminum composition while relatively slowly growing the 2-1 conductive semiconductor layer 127a.

The 2-3 conductive semiconductor layer 127c may have a uniform aluminum composition. The 2-3 conductive semiconductor layer 127c may have a thickness ranging from 20 nm to 60 nm. The 2-3 conductive semiconductor layer 127c may have an aluminum composition ranging from 40% to 70%. When the aluminum composition of the 2-3 conductive semiconductor layer 127c is greater than or equal to 40%, it is not possible to reduce crystallinity of the 2-1 conductive semiconductor layer 127a and the 2-2 conductive semiconductor layer 127b. When the aluminum composition is less than 70%, it is possible to prevent reduction of the crystallinity due to a rapid change in aluminum composition of the 2-1 conductive semiconductor layer 127a and the 2-2 conductive semiconductor layer 127b, thus enhancing electrical characteristics of the semiconductor device.

As described above, the 2-1 conductive semiconductor layer 127a may have a thickness ranging from 1 nm to 10 nm, the 2-2 conductive semiconductor layer 127b may have a thickness ranging from 10 nm to 50 nm, and the 2-3 conductive semiconductor layer 127c may have a thickness ranging from 20 nm to 60 nm.

Accordingly, a ratio of the thickness of the 2-1 conductive semiconductor layer 127a to the total thickness of the second conductive semiconductor layer 127 may range from 1:3 to 1:120. When the ratio is greater than 1:3, the 2-1 conductive semiconductor layer 127a may secure the electrical characteristics (e.g., an operating voltage) of the semiconductor device. When the ratio is less than 1:120, the 2-1 conductive semiconductor layer 127a may secure optical characteristics (e.g., optical output power) of the semiconductor device. However, the present invention is not limited thereto, and the ratio of the thickness of the 2-1 conductive semiconductor layer 127a to the total thickness of the second conductive semiconductor layer 127 may range from 1:3 to 1:150 or range from 1:3 to 1:70.

The second conductive semiconductor layer 127 according to an embodiment of the present invention may have a first point P1 with the highest aluminum composition in the semiconductor structure and a third point P3 with the lowest aluminum composition in the semiconductor structure. Here, the first point P1 may be the 1-1 section 129a of the blocking layer 129 with the highest aluminum composition, and the third point P3 may be the 2-1 conductive semiconductor layer 127a with the smallest aluminum composition.

The first conductive semiconductor layer 124 may have a second point P2 with the highest aluminum composition in the first conductive semiconductor layer and a fourth point P4 with the lowest aluminum composition. The second point P2 may be the 1-1 conductive semiconductor layer 124a and/or the 1-2 conductive semiconductor layer 124c, and the fourth point P4 may be the intermediate layer 124b.

The 1-1 section 129a may have an aluminum composition ranging from 80% to 100%. The 2-1 conductive semiconductor layer 127a may have an aluminum composition ranging from 1% to 50%. In this case, the 2-1 conductive semiconductor layer 127a may have a lower aluminum composition than the well layer 126a.

Accordingly, an aluminum composition ratio between the third point P3 and the first point P1 may range from 1:4 to 1:100. When the aluminum composition ratio is greater than or equal to 1:4, the aluminum composition of the first point P1 may increase, thereby effectively blocking first carriers from passing through the second conductive semiconductor layer. When the aluminum composition ratio is less than or equal to 1:100, the aluminum composition of the third point P3 may increase, thereby reducing absorption of light at the third point P3.

The 1-1 conductive semiconductor layer 124a may have an aluminum composition ranging from 50% to 80%. The intermediate layer 124b may have an aluminum composition ranging from 30% to 70%. In this case, the intermediate layer 124b may have a lower aluminum composition than the 1-1 conductive semiconductor layer. Accordingly, an aluminum composition ratio between the fourth point P4 and the second point P2 may range from 1:0.5 to 1:0.9.

When the aluminum composition ratio is greater than or equal to 1:0.5, the aluminum composition of the 1-1 conductive semiconductor layer 124a may increase, thereby enhancing the crystallinity. When the aluminum composition ratio is less than or equal to 1:0.9, the aluminum composition of the intermediate layer 124b may increase, thereby reducing absorption of ultraviolet wavelength light.

Figure 11A:
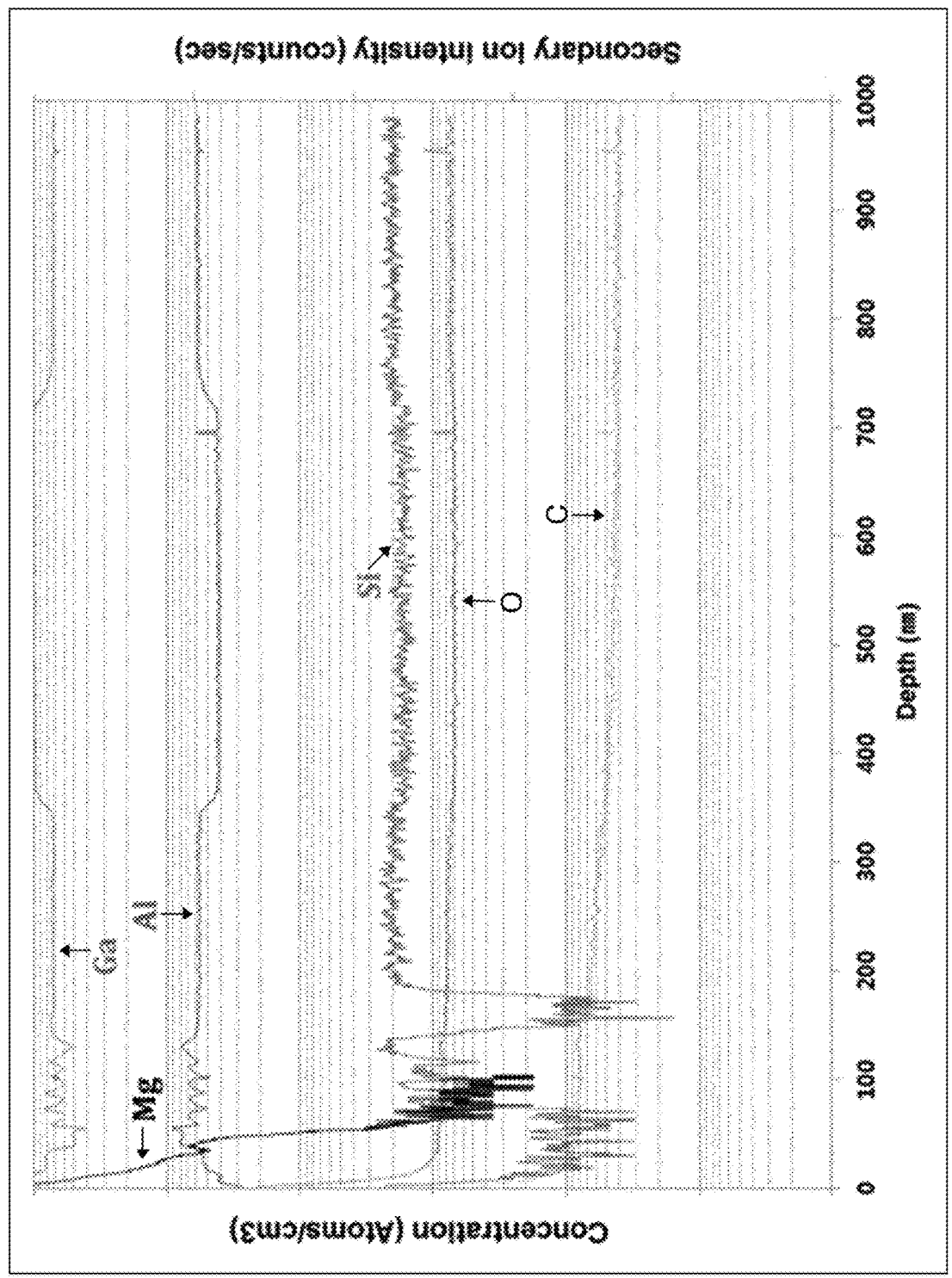
FIGS. 11A and 11B show SIMS data of a semiconductor structure according to an embodiment of the present invention.
Figure 11B:
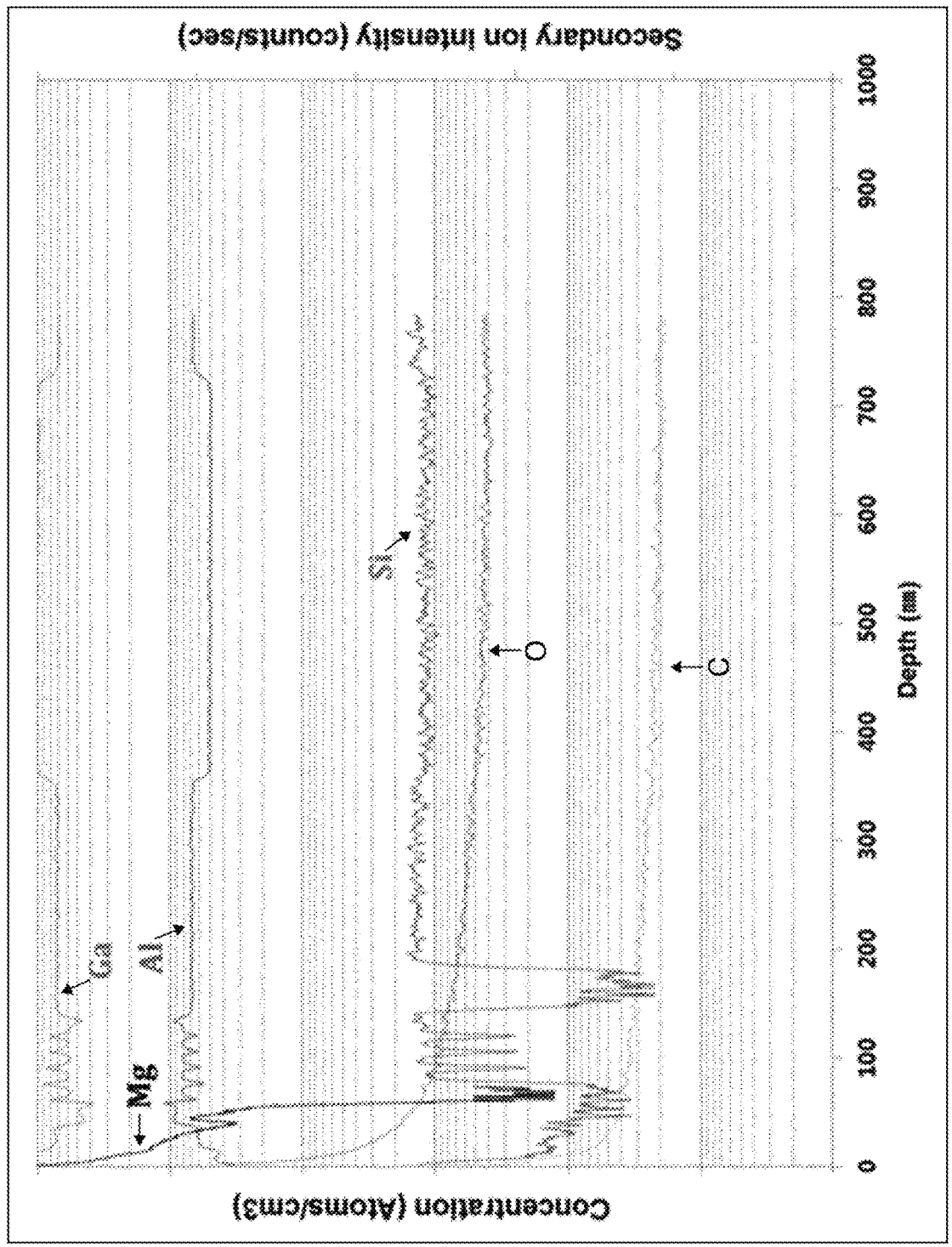
Figure 11C:
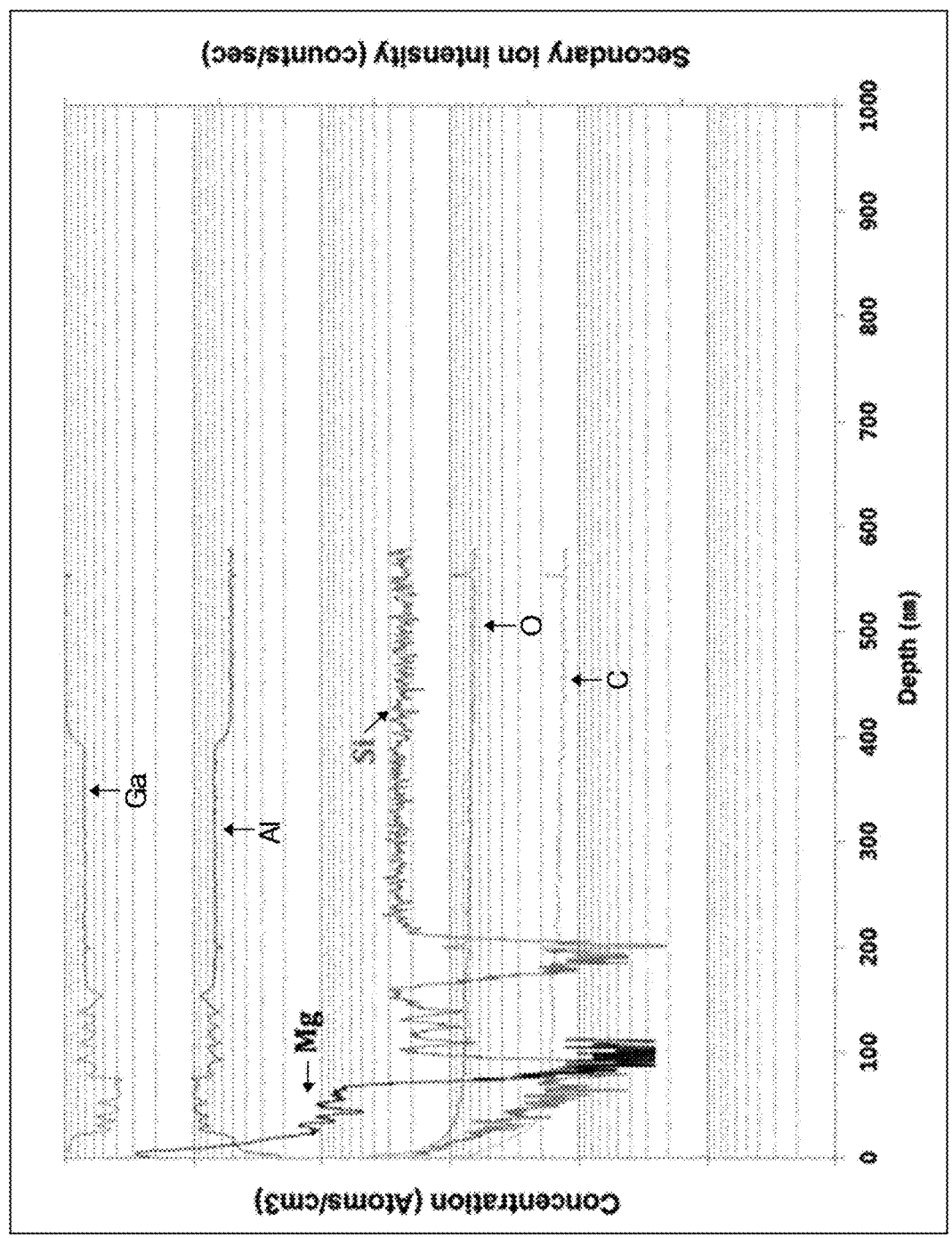
FIGS. 11C and 11D show SIMS data of a semiconductor structure according to another embodiment of the present invention.
Figure 11D:
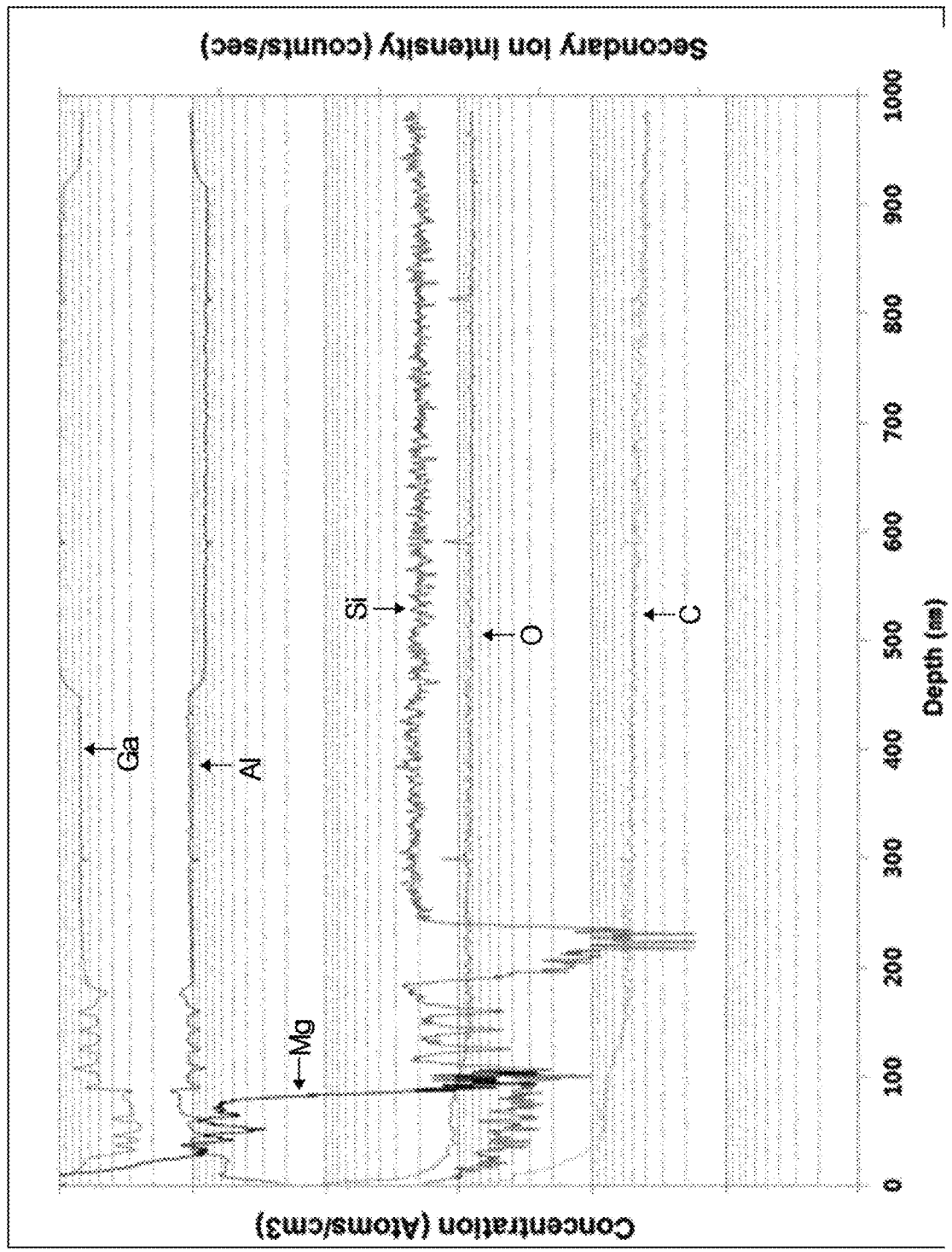
Figure 12:
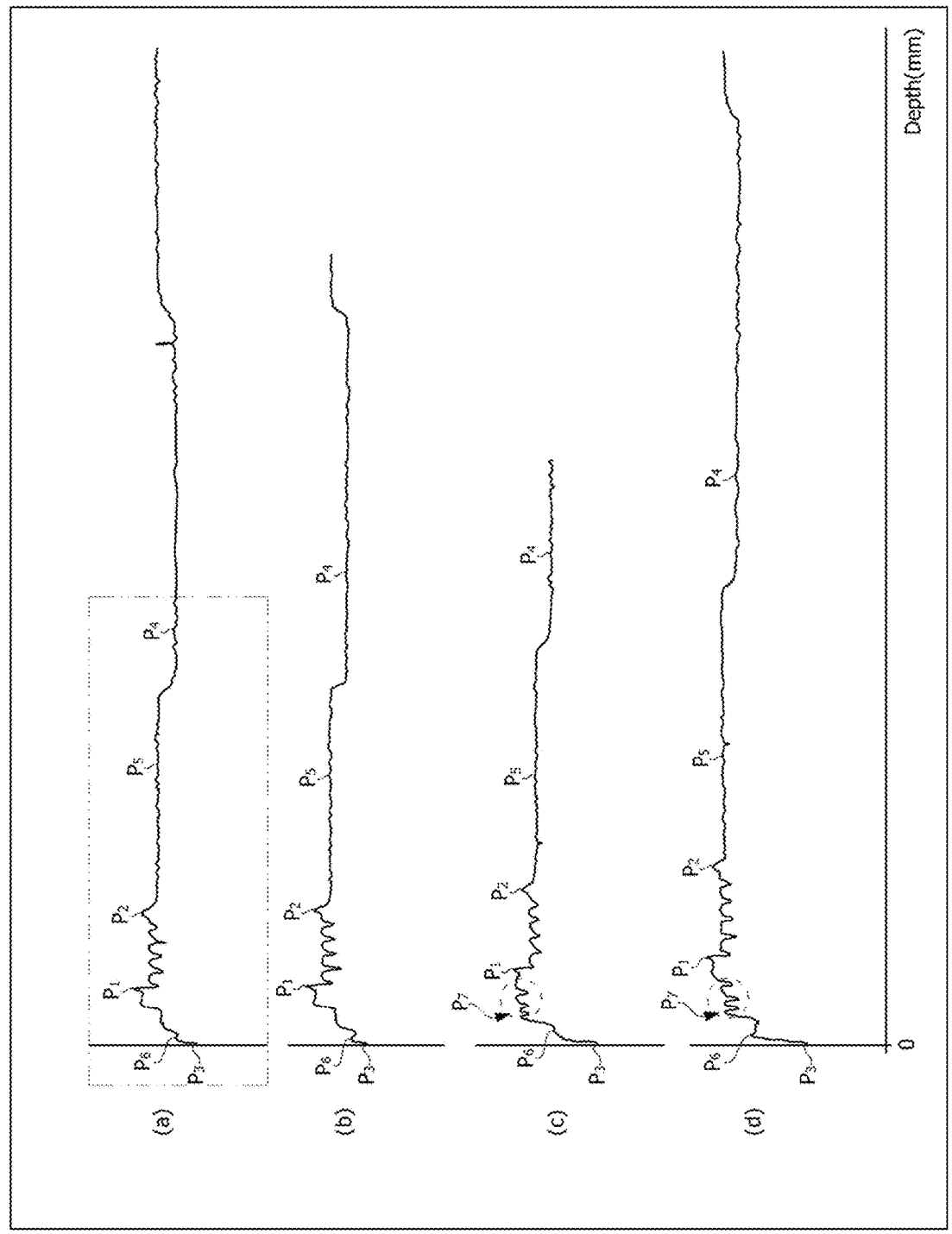
FIG. 12 is a view showing an aluminum ion intensity of FIGS. 11A to 11D.
Figure 13A:
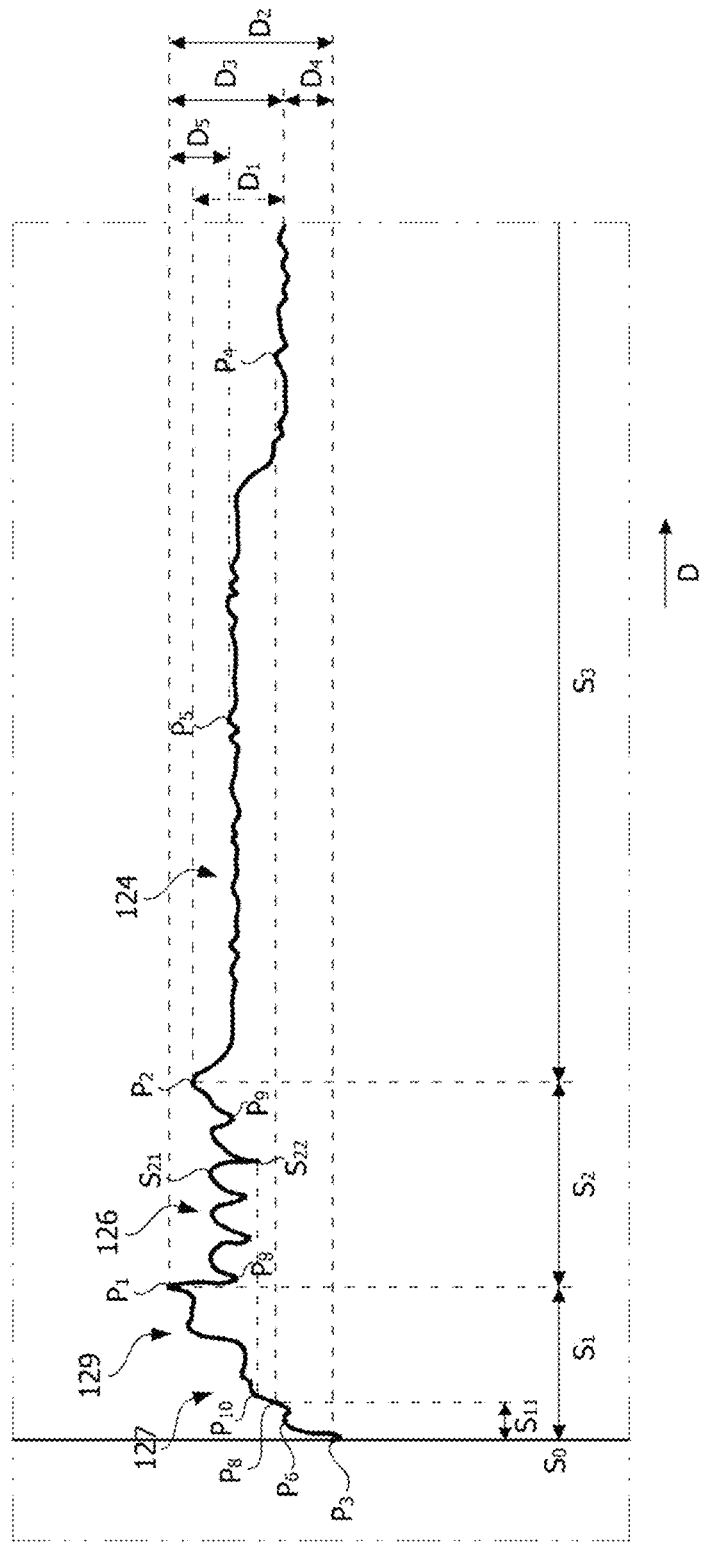
FIG. 13A is a view showing SIMS data of FIG. 12A that is partially enlarged.
Figure 13B:
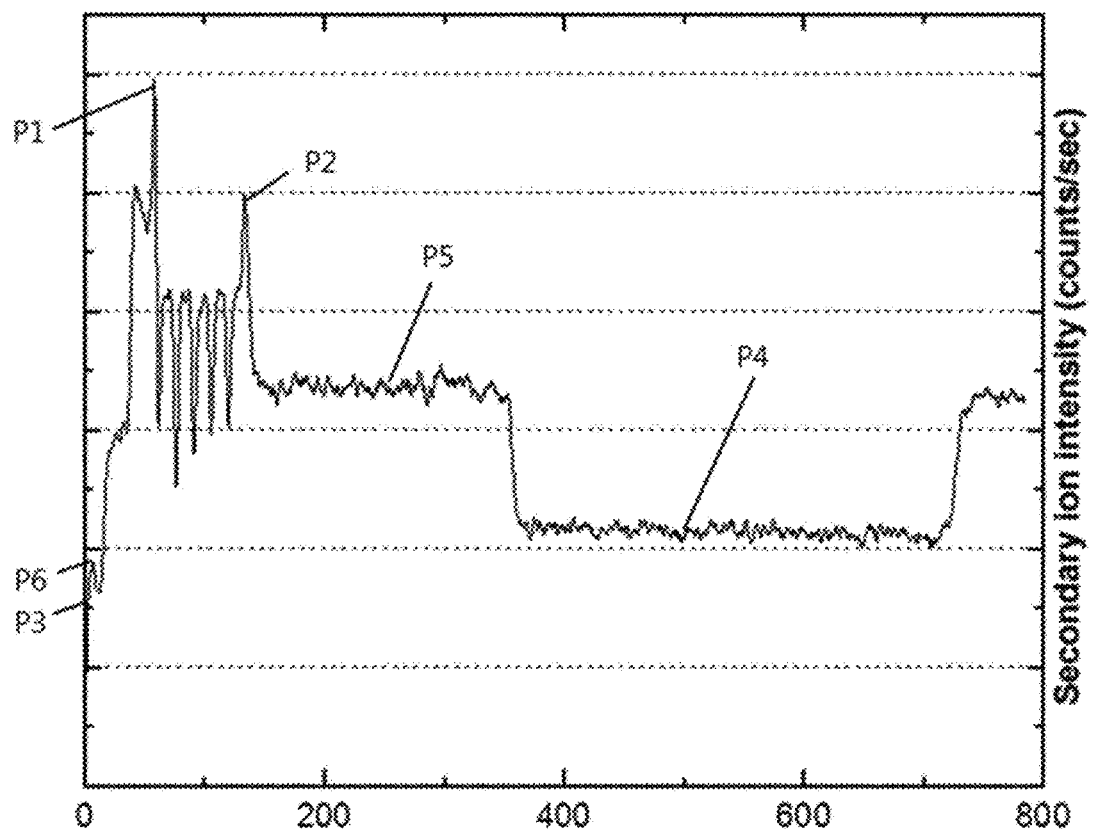
FIG. 13B is a view showing SIMS data of FIG. 12B that is converted to a linear scale.

FIGS. 11A and 11B show SIMS data of a semiconductor structure according to an embodiment of the present invention, FIGS. 11C and 11D show SIMS data of a semiconductor structure according to another embodiment of the present invention, FIG. 12 is a view showing an aluminum ion intensity of FIGS. 11A to 11D, FIG. 13A is a view showing SIMS data of FIG. 12A that is partially enlarged, and FIG. 13B is a view showing SIMS data of FIG. 12B that is converted to a linear scale.

Referring to FIG. 11A, the semiconductor structure may have compositions of aluminum (Al), gallium (Ga), a first dopant, a second dopant, oxygen (O), and carbon (C) changing in a direction from the first conductive semiconductor layer 124 to the second conductive semiconductor layer 127. The first dopant may be silicon (Si), and the second dopant may be magnesium (Mg). However, the present invention is not limited thereto.

SIMS data may be analyzed through Time-of-Flight secondary ion mass spectrometry (TOF-SIMS).

SIMS data may be analyzed by emitting primary ions to a target surface and counting the number of secondary ions discharged. In this case, the primary ions may be selected from among O2+, Cs+, Bi+, and so on, an acceleration voltage may be adjusted in the range of about 20 keV to 30 keV, an emitted current may be adjusted in the range of about 0.1 pA to 5.0 pA, and a target area may be 20 nm×20 nm.

SIMS data may be obtained by collecting a secondary ion mass spectrum while gradually etching a surface (a point with a depth of zero) of the second conductive semiconductor layer in a direction toward the first conductive semiconductor layer.

However, the present invention is not limited thereto, and measurement conditions for detecting AlGaN-based and/or GaN-based semiconductor materials, first dopant materials, and second dopant materials may be variously used.

Also, a result of the SMIS analysis may be obtained by interpreting a spectrum for a secondary ion intensity or a doping concentration of each of the materials. When the secondary ion intensity or the doping concentration is interpreted, the result may include noise generated by a factor of 0.9 to 1.1. Accordingly, the term "the same/identical" refers to including noise scaled by a factor of 0.9 to 1.1 with respect to a specific secondary ion intensity or doping concentration.

The aluminum and gallium in the SIMS data of FIGS. 11A to 11D are spectrum data for the secondary ion intensity, and the first dopant, second dopant, oxygen, and carbon are data obtained by measuring the doping concentration. That is, FIGS. 11A to 11D are placed in a single drawing to express SIMS data and doping concentration data.

Referring to 11A, it is shown that a spectrum for an intensity level of aluminum and a spectrum for concentrations of the first and second dopants partially intersect each other. However, data regarding ion intensities and data regarding dopant concentrations may have an independent relation.

For example, it is shown that an aluminum ion intensity and a doping concentration of a second dopant intersect each other near the surface (the point having a depth of zero). However, when a doping concentration reference point (i.e., the lowest point in the left Y axis of this drawing) is set to be low, a doping concentration may decrease on the graph. For example, when a reference point of a second dopant doping concentration is decreased from 1.00E+14 to 1.00E+12, a second dopant concentration decreases on the graph, and thus second dopant data and aluminum data may not intersect each other.

A method of measuring concentrations of the first dopant, the second dopant, oxygen, or carbon is not limited to a specific form. Also, in this embodiment, a longitudinal axis (i.e., a Y axis) is shown and converted to a log scale.

It can be seen that an aluminum ion intensity gradually increases with depth from a surface and alternately increases and decreases after the maximum intensity point. Since a material AlGaN is formed by replacing an Al atom with a Ga atom in a GaN-based semiconductor material, a gallium ion intensity may be symmetrical to the aluminum ion intensity.

The ion intensity according to an embodiment may increase or decrease depending on measurement conditions. However, a secondary ion intensity (e.g., for an aluminum ion) may generally increases on the graph when a primary ion intensity increases and may generally decrease when the primary ion intensity decreases. Accordingly, the change in ion intensity in the direction of thickness may be similar even when measurement conditions are changed.

A doping concentration of a second dopant may be highest on a surface and may gradually decrease away from the surface. The second dopant may be present in all regions of the second conductive semiconductor layer and some regions of the active layer, but is not limited thereto. The second dopant may be placed in only the second conductive semiconductor layer, but may diffuse up to the active layer. Accordingly, it is possible to improve injection efficiency for the second dopant injected into the active layer. However, when the second dopant diffuses up to the first conductive semiconductor layer, a leakage current of the semiconductor device and/or non-radiative recombination between first and second carriers may occur, thereby reducing reliability and/or light emitting efficiency of the semiconductor device.

The first dopant may have a section R1 between the first conductive semiconductor layer and the active layer in which the first dopant has a lower concentration than oxygen. The first dopant may be partially distributed even in the active layer. Accordingly, it is possible to improve injection efficiency for first carriers injected into the active layer and also possible to improve radiative recombination efficiency between first and second carriers.

It can be confirmed that FIGS. 11B to 11D show the same tendency as FIG. 11A.

Referring to FIGS. 12 and 13A, an aluminum ion intensity may include aluminum ion intensities of first to sixth points P1, P2, P3, P4, P5, and P6. FIG. 12A shows an aluminum ion intensity of FIG. 11A, FIG. 12B shows an aluminum ion intensity of FIG. 11B, FIG. 12C shows an aluminum ion intensity of FIG. 11C, and FIG. 12D shows an aluminum ion intensity of FIG. 11D.

FIGS. 12C and 12D show distributions similar to a distribution for the aluminum ion intensity of FIG. 12A, except for a concave-convex section P7 between the first point P1 and the third point P3 in which the ion intensity changes. For example, according to embodiments of FIGS. 12C and 12D, there is a structure in which a superlattice layer is additionally disposed on the blocking layer.

The aluminum ion intensity of the first point P1 may be highest in the semiconductor structure 120. Since the aluminum ion intensity of the first point P1 is highest, it is possible to prevent first carriers from being non-radiatively recombined with second carriers in the second conductive semiconductor layer. Accordingly, it is possible to improve optical output power of the semiconductor device. The first point P1 may be a region corresponding to the 1-1 section 129a of the blocking layer 129, but is not limited thereto.

A secondary ion intensity of the second point P2 may correspond to a point having the highest aluminum ion intensity among points having aluminum ion intensities extending in a first direction D (i.e., a direction in which the depth increases) from the first point P1.

The second point P2 may be a point of the first conductive semiconductor layer 124 having the highest aluminum ion intensity and also may be a point of the first conductive semiconductor layer 124 that is closest to the active layer 126.

The second point P2 may be used to balance concentrations or densities of first and second carriers that are recombined in the active layer by reducing first carrier energy injected into the active layer in the first conductive semiconductor layer 124. Accordingly, it is possible to improve light emitting efficiency and thus optical output power characteristics of the semiconductor device.

A third ion intensity of the third point P3 may correspond to a point having the lowest aluminum ion intensity in a direction from the first point P1 to a surface of the semiconductor structure 120 (in a direction opposite to the first direction).

When the third point P3 is in contact with the second electrode, resistance between the third point P3 and the second electrode may be low because the aluminum ion intensity of the third point P3 is lowest. Accordingly, it is possible to secure injection efficiency with which electric current is injected into the semiconductor structure 120 through the second electrode.

A fourth ion intensity of the fourth point P4 may correspond to a point having the lowest aluminum ion intensity in the first direction from the second point P2.

When an LLO process is applied during a process for the semiconductor device, the fourth point P4 may absorb laser light so that the laser light does not penetrate the active layer, thereby preventing damage to the active layer due to the LLO process.

Also, when the fourth point P4 is in contact with the first electrode, it is possible to improve injection efficiency with which electric current is injected into the semiconductor structure by decreasing resistance between the first electrode and the fourth point P4. In this regard, the aluminum ion intensity of the fourth point P4 may be lowest in the first direction from the second point P2.

The fifth point P5 may be disposed between the second point P2 and the fourth point P4. An aluminum ion intensity of the fifth point P5 may be between those of the second point P2 and the fourth point P4. The fifth point P5 may be a single specific point or may be formed as a single layer. There may be an improvement in that a density per unit area of the electric current injected into the active layer is made to be uniform by the electric current injected through the fourth point P4 being uniformly distributed in a layer including the fifth point P5.

Also, points (or layers) having the same or similar ion intensities of aluminum as or to the fifth point P5 may be separately disposed in the first direction D from the fourth point P4. That is, there may be a section in which the ion intensity increases in the first direction from the fourth point P4. Accordingly, the fourth point P4 may be disposed between the points (or layers) having the same aluminum ion intensity as the fifth point P5. However, the present invention is not limited thereto, and a region that is separated from the fifth point P5 in the first direction D and spaced farther apart in the first direction D than the fourth point P4 may have a higher aluminum ion intensity than the fifth point P5.

A tenth point P10 may be disposed between the first point P1 and the third point P3 and may have the same aluminum ion intensity as a point S22 having the smallest ion intensity between the first point P1 and the second point P2.

A region between the tenth point P10 and the third point P3 may have a thickness ranging from 1 nm to 30 nm in order to suppress absorption of light emitted by the semiconductor device and decrease contact resistance with the second electrode.

Also, the third point P3 electrically connected with the second electrode may have a lower electrical conductivity than the fourth point P4 connected with the first electrode. Accordingly, the third point P3 may have a smaller ion intensity than the fourth point P4.

An average variation in aluminum ion intensity between the tenth point P10 and the third point P3 may be greater than an average variation in aluminum ion intensity between the first point P1 and the tenth point P10. Here, the average variation may be obtained by dividing the maximum variation in aluminum ion intensity by thickness.

A region S11 between the third point P3 and the tenth point P10 may have a section in which the aluminum ion intensity decreases toward a surface S0 and a reverse section P6 in which the aluminum ion intensity does not decrease toward the surface S0. The reverse section P6 may be a section in which the aluminum ion intensity increases toward the surface S0 or is maintained.

When the reverse section P6 is disposed in the region between the third point P3 and the tenth point P10, electric current injected through the third point P3 may be uniformly spread, and thus density of electric current injected into the active layer may be controlled to be uniform. Accordingly, it is possible to enhance optical output power characteristics and electrical characteristics of the semiconductor device.

The reverse section P6 may be controlled through temperature. For example, the region between the third point P3 and the tenth point P10 may have an aluminum composition controlled through temperature control. In this case, when the temperature is too rapidly lowered, it is possible to significantly reduce crystallinity of the second conductive semiconductor layer.

Accordingly, during a process for continuously lowering or raising temperature, a large amount of aluminum is instantly contained at the moment when a temperature having been lowered is raised, and thus it is possible to create the reverse section P6.

That is, during a process of forming the third point P3 after the tenth point P10 having the same aluminum ion intensity as a point having the smallest aluminum ion intensity in the active layer is formed, it is possible to control an aluminum composition through temperature and to place the reverse section P6 in order to secure crystallinity of the second conductive semiconductor layer and secure electric current spreading characteristics.

However, the present invention is not limited thereto. According to another embodiment, in order to further secure the electric current injection characteristics, the aluminum ion intensity may continuously decrease in a direction from the tenth point P10 to the third point P3 without the reverse section P6.

Referring to FIG. 13A, in a graph for aluminum ion intensity, the semiconductor structure may include a first section S1, a second section S2, and a third section S3 in a direction in which the depth increases.

The first section S1 may be disposed between the first point P1 and the third point P3 and may be configured as the second conductive semiconductor layer 127. The second section S2 may be disposed between the first point P1 and the second point P2 and may be configured as the active layer 126. The third section S3 may be disposed in the first direction from the second point P2 and may be configured as the first conductive semiconductor layer 124.

The second section S2 may be disposed between the first point P1 and the second point P2. As described above, the first point P1 may be a point having the highest aluminum intensity of aluminum in the semiconductor structure, and the second point P2 may be a point that is separately disposed in the first direction away from the surface on this drawing (in a direction in which the depth increases) and has an ion intensity higher than the maximum ion intensity (a peak ion intensity) of the second section S2.

However, the present invention is not limited thereto, and the second point may have the same height as the fifth point. In this case, the second section may be disposed between the first point and the fifth point.

The second section S2 is a section corresponding to the active layer 126 and may have a plurality of peaks S21 and a plurality of valleys S22. A valley S22 may be an ion intensity of the well layer, and a peak S21 may be an ion intensity of the barrier layer.

An ion intensity ratio M1 of a point of the valley S22 having the lowest ion intensity to the first point P1 may range from 1:0.4 to 1:0.6, and an ion intensity ratio M2 of the valley S22 to the peak S21 may range from 1:0.5 to 1:0.75.

When the aluminum ion intensity ratio M1 of the point of the valley S22 having the lowest ion intensity to the first point P1 is greater than or equal to 1:0.4, it is possible to secure crystallinity of the second conductive semiconductor layer between the first point P1 and the third point P3 that are disposed closer than the active layer and also to prevent injection of first carriers into the second conductive semiconductor layer to increase the probability of radiative recombination in the active layer. Accordingly, it is possible to improve optical output power characteristics of the semiconductor device.

Also, when the ion intensity ratio M1 is less than or equal to 1:0.6, it is possible to secure crystallinity of the second conductive semiconductor layer between the first point P1 and the third point P3 that are disposed closer to the surface than the active layer.

When the ion intensity ratio M2 of the valley S22 to the peak S21 is greater than or equal to 1:0.5, it is possible for the barrier layer to effectively prevent carriers from flowing out from the well layer included in the active layer to the first conductive semiconductor layer and/or the second conductive semiconductor layer to increase the probability of radiative recombination in the well layer, thus enhancing optical output power characteristics of the semiconductor device.

Also, when the ion intensity ratio M2 is less than or equal to 1:0.75, it is possible to secure crystallinity of the semiconductor structure, reduce a change in wavelength due to strain, and/or increase the probability of radiative recombination by reducing stress due to a difference in lattice constant between the well layer and the barrier layer.

A ratio of the ratio M1 to the ratio M2 may satisfy a range of 1:0.3 to 1:0.8. Accordingly, a section in which the ratio of the ratio M1 to the ratio M2 satisfies a range of 1:0.3 to 1:0.8 may be a section in which the active layer is actually disposed.

The ion intensity of the third point P3 may have an ionic intensity less than the smallest ion intensity in the second section S2 (i.e., the ion intensity of the well layer). In this case, the active layer may be included in the second section S2 and may be defined as a region between a valley P8 closest to the first point P1 and a valley P9 farthest from the first point P1.

Also, a distance between adjacent valleys S22 may be smaller than a distance between the first point P1 and the second point P2. This is because the thickness of the well layer and the barrier layer is smaller than the entire thickness of the active layer 126.

The first section Si may include a surface region S11 having a smaller ion intensity than the fourth point P4. In this case, the ion intensity of the surface region S11 may decrease in the direction opposite to the first direction D.

According to the SIMS data, a ratio of a first intensity difference D1 between the second point P2 and the fourth point P4 to a second intensity difference D2 between the first point P1 and the third point P3 (D1:D2) may range from 1:1.5 to 1:2.5. When the intensity difference ratio D1:D2 is greater than or equal to 1:1.5 (e.g., 1:1.6), the second intensity difference D2 decreases and thus it is possible to sufficiently reduce the aluminum composition of the first point P1. Accordingly, it is possible to reduce contact resistance with the second electrode.

Also, when the intensity difference ratio D1:D2 is less than or equal to 1:2.5 (e.g., 1:2.4), it is possible to prevent light emitted by the active layer 126 from being absorbed by the 2-1 conductive semiconductor layer 127a due to a too low aluminum composition and thus prevent a degradation of the optical characteristics of the semiconductor.

A ratio of a third intensity difference D3 between the seventh point P7 and the first point P1 to a fourth intensity difference D4 between the fourth point P4 and the third point P3 (D3:D4) may range from 1:0.2 to 1:2 or range from 1:0.2 to 1:1.

When the intensity difference ratio is greater than or equal to 1:0.2, the fourth intensity difference D4 relatively increases, and thus it is possible to sufficiently reduce the aluminum composition. Accordingly, it is possible to reduce contact resistance with the second electrode. Also, when the composition ratio is less than or equal to 1:2, it is possible to prevent a reduction in crystallinity due to a rapid change in aluminum composition in a range of thickness of the 2-1 conductive semiconductor layer 127a. Also, it is possible to prevent light emitted by the active layer 126 from being absorbed by the 2-1 conductive semiconductor layer 127a due to a too low aluminum composition.

Conventionally, a thin GaN layer was inserted for ohmic contact between the second conductive semiconductor layer 127 and the electrode. However, in this case, since the GaN layer in contact with the electrode does not contain aluminum, the aluminum ion intensity of the third point P3 is not measured or is significantly reduced. Accordingly, the ratio of the first intensity difference D1 to the second intensity difference D2 (D1:D2) and the ratio of the third intensity difference D3 to the fourth intensity difference D4 (D3:D4) may depart from the aforementioned range.

A ratio of the intensity difference between the first point P1 and the third point P3 to the intensity difference between the fifth point P5 and the third point P3 may range from 1:0.5 to 1:0.8. When the intensity difference ratio is greater than or equal to 1:0.5, the intensity of the fifth point P5 increases. Thus, it is possible to enhance the crystallinity and increase the light extraction efficiency. Also, when the intensity difference ratio is less than 1:0.8, it is possible to mitigate a lattice mismatch between the active layer 126 and the first conductive semiconductor layer 124.

An ion intensity ratio of the third point P3 to the first point P1 (P3:P1) may range from 1:2 to 1:4. When the ion intensity ratio of the third point P3 to the first point P1 is greater than or equal to 1:2 (e.g., 1:2.1), the intensity of third point P3 is sufficiently reduced, and thus it is possible to reduce contact resistance with the second electrode. Also, when the ion intensity ratio of the third point P3 to the first point P1 is less than or equal to 1:4 (e.g., 1:3.9), the aluminum intensity of the third point P3 may increase. Accordingly, it is possible to prevent light from being absorbed at the third point P3.

An ion intensity ratio of the tenth point P10 to the first point P1 may range from 1:1.3 to 1:2.5. When the ion intensity ratio of the tenth point P10 to the first point P1 is greater than or equal to 1:1.3, the ion intensity of the first point P1 increases, and thus it is possible to effectively prevent first carriers from passing through the active layer. When the ion intensity ratio of the tenth point P10 to the first point P1 is less than or equal to 1:2.5, the ion intensity of the tenth point P10 increases, and thus it is possible for the well layer to generate ultraviolet wavelength light.

An ion intensity ratio of the third point P3 to the fourth point P4 may range from 1:1.1 to 1:2. When the ion intensity ratio of the third point P3 to the fourth point P4 is greater than or equal to 1:1.1, the ion intensity of the fourth point P4 increases, and thus it is possible to reduce the absorption rate of ultraviolet wavelength light. Also, when the ion intensity ratio of the third point P3 to the fourth point P4 is less than or equal to 1:2, the ion intensity of the third point is sufficiently secured, and thus it is possible to reduce the absorption rate of ultraviolet wavelength light.

An ion intensity ratio of the second point P2 to the first point P1 may range from 1:1.1 to 1:2. When the ion intensity ratio of the second point P2 to the first point P1 is greater than or equal to 1:1.1, the ion intensity of the first point P1 increases, and thus it is possible to effectively prevent first carriers from passing through the active layer. Also, when the ion intensity ratio of the second point P2 to the first point P1 is less than or equal to 1:2, first carriers and second carriers that are injected into the active layer and radiatively recombined with each other may be balance in concentration, and it is possible to enhance the quantity of light emitted by the semiconductor device.

An ion intensity ratio of the fourth point P4 to the second point P2 may range from 1:1.2 to 1:2.5. When the ion intensity ratio of the fourth point P4 to the second point P2 is greater than or equal to 1:1.2, it is possible to reduce resistance between the fourth point P4 and the first electrode. Also, when the ion intensity ratio of the fourth point P4 to the second point P2 is less than or equal to 1:2.5, the ion intensity of the fourth point P4 increases, and thus it is possible to reduce the absorption rate of ultraviolet wavelength light.

An ion intensity ratio of the fifth point P5 to the second point P2 may range from 1:1.1 to 1:2.0. According to an embodiment, a semiconductor structure for emitting deep-ultraviolet light may be made of a GaN-based material containing a large amount of aluminum, compared to a semiconductor structure for emitting blue light. Accordingly, the semiconductor structure for emitting deep-ultraviolet light may have a different ratio of a mobility of first carriers to a mobility of second carriers from the semiconductor structure for emitting blue light. That is, when the ion intensity ratio of the fifth point P5 to the second point P2 is greater than or equal to 1:1.1, it is possible to secure the concentration of first carriers injected into the active layer. Also, when the ion intensity ratio of the fifth point P5 to the second point P2 is less than or equal to 1:2.0, the ion intensity of the fifth point P5 increases, and thus it is possible to improve the crystallinity.

An ion intensity ratio of the fourth point P4 to the fifth point P5 may range from 1:1.1 to 1:2.0. When the ion intensity ratio of the fourth point P4 to the fifth point P5 is greater than or equal to 1:1.1, the ion intensity of the fifth point P5 increases, and thus it is possible to improve the crystallinity. Also, when the ion intensity ratio of the fourth point P4 to the fifth point P5 is less than or equal to 1:2.0, the ion intensity of the fourth point P4 increases, and thus it is possible to reduce the absorption rate of ultraviolet wavelength light.

In FIGS. 12 and 13A, the aluminum ion intensities are represented in log scale. However, the present invention is not limited thereto, and the aluminum ion intensities are represented in linear scale.

According to an embodiment, it can be seen that the first point P1 and the third point P3 are actually placed within a single order because the third point P3 contains aluminum. The order may be a level unit of the ion intensity. For example, a first order may be $1.0 \times 10^1$, and a second order may be $1.0 \times 10^2$. Also, each order may have ten sub-levels.

For example, a first sub-level of the first order may be $1.0 \times 10^1$, a second sub-level of the first order may be $2.0 \times 10^1$, a third sub-level of the first order may be $3.0 \times 10^1$, a ninth sub-level of the first order may be $9.0 \times 10^1$, and a tenth sub-level of the first order may be $1.0 \times 10^2$. That is, the tenth sub-level of the first order may be equal to the first sub-level of the second order. In FIG. 13B, dotted lines are expressed for each two sub-levels.

Figure 14A:
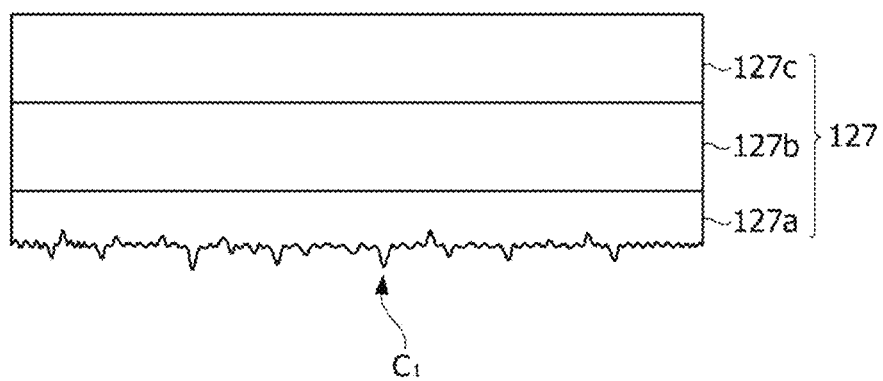
FIG. 14A is a conceptual view of a second conductive semiconductor layer according to an embodiment of the present invention.
Figure 14B:
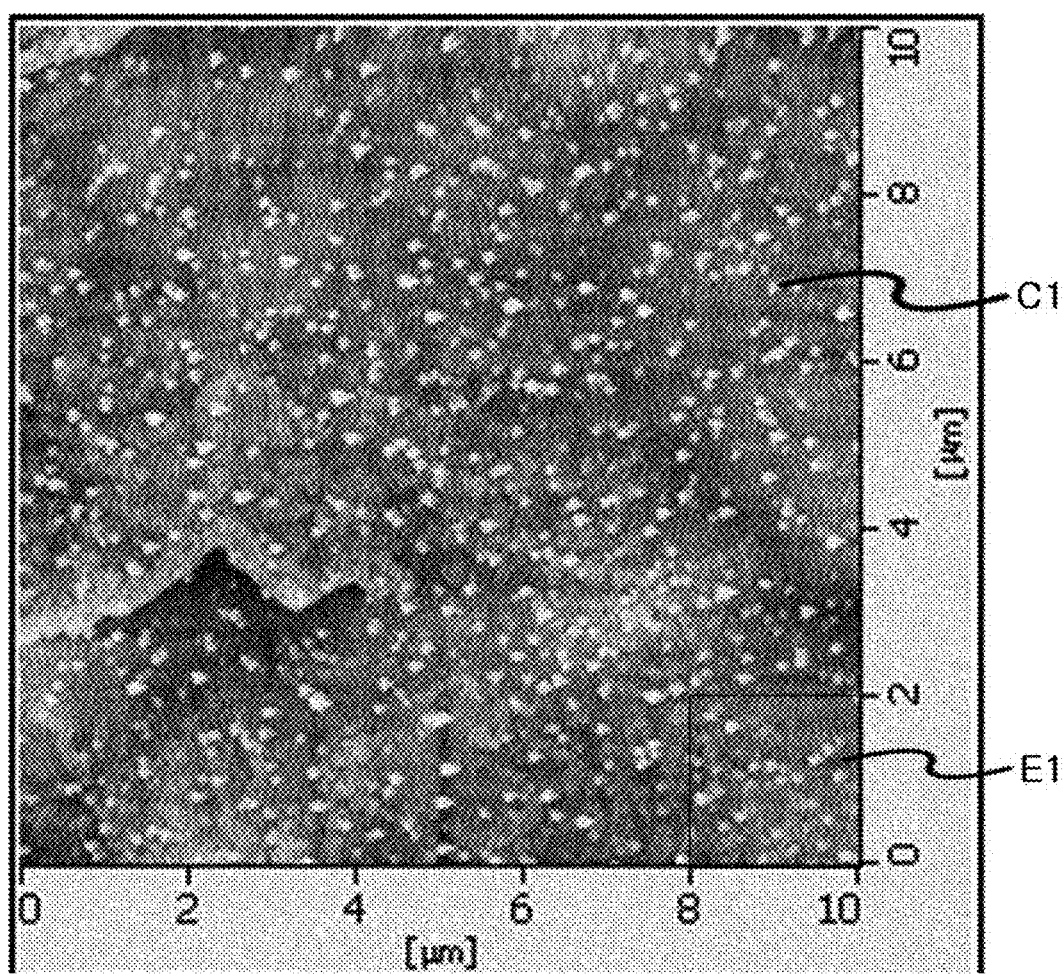
FIG. 14B shows AFM data obtained by measuring a surface of a second conductive semiconductor layer according to an embodiment of the present invention.
Figure 14C:
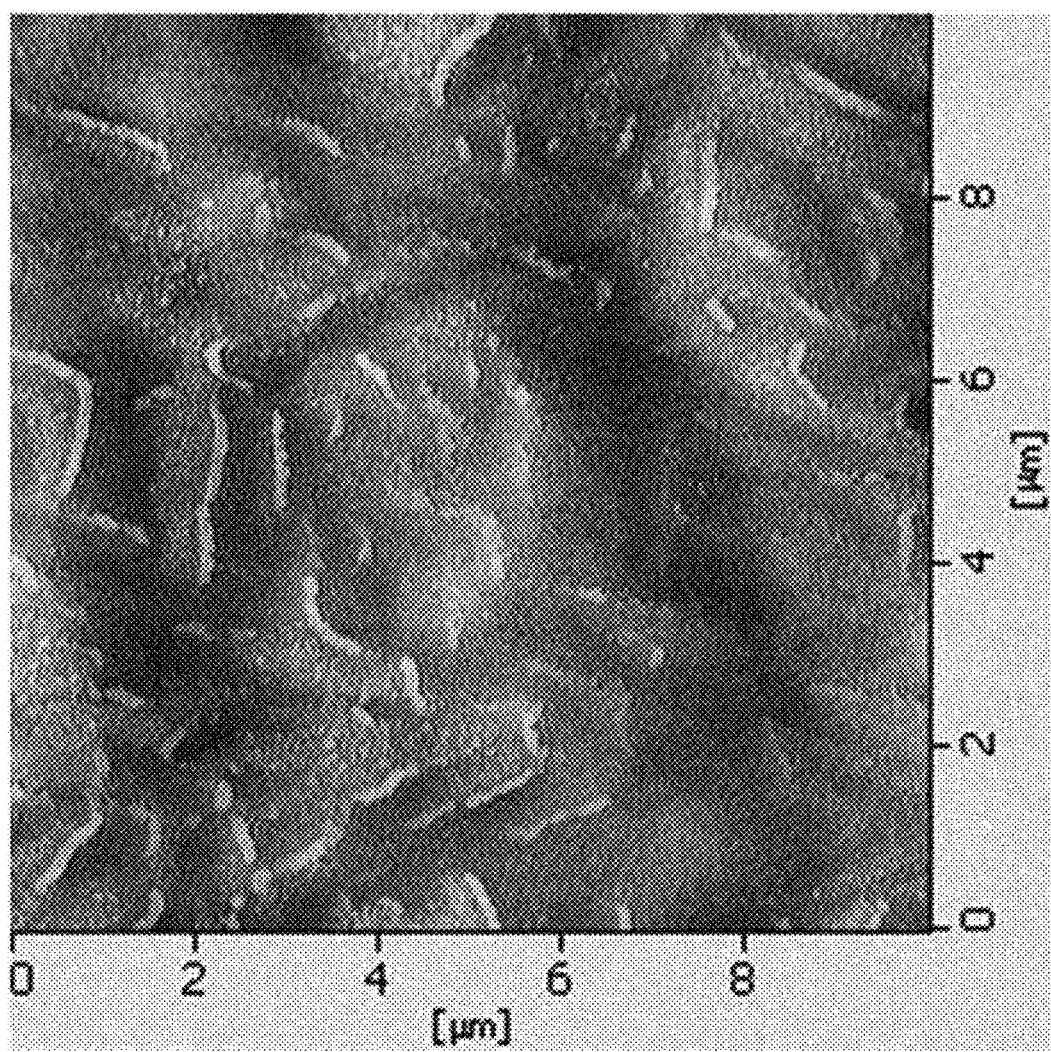
FIG. 14C shows ANF data obtained by measuring a surface of a GaN thin film.
Figure 14D:
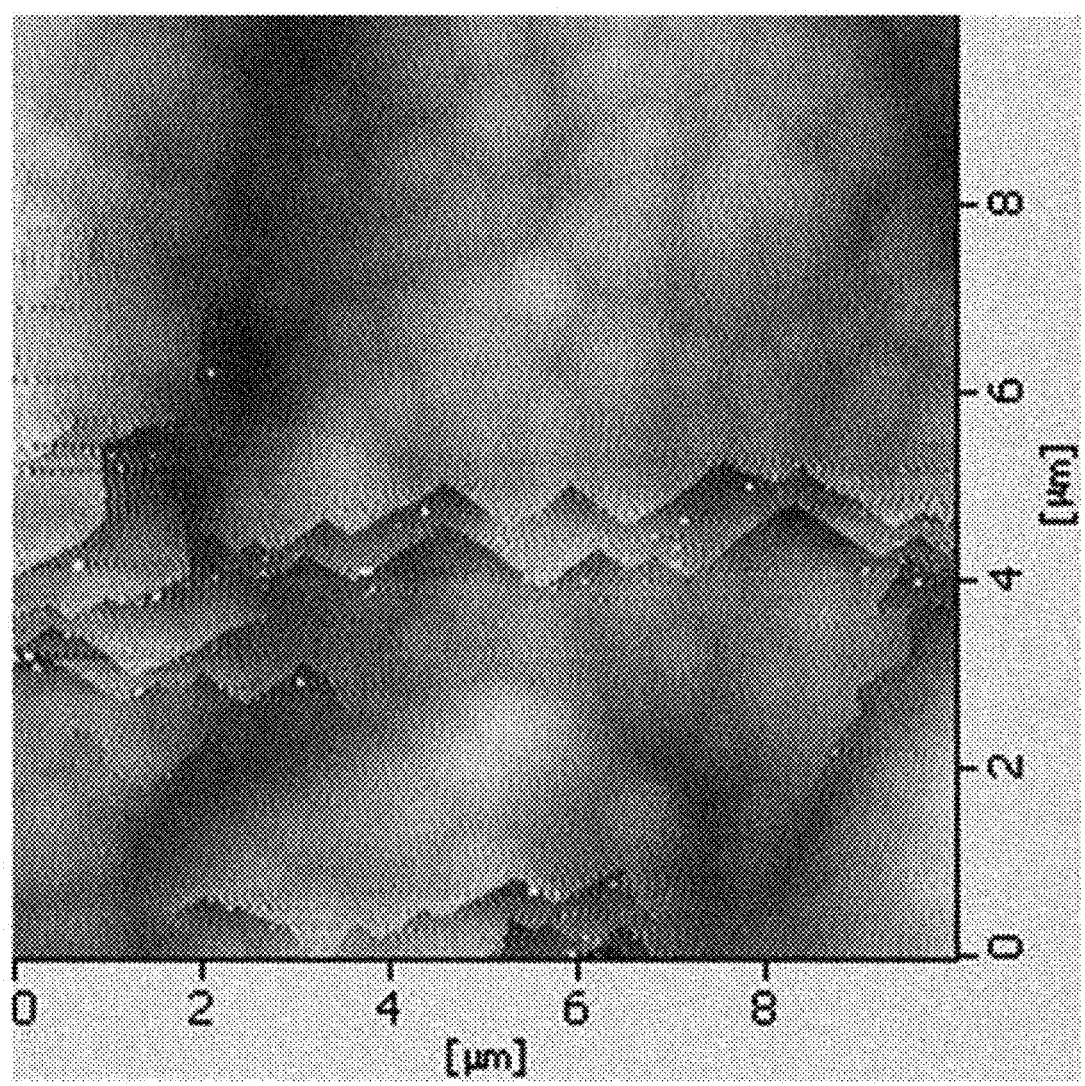
FIG. 14D shows AFM data obtained by measuring a surface of a second conductive semiconductor layer that is grown at high speed.

FIG. 14A is a conceptual diagram of a second conductive semiconductor layer according to an embodiment of the present invention, FIG. 14B shows AFM data obtained by measuring the surface of the second conductive semiconductor layer according to an embodiment of the present invention, FIG. 14C shows AFM data obtained by measuring a surface of a GaN thin film, and FIG. 14D shows AFM data obtained by measuring a surface of the second conductive semiconductor layer grown at high speed.

Referring to FIG. 14A, a second conductive semiconductor layer 127 according to an embodiment may include a 2-1 conductive semiconductor layer 127a, a 2-2 conductive semiconductor layer 127b, and a 2-3 conductive semiconductor layer 127c. The 2-1 conductive semiconductor layer 127a may be a contact layer that is in contact with a second electrode. As features of the layers, the above description may be applied as it is.

A surface of the 2-1 conductive semiconductor layer 127a may include a plurality of clusters C1. Each of the clusters C1 may be a protrusion protruding from the surface. For example, each of the clusters C1 may be a protrusion protruding more than about 10 or 20 nm from the average surface height. Each of the clusters C1 may be formed due to a lattice mismatch between aluminum (Al) and gallium (Ga).

According to an embodiment, the 2-1 conductive semiconductor layer 127a contains aluminum, has a large variation in aluminum with respect to thickness, and is thinner than other layers. Thus, the 2-1 conductive semiconductor layer 127a is formed on the surface not in the form of a single layer but in the form of clusters C1. Each of the clusters C1 may contain Al, Ga, N, Mg, or the like. However, the present invention is not limited thereto.

Referring to FIG. 14B, it can be seen that clusters C1 is formed on the surface of the second conductive semiconductor layer 127 in the shape of relatively bright dots. According to an embodiment, the 2-1 conductive semiconductor layer 127a has an aluminum composition ranging from 1% to 10%, and thus the 2-1 conductive semiconductor layer 127a may be formed in the form of clusters C1 to increase a bonding area. Accordingly, it is possible to enhance electrical characteristics.

One to eight clusters C1 may be observed per average 1 μm2 on the surface of the second conductive semiconductor layer 127. Here, the average value is the average of values measured at about 10 or more different positions. A result obtained by measuring a position E1 of FIG. 14B was that 12 clusters C1 were observed per unit area, which is 2 μm×2 μm. Only clusters C1 protruding more than 25 nm from the surface were measured. By adjusting contrast in an AFM image, it is possible to ensure that only clusters protruding more than 25 nm from the surface may be output.

The clusters C1, using converted units based on the measurement result, may have a density ranging from 1×10-8/cm2 to 8×10-6/cm2. When the density of the clusters C1 is less than 1×10-8/cm2, a contact area relatively decreases, and thus it is possible to increase contact resistance with the second electrode.

Also, when the density of the clusters C1 is greater than 8×10-6/cm2, light emitted by the active layer 126 is absorbed by Ga contained in some of the clusters, and thus it is possible to reduce optical output power.

According to an embodiment, the density of the clusters C1 may satisfy 1×10-8/cm2 to 8×10-6/cm2. Accordingly, it is possible to reduce the contact resistance with the second electrode while not reducing the optical output power.

Referring to FIG. 14C, it can be seen that no cluster was observed from the surface of the GaN thin film. This is because the GaN thin film is formed as a single layer as the density of the clusters increases. Accordingly, it can be seen that no cluster is formed on the contact surface when the GaN thin film is formed between the second conductive semiconductor layer and the second electrode.

Referring to FIG. 14D, it can be seen that clusters are not grown well when the second conductive semiconductor layer is grown at high speed. Accordingly, it can be seen that no clusters C1 are formed when the second conductive semiconductor layer is grown at high speed although the aluminum composition of the second conductive semiconductor layer is controlled to range from 1% to 10% in the surface thereof. For example, FIG. 14D is a photograph obtained by measuring the surface after P-AlGaN is grown at a speed of 0.06 nm/s.

That is, it can be seen that a surface layer should have an aluminum composition ranging from 1% to 10% and also a sufficiently low growth speed in order to form a plurality of clusters C1 in the second conductive semiconductor layer 127.

According to an embodiment, the 2-1 conductive semiconductor layer may have a lower growth speed than the 2-2 conductive semiconductor layer and the 2-3 conductive semiconductor layer. For example, a growth speed ratio of the 2-2 conductive semiconductor layer to the 2-1 conductive semiconductor layer may range from 1:0.2 to 1:0.8. When the growth speed ratio is less than 1:0.2, the growth speed of the 2-1 conductive semiconductor layer is so low that AlGaN having a high aluminum composition may be grown by etching Ga at a high temperature at which AlGaN is grown, and thus it is possible to degrade ohmic characteristics thereof. When the growth speed ratio is greater than 1:0.8, the growth speed of the 2-1 conductive semiconductor layer is so high that it is possible to reduce the crystallinity.

Figure 15:
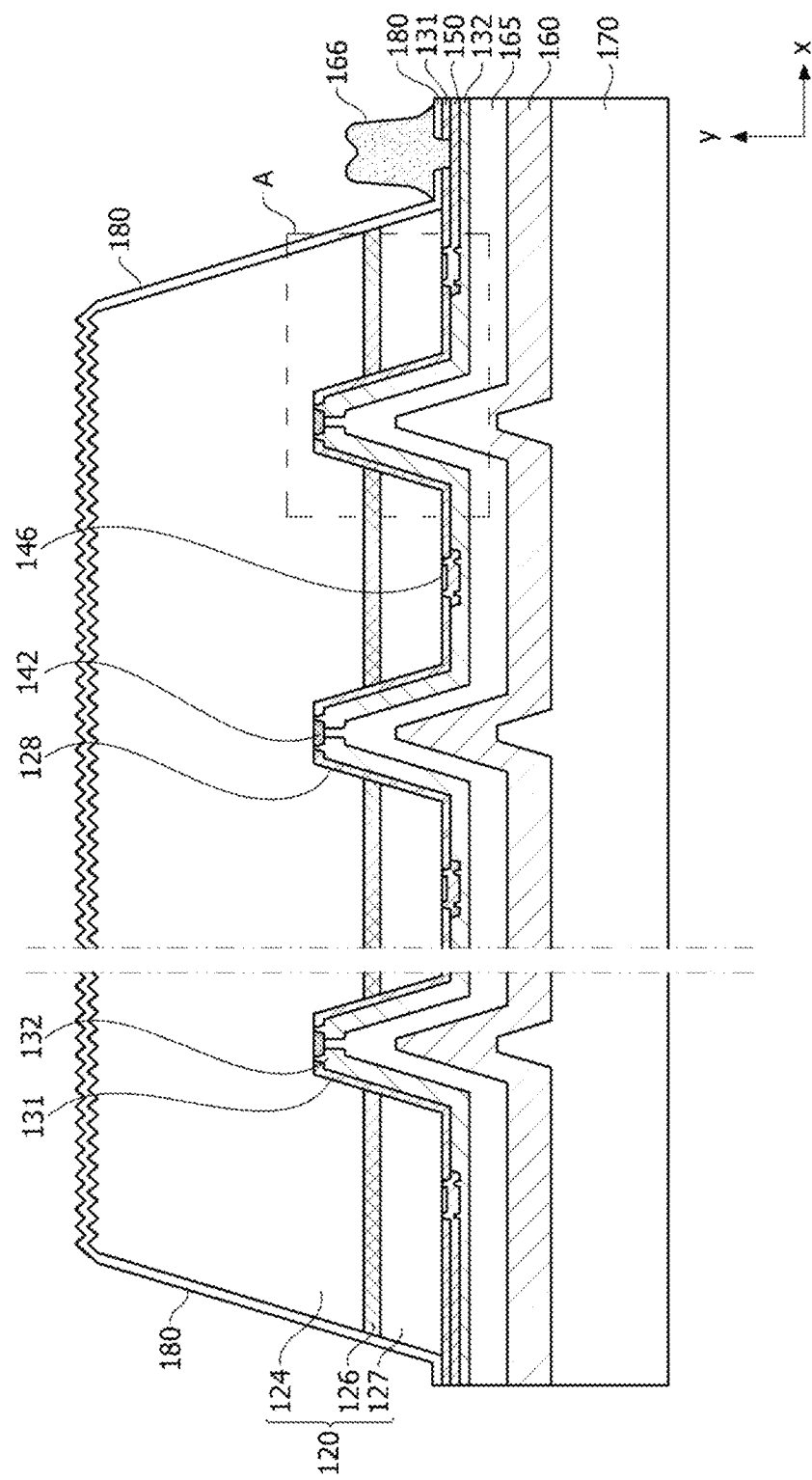
FIG. 15 is a conceptual view of a semiconductor device according to an embodiment of the present invention.
Figure 16A:
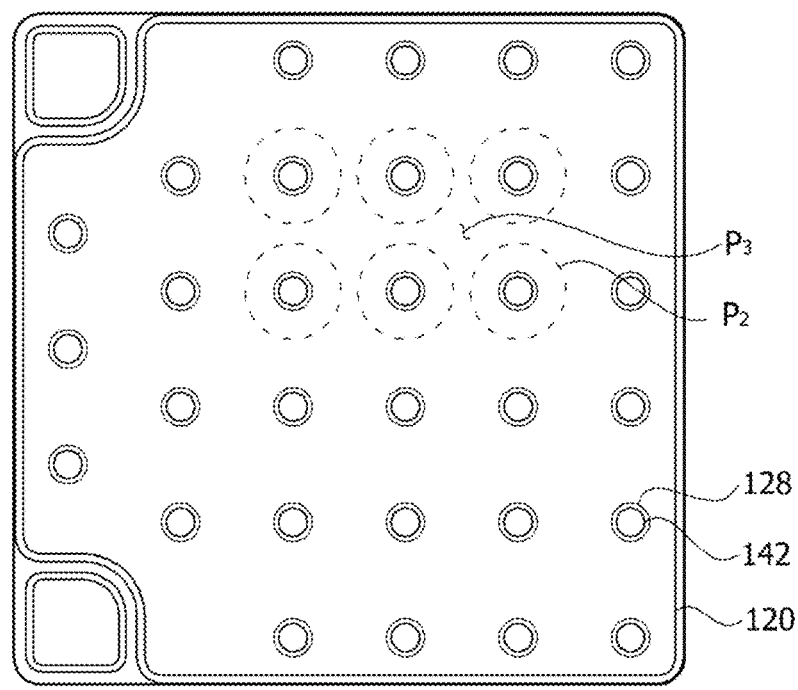
FIGS. 16A and 16B are views illustrating a configuration in which optical output power is enhanced depending on a change in number of recesses.
Figure 16B:
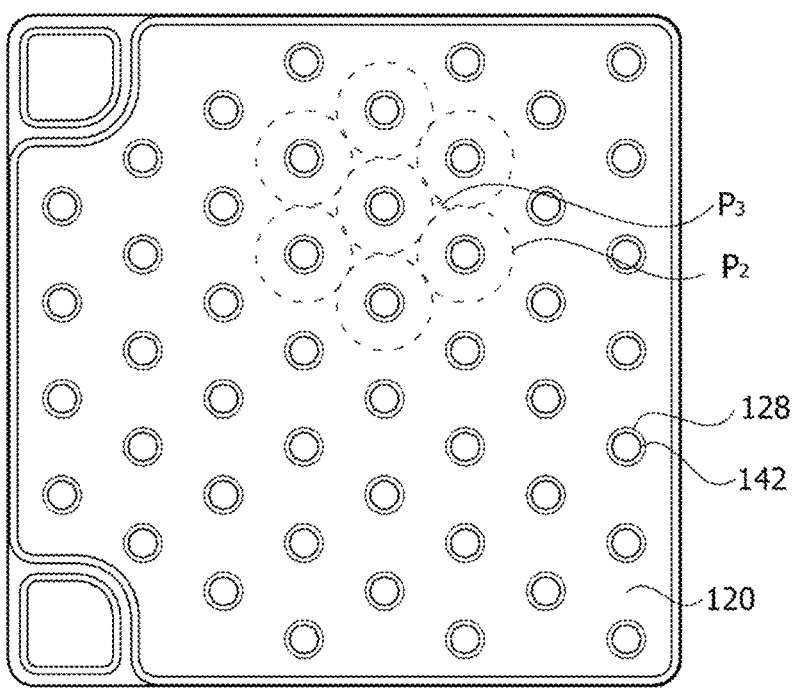
Figure 17:
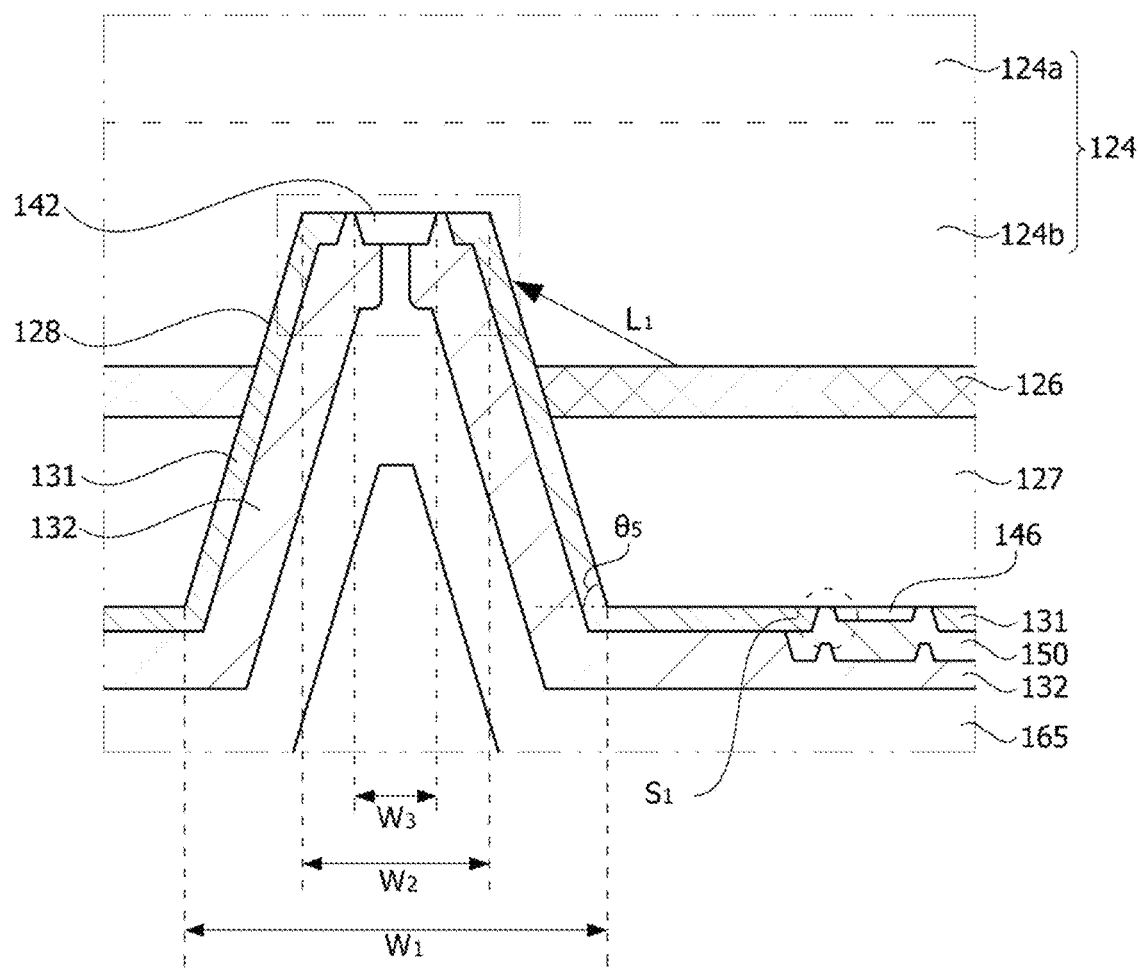
FIG. 17 is an enlarged view of a part A of FIG. 15.

FIG. 15 is a conceptual view of a semiconductor device according to an embodiment of the present invention, FIGS. 16A and 16B are views illustrating a configuration in which optical output power is enhanced depending on a change in number of recesses, and FIG. 17 is an enlarged view of a part A of FIG. 15.

Referring to FIG. 15, a semiconductor device according to an embodiment may include a semiconductor structure 120 including a first conductive semiconductor layer 124, a second conductive semiconductor layer 127, and an active layer 126, a first electrode 142 electrically connected with the first conductive semiconductor layer 124, and a second electrode 146 electrically connected with the second conductive semiconductor layer 127.

The first conductive semiconductor layer 124, the active layer 126, and the second conducive semiconductor layer 127 may be disposed in a first direction (i.e., a Y direction). Here, the first direction (i.e., the Y direction), which is a thickness direction of each layer, is defined as a vertical direction, and a second direction (i.e., the X direction) perpendicular to the first direction (i.e., the Y direction) is defined as a horizontal direction.

All of the above-described structures may be applied to the semiconductor structure 120 according to an embodiment. The semiconductor structure 120 may include a plurality of recesses 128 disposed even in a portion of the first conductive semiconductor layer 124 through the second conductive semiconductor layer 127 and the active layer 126.

The first electrode 142 may be disposed on top of the recesses 128 and electrically connected with the first conductive semiconductor layer 124. The second electrode 146 may be formed under the second conductive semiconductor layer 127.

Each of the first electrode 142 and the second electrode 146 may be an ohmic electrode. Each of the first electrode 142 and the second electrode 146 may be made of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf, but is not limited thereto. For example, the first electrode may have a plurality of metal layers (e.g., Cr, Al, and Ni), and the second electrode may be made of ITO.

Referring to FIG. 16A, when a GaN-based semiconductor structure 120 emits ultraviolet light, the GaN-based semiconductor structure 120 may contain aluminum. When the aluminum composition of the semiconductor structure 120 increases, it is possible to reduce electric current spreading characteristics in the semiconductor structure 120. Also, when the active layer 126 contains aluminum and emits ultraviolet light, the active layer 126 may have an increasing quantity of light emitted to the side, compared to a GaN-based blue light emitting device (TM mode). The TM mode may mainly occur in an ultraviolet semiconductor device.

The ultraviolet semiconductor device has reduced electric current spreading characteristics, compared to a blue GaN-based semiconductor device. Accordingly, the ultraviolet semiconductor device needs to have a relative large number of first electrodes 142 disposed therein, compared to the blue GaN-based semiconductor device.

When the aluminum composition increases, the electric current spreading characteristics may deteriorate. Referring to FIG. 16A, electric current is spread at only points adjacent to each of the first electrodes 142, and an electric current density may rapidly decrease at points far from each of the first electrodes 142. Accordingly, it is possible for an effective light emitting region P2 to become narrow.

A region up to a boundary having an electric current density of 40% or less with respect to the first electrode 142 having the highest electric current density may be defined as the effective light emitting region P2. For example, the effective light emitting region P2 may be adjusted in a range less than 40 μm from the center of each of the recesses 128 depending on the injected electric current level and the aluminum composition.

A low electric current density region P3 may have a lower electric current density and thus a smaller quantity of light than the effective light emitting region P2. Accordingly, it is possible to enhance the optical output power by placing a larger number of first electrodes 142 in the low electric current density region P3, which has a low electric current density, or by using a reflective structure.

Generally, since a GaN semiconductor layer that emits blue light has relatively good electric current spreading characteristics, it is preferable that the areas of the recesses 128 and the first electrode 142 be minimized. This is because the area of the active layer 126 decreases as the areas of the recesses 128 and the first electrode 142 increase. However, according to an embodiment, the electric current spreading characteristics are relatively low because the aluminum composition is high. Accordingly, it may be preferable to reduce the low electric current density region P3 by increasing the area and/or number of first electrodes 142 although reducing the area of the active layer 126 or to place a reflective structure in the low electric current density region P3.

Referring to FIG. 6B, when the number of recesses 128 increases to 48, the recesses 128 may be arranged in a zigzag form instead of being straightly arranged in a horizontal or vertical direction. In this case, the area of the low electric current density region C3 may be decreased, and thus most of the active layer 126 may participate in light emission.

An ultraviolet light emitting device may have reduced electric current spreading characteristics in the semiconductor structure 120. Thus, smooth injection of electric current is needed to secure uniform electric current density characteristics in the semiconductor structure 120 and secure electrical and optical characteristics and reliability of the semiconductor device. Accordingly, in order to smoothly inject electric current, a relatively large number of recesses 128 may be formed, compared to the GaN-based semiconductor structure 120, and then the first electrode 142 may be disposed on the recesses 128.

Referring to FIG. 17, a first insulation layer 131 may electrically insulate the first electrode 142 from the active layer 126 and the second conductive semiconductor layer 127. Also, the first insulation layer 131 may electrically insulate the second electrode 146 and a second conductive layer 150 from a first conductive layer 165. Also, the first insulation layer 131 may function to prevent oxidation of the side of the active layer 126 during the process for the semiconductor device.

The first insulation layer 131 may be made of at least one material selected from a group consisting of $SiO_2$, $SiOxOy$, $Si_3N_4$, $SiOxNy$, $SiOxNy$, $Al_2O_3$, $TiO_2$, and AlN, but is not limited thereto. The first insulation layer 131 may be formed in single or multiple layers. For example, the first insulation layer 131 may be a distributed Bragg reflector (DBR) having a multi-layered structure including a Si oxide or a Ti compound. However, the present invention is not limited thereto, and the first insulation layer 131 may include various reflective structures.

When the first insulation layer 131 has a reflective function, the first insulation layer 131 may upwardly reflect light emitted horizontally from the active layer 126, thereby enhancing light extraction efficiency. In this case, the light extraction efficiency may increase as the number of recesses 128 increases.

The first electrode 142 may have a diameter W3 ranging from 24 μm to 50 μm. When this range is satisfied, this is advantageous in spreading electric current, and it is possible to place a large number of first electrodes 142. When the diameter W3 of the first electrode 142 is greater than or equal to 24 μm, it is possible to sufficiently secure electric current injected into the first conductive semiconductor layer 124. When the diameter W3 of the first electrode 142 is less than or equal to 50 μm, it is possible to sufficiently secure the number of first electrodes 142 placed in the area of the first conductive semiconductor layer 124 and also secure electric current spreading characteristics.

Each of the recesses 128 may have a diameter W1 ranging from 38 μm to 60 μm. The diameter W1 of each of the recesses 128 may be defined to be the greatest area of a recess disposed under the second conductive semiconductor layer 127. The diameter W1 of each of the recesses 128 may be a diameter of a recess disposed at a bottom surface of the second conductive semiconductor layer 127.

When the diameter W1 of each of the recesses 128 is greater than or equal to 38 μm, it is possible to secure a process margin for an area in which the first electrode 142 is electrically connected with the first conductive semiconductor layer 124 while the first electrode 142 to be disposed inside each of the recesses 128 is formed. When the diameter W1 of each of the recesses 128 is less than or equal to 60 μm, it is possible to prevent reduction in the volume of the active layer 126 in order to place the first electrode 142, and thus light emitting efficiency may deteriorate.

Each of the recesses 128 may have a slope angle θ5 ranging from 70 degrees to 90 degrees. When this range is satisfied, this is advantageous in forming the first electrode 142 on top of the recesses 128, and it is possible to form a large number of recesses 128.

When the slope angle θ5 is less than 70 degrees, a removed area of the active layer 126 may increase, but an area where the first electrode 142 is to be placed may decrease. Accordingly, it is possible to reduce electric current injection characteristics and also light emitting efficiency. Accordingly, it is possible to adjust an area ratio of the first electrode 142 to the second electrode 146 by using the slope angle θ5 of each of the recesses 128.

The second electrode 146 may be thinner than the first insulation layer 131. Accordingly, it is possible to secure step coverage characteristics of the second conductive layer 150 and a second insulation layer 132 that surround the second electrode 146 and to improve reliability of the semiconductor device. The second electrode 146 may be disposed a first separation distance Si of about 1 µm to 4 µm apart from the first insulation layer 131. When the separation distance is greater than or equal to 1 µm, it is possible to secure a process margin for placing the second electrode 146 with respect to the first insulation layer 131, thus improving electrical characteristics, optical characteristics, and reliability of the semiconductor device. When the separation distance is less than or equal to 4 µm, it is possible to secure the entire area where the second electrode 146 may be placed and to improve operating voltage characteristics of the semiconductor device.

The second conductive layer 150 may cover the second electrode 146. Accordingly, a second electrode pad 166, the second conductive layer 150, and the second electrode 146 may form one electrical channel.

The second conductive layer 150 may fully surround the second electrode 146 and may be in contact with one side surface and an upper surface of the first insulation layer 131. The second conductive layer 150 may be made of a material having good adhesion to the first insulation layer 131 and made of at least one material selected from a group consisting of Cr, Al, Ti, Ni, and Au or an alloy thereof. Also, the second conductive layer 150 may be formed in single or multiple layers.

When the second conductive layer 150 is in contact with the side surface and the bottom surface of the first insulation layer 131, it is possible to enhance thermal and electrical reliability of the second electrode 146. The second conductive layer 150 may extend to a lower portion of the first insulation layer 131. In this case, it is possible to suppress detachment of an end portion of the first insulation layer 131. Accordingly, it is possible to prevent penetration of external moisture or contaminants Also, the second conductive layer 150 may have a reflective function for upwardly reflecting light emitted from a gap between the first insulation layer 131 and the second electrode 146.

The second conductive layer 150 may be disposed a first separation distance S1 between the first insulation layer 131 and the second electrode 146. That is, the second conductive layer 150 may be disposed a first separation distance S1 in contact with one side surface and an upper surface of the second electrode 146 and one side surface and an upper surface of the first insulation layer 131. Also, a region where a Schottky junction is formed by the second conductive semiconductor layer 126 coming into contact with the second conductive layer 150 may be placed within the first separation distance S1. By forming the Schottky junction, it is possible to facilitate distribution of electric current. However, the present invention is not limited thereto, and the placement may be freely performed as long as resistance between the second electrode 146 and the second conductive semiconductor layer 127 is greater than the resistance between the second conductive layer 150 and the second conductive semiconductor layer 127.

The second insulation layer 132 may electrically insulate the second electrode 146 and the second conductive layer 150 from the first conductive layer 165. The first conductive layer 165 may be electrically connected to the first electrode 142 via the second insulation layer 132. The second insulation layer 132 and the first insulation layer 131 may be made of the same material or different materials.

According to an embodiment, the second insulation layer 132 is disposed between the first electrode 142 and the second electrode 146 and over the first insulation layer 131, and thus it is possible to prevent penetration of external moisture and/or other contaminants even when a defect occurs in the first insulation layer 131.

For example, when the first insulation layer 131 and the second insulation layer 132 is formed as a single layer, a defect such as a crack may easily propagate in a thickness direction. Accordingly, external moisture or contaminants may penetrate into the semiconductor structure through the exposed defect.

However, according to an embodiment, the second insulation layer 132 is separately disposed over the first insulation layer 131, and thus it is difficult for a defect formed in the first insulation layer 131 to propagate to the second insulation layer 132. That is, an interface between the first insulation layer 131 and the second insulation layer 132 serves to block propagation of the defect.

Referring to FIG. 15 again, the second conductive layer 150 may electrically connect the second electrode with the second electrode pad 166.

The second electrode 146 may be directly disposed on the second conductive semiconductor layer 127. When the second conductive semiconductor layer 127 is made of AlGaN, holes may not be smoothly injected because of a lower electrical conductivity. Accordingly, there is a need to appropriately adjust an aluminum composition of the second conductive semiconductor layer 127. This will be described later.

The second conductive layer 150 may be made of at least one material selected from a group consisting of Cr, Al, Ti, Ni, and Au or an alloy thereof. Also, the second conductive layer 150 may be formed in single or multiple layers.

The first conductive layer 165 and a bonding layer 160 may be disposed according to the bottom surface of the semiconductor structure 120 and the shape of the recesses 128. The first conductive layer 165 may be made of a good reflective material. For example, the first conductive layer 165 may contain aluminum. When the first conductive layer 165 contains aluminum, the first conductive layer 165 may serve to upwardly reflect light that is emitted by the active layer 126 in a direction toward a substrate, thereby enhancing light extraction efficiency. However, the present invention is not limited thereto, and the first conductive layer 165 may provide a function for electrically connecting to the first electrode 142. The first conductive layer 165 may not contain a high reflective material, for example, aluminum and/or silver (Ag). In this case, a reflective metal layer (not shown) containing a high reflective material may be disposed between the first conductive layer 165 and the first electrode 142 disposed in the recess 128 and between the second conductive semiconductor layer 127 and the first conductive layer 165.

The bonding layer 160 may contain a conductive material. For example, the bonding layer 160 may contain a material selected from a group consisting of gold, tin, indium, aluminum, silicon, silver, nickel, and copper or an alloy thereof.

The substrate 170 may be made of a conductive material. For example, the substrate 170 may contain a metal or a semiconductor material. For example, the substrate 170 may be made of a metal having good electrical conductivity and/or thermal conductivity. In this case, heat generated while the semiconductor device operates may be quickly released to the outside. Also, when the substrate 170 is made of a conductive material, the first electrode 142 may receive electric current supplied from an external source through the substrate 170.

The substrate 170 may contain a material selected from a group consisting of silicon, molybdenum, tungsten, copper, and aluminum or an alloy thereof.

A passivation layer 180 may be disposed on an upper surface and one side surface of the semiconductor structure 120. The passivation layer 180 may have a thickness ranging from 200 nm to 500 nm. When the thickness is greater than or equal to 200 nm, the device may be protected from external moisture or foreign materials, and thus it is possible to improve electrical and optical reliability. When the thickness is less than or equal to 500 nm, it is possible to reduce stress applied to the semiconductor device and also to prevent an increase in cost of the semiconductor due to a reduction in optical and electrical reliability of the semiconductor device or an extension of a processing time for the semiconductor device.

A square wave pattern may be formed on an upper surface of the semiconductor structure 120. The square wave pattern may enhance extraction efficiency of light emitted from the semiconductor structure 120. The square wave pattern may have a different average height depending on ultraviolet wavelengths, and UV-C light has an average height ranging from 300 nm to 800 nm. When the average height ranges from 500 nm to 600 nm, it is possible to enhance light extraction efficiency.

Figure 18:
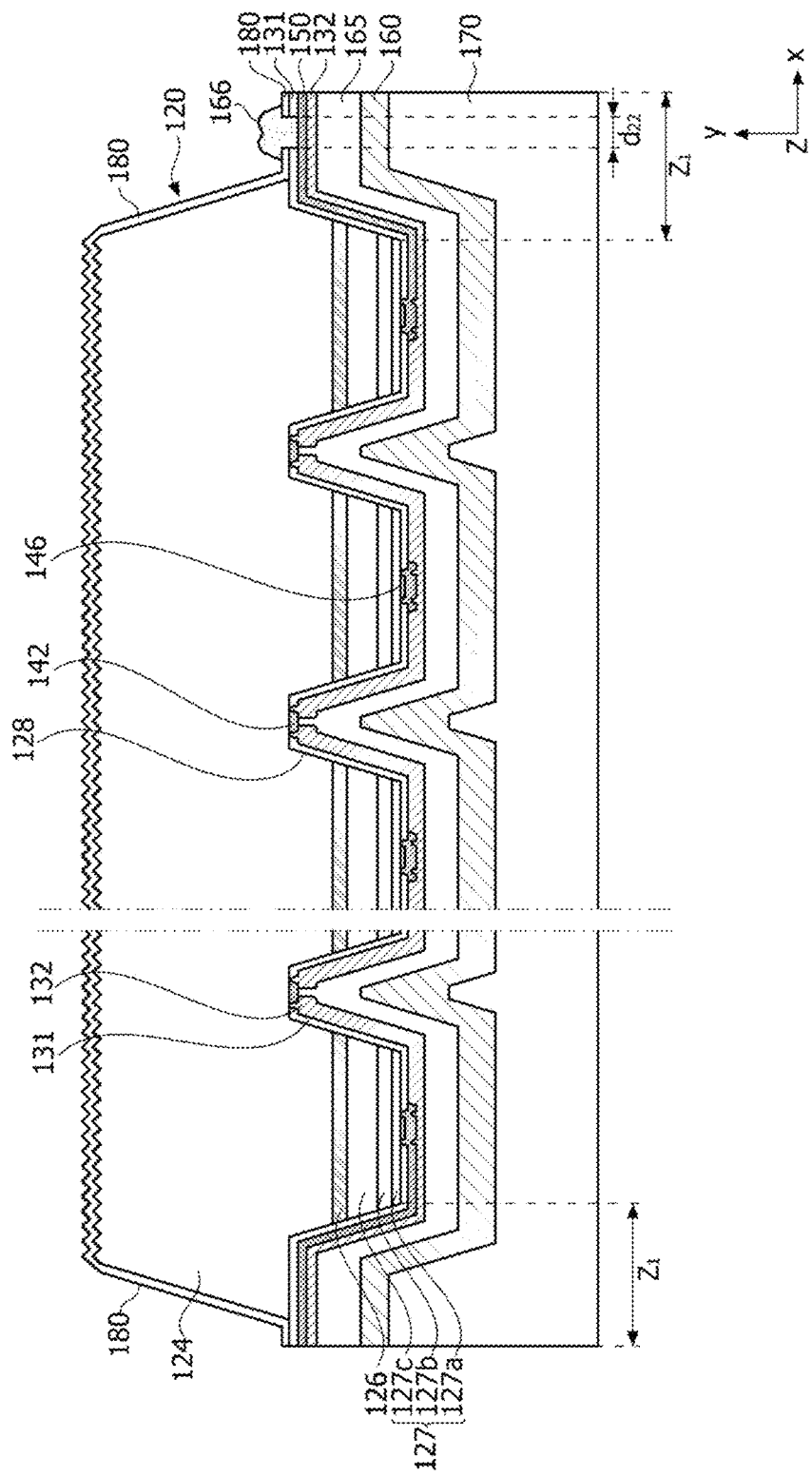
FIG. 18 is a conceptual view of a semiconductor device according to another embodiment of the present invention.
Figure 19:
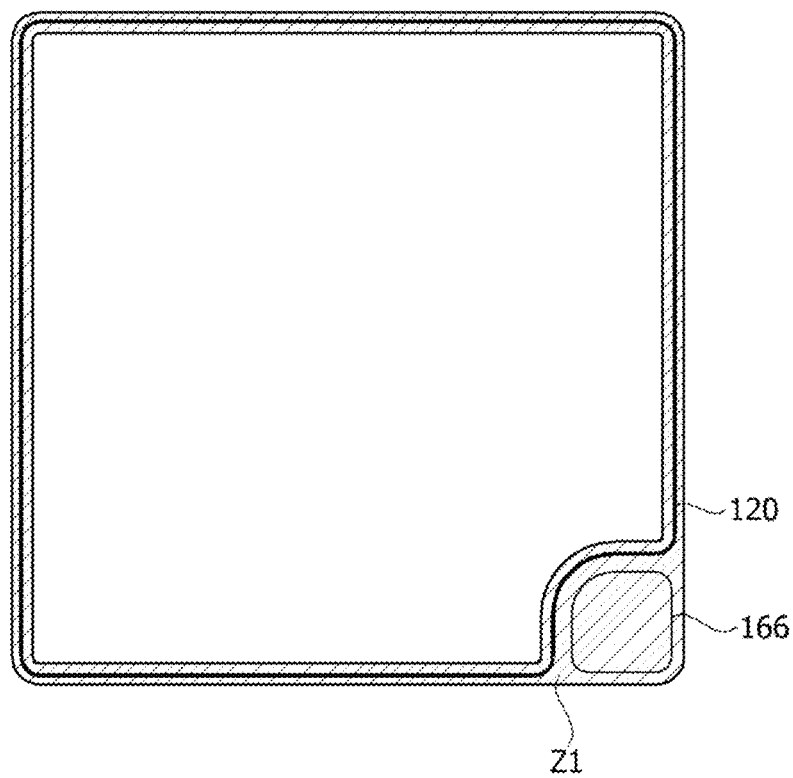
FIG. 19 is a plan view of FIG. 18.

FIG. 18 is a conceptual view of a semiconductor device according to another embodiment of the present invention, and FIG. 19 is a plan view of FIG. 18.

Referring to FIG. 18, the above-described configuration may be applied to a semiconductor structure 120 as it is. Also, a plurality of recesses 128 may be disposed even in a portion of a first conductive semiconductor layer 124 through a second conductive semiconductor layer 127 and an active layer 126.

Figure 20:
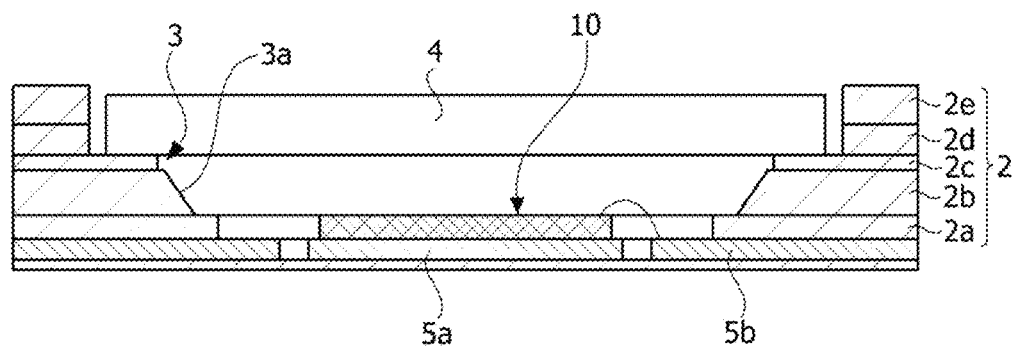
FIG. 20 is a conceptual view of a semiconductor device package according to an embodiment of the present invention.

The semiconductor device may include a side reflector Z1 disposed on an edge thereof. The side reflector Z1 may be formed by a second conductive layer 150, a first conductive layer 165, and a substrate 170 protruding in a thickness direction (a Y axis direction). Referring to FIG. 20, the side reflector Z1 may be disposed along the edge of the semiconductor device to surround the semiconductor structure 120.

The second conductive layer 150 of the side reflector Z1 protrudes further than the active layer 126 so that the second conductive layer 150 may upwardly reflect light emitted by the active layer 126. Accordingly, without a separate reflective layer being formed, it is possible to upwardly reflect light emitted in a horizontal direction (an X axis direction) at an outermost portion thereof because of the TM mode.

The side reflector Z1 may have a slope angle greater than 90 degrees and less than 145 degrees. The slope angle may be an angle of the second conductive layer 150 with respect to a horizontal plane (i.e., an XZ plane). When the angle is less than 90 degrees or greater than 145 degrees, it is possible for there to be a reduction in efficiency with which light traveling toward the side is reflected upward.

Figure 21:
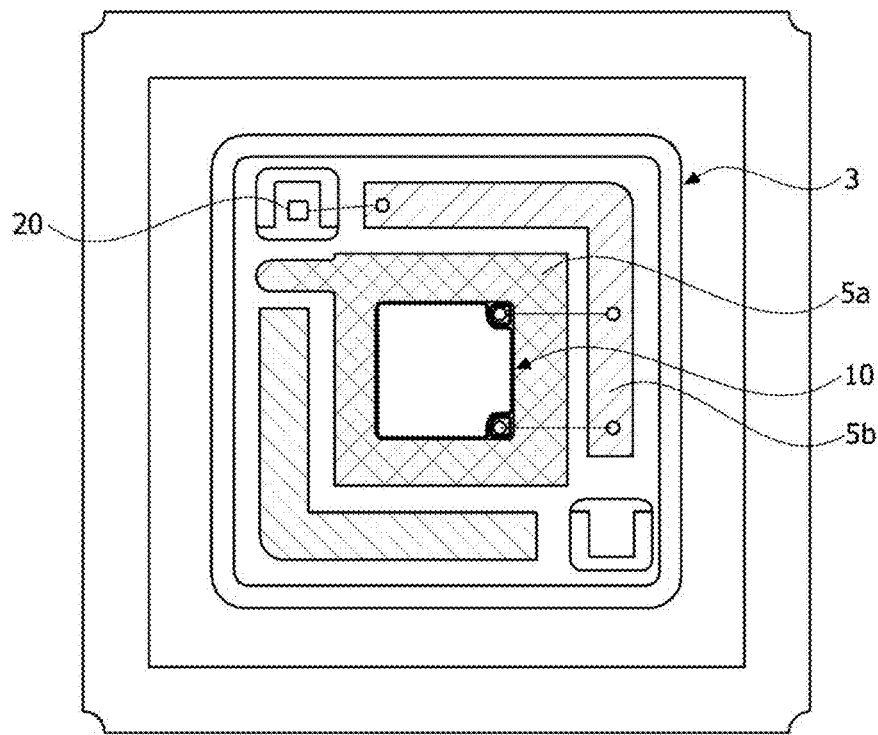
FIG. 21 is a plan view of a semiconductor device package according to an embodiment of the present invention.
Figure 22:
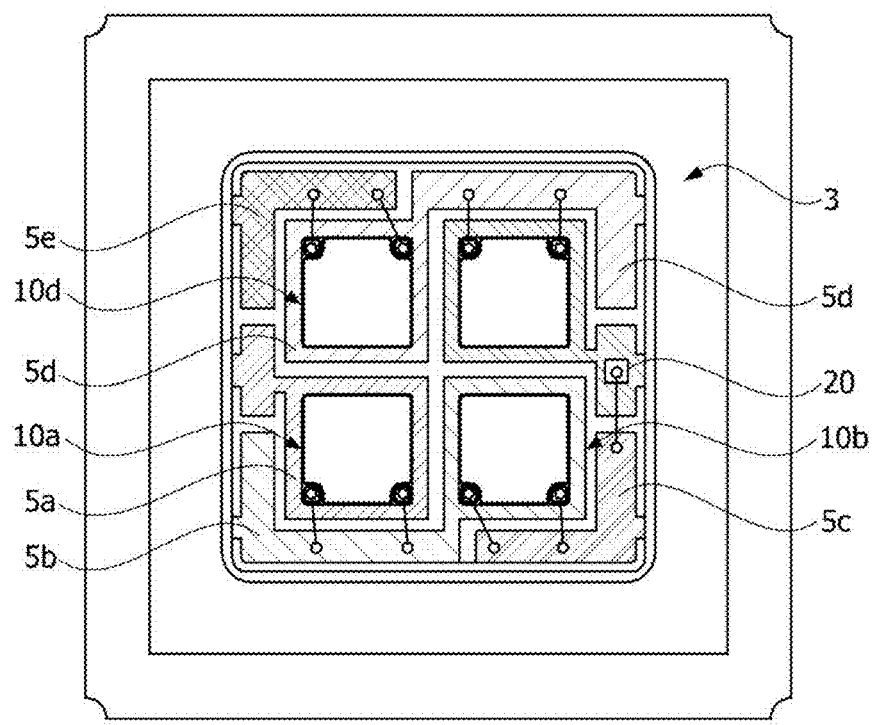
FIG. 22 is a modification of FIG. 21.
Figure 23:
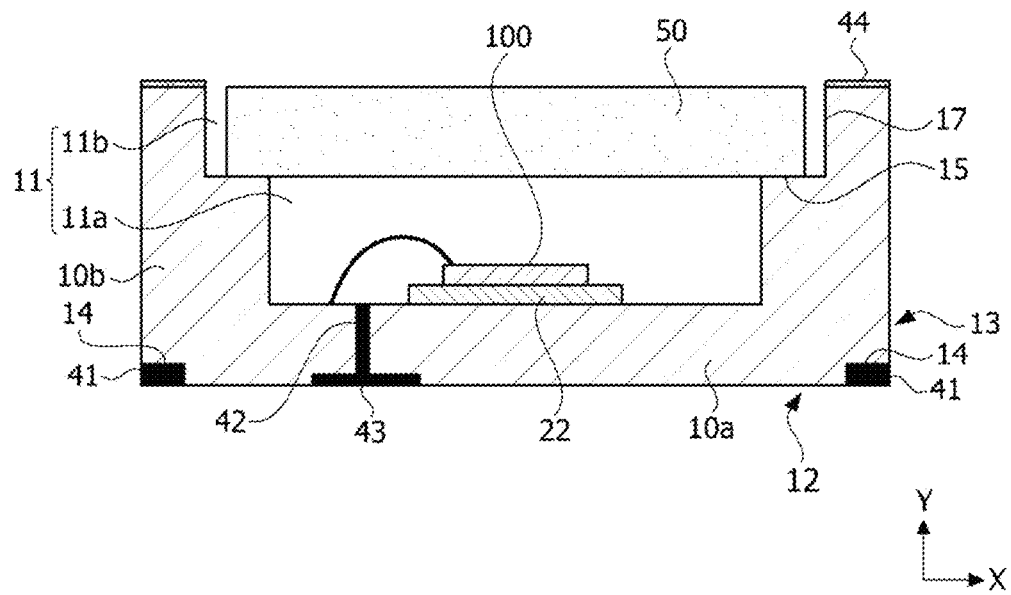
FIG. 23 is a sectional view of a semiconductor device package according to another embodiment of the present invention.

FIG. 20 is a conceptual view of a semiconductor device package according to an embodiment of the present invention, FIG. 21 is a plan view of a semiconductor device package according to an embodiment of the present invention, FIG. 22 is a modification of FIG. 21, and FIG. 23 is a sectional view of a semiconductor device package according to another embodiment of the present invention.

Referring to FIG. 20, the semiconductor device package may include a body 2 having a groove (i.e., an opening) 3, a semiconductor device 1 disposed in the body 2, and a pair of lead frames 5a and 5b disposed in the body 2 and electrically connected to the semiconductor device 1. The semiconductor device 1 may include all of the above-described elements.

The body 2 may include an ultraviolet light reflective material or a coating layer. The body 2 may be formed by stacking a plurality of layers 2a, 2b, 2c, 2d, and 2e. The plurality of layers 2a, 2b, 2c, 2d, and 2e may be made of the same material or contain different materials. For example, the plurality of layers 2a, 2b, 2c, 2d, and 2e may contain aluminum.

The groove 3 may have a width increasing away from the semiconductor device and an inclined surface having a stepped portion 3a formed therein.

A light transmitting layer 4 may cover the groove 3. The light transmitting layer 4 may be made of glass, but is not limited thereto. There is no limitation in material of the light transmitting layer 4 as long as the material can effectively transmit ultraviolet light. The groove 3 may have an empty space formed therein.

Referring to FIG. 21, a semiconductor device 10 may be disposed on a first lead frame 5a and connected with a second lead frame 5b by wires. In this case, the second lead frame 5b may be disposed to surround side surfaces of the first lead frame 5a.

Referring to FIG. 22, the semiconductor device package may have a plurality of semiconductor devices 10a, 10b, 10c, and 10d disposed therein. In this case, the lead frame may include a first lead frame 5a, a second lead frame 5b, a third lead frame 5c, a fourth lead frame 5d, and a fifth lead frame 5e.

The first semiconductor device 10a may be disposed on the first lead frame 5a and connected with the second lead frame 5b by wires. The second semiconductor device 10b may be disposed on the second lead frame 5b and connected with the third lead frame 5c by wires. The third semiconductor device 10c may be disposed on the third lead frame 5c and connected with the fourth lead frame 5d by wires. The fourth semiconductor device 10d may be disposed on the fourth lead frame 5d and connected with the fifth lead frame 5e by wires.

Referring to FIG. 23, the semiconductor device package may include a body 10 including a cavity 11, a semiconductor device 100 disposed inside the cavity 11, and a light transmitting member 50 disposed on the cavity 11.

The body 10 may be produced by processing an aluminum substrate. Accordingly, the body 10 according to an embodiment may have an inner surface and an outer surface, both of which have conductivity. Such a structure may have various benefits. When a non-conductive material such as AlN and $Al_2O_3$ is used for the body 10, a reflectivity for an ultraviolet wavelength band just ranges from 20% to 40%. Accordingly, there is a need to place a separate reflective member. Also, a separate circuit pattern and conductive member such as a lead frame may be needed. Accordingly, it is possible to increase a production cost and complicate a process. Also, a conductive member such as gold (Au) absorbs ultraviolet light, and thus there is a reduction in light extraction efficiency.

However, according to an embodiment, the body 10 itself is made of aluminum, and thus a separate reflective member may be omitted due to high reflectivity in an ultraviolet wavelength band. Also, the body 10 itself is conductive, and thus a separate circuit pattern and lead frame may be omitted. Also, since the body 10 is made of aluminum, the body 10 may have a good thermal conductivity ranging from 140 W/m·k to 160 W/m·k. Accordingly, it is possible to enhance heat emission efficiency.

The body 10 may include a first conductive part 10a and a second conductive part 10b. A first insulation part 42 may be disposed between the first conductive part 10a and the second conductive part 10b. Since both of the first conductive part 10a and the second conductive part 10 b are conductive, the first insulation part 42 needs to be disposed in order to separate magnetic poles.

The body 10 may include a groove 14 disposed at an edge between a lower surface 12 and a side surface 13 and a second insulation part 41 disposed on the groove 14. The groove 14 may be disposed along the edge between the lower surface 12 and the side surface 13.

The second insulation part 41 may be made of the same material as that of the first insulation part 42, but is not limited thereto. Each of the first insulation part 42 and the second insulation part 41 may be made of a material selected from among epoxy mold compounds (EMC), white silicon, photoimageable solder resist (PSR), silicon resin compositions, modified epoxy resin compositions such as a silicon-modified epoxy resin, modified silicon resin compositions such as an epoxy-modified silicon resin, polyimide resin compositions, modified polyimide resin compositions, polyphthalamide (PPA), polycarbonate resins, polyphenylene sulfide (PPS), liquid crystal polymers (LCP), acrylonitrile butadiene styrene (ABS) resins, phenolic resins, acrylic resins, and polybutylene terephthalate PBT resins.

According to an embodiment, the second insulation part 41 is disposed at a lower edge of the body 10, and thus it is possible to prevent a burr from occurring at the edge when the package is cut. A burr may more frequently occur in an aluminum substrate than in other metal substrates. When a burr has occurred, the lower surface 12 may not be flat, causing a bad mounting. Also, when a burr has occurred, the thickness may become non-uniform and a measurement error may occur.

A third insulation part 43 may be disposed on the lower surface 12 of the body 10 and connected with the second insulation part 41 and the first insulation part 42. According to an embodiment, the lower surface 12 of the body 10, a lower surface of the second insulation part 41, and a lower surface of the third insulation part 43 may be disposed on the same plane.

Figure 24:
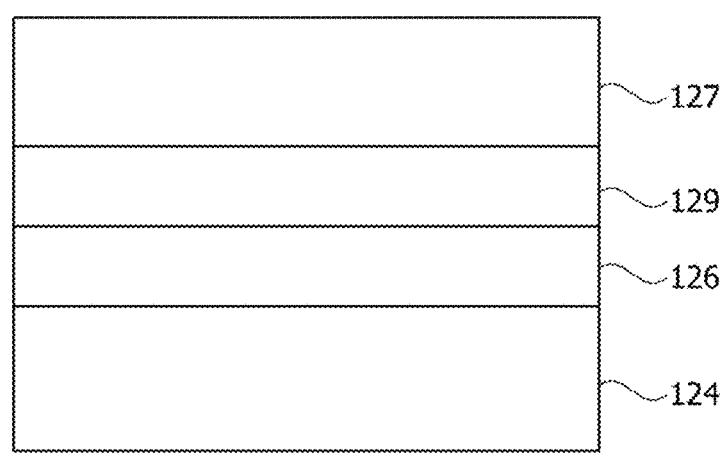
FIG. 24 is a conceptual view of a light emitting structure according to an embodiment of the present invention.
Figure 25:
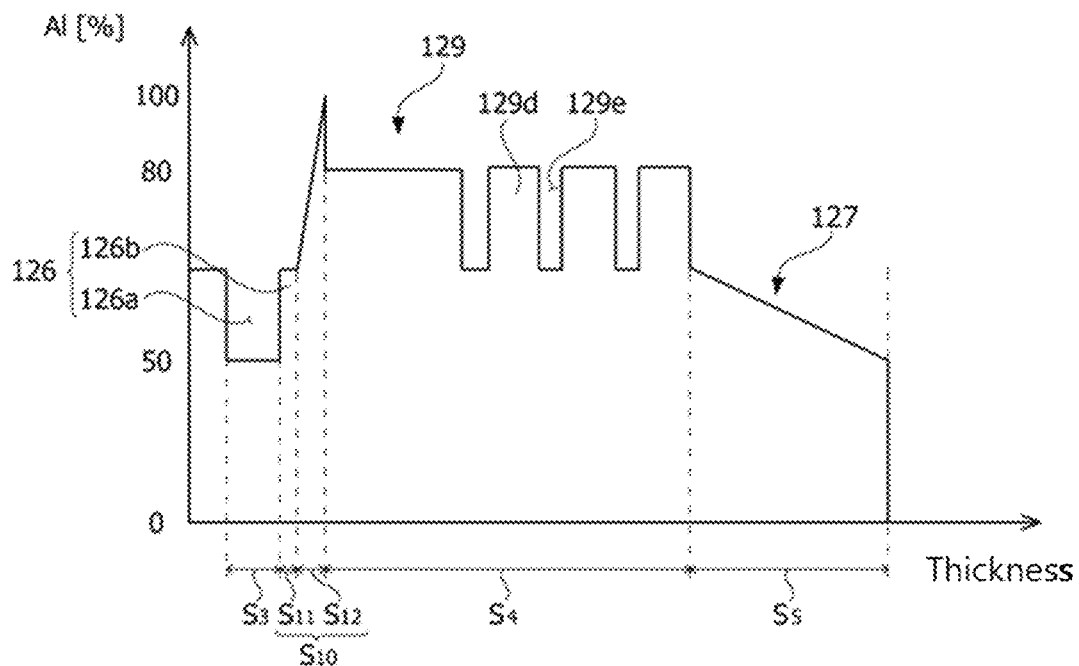
FIG. 25 is a graph showing an aluminum composition of a light emitting structure according to an embodiment of the present invention.

FIG. 24 is a conceptual diagram of a light emitting structure according to an embodiment of the present invention, and FIG. 25 is a graph showing the aluminum composition of the semiconductor structure according to an embodiment of the present invention.

Referring to FIG. 24, a semiconductor device according to an embodiment includes a light emitting structure 120A including a first conductive semiconductor layer 124, a second conductive semiconductor layer 127, and an active layer 126. Each semiconductor layer may have the same configuration as the structure described with respect to FIG. 1.

Referring to FIG. 25, the first conductive semiconductor layer 124, the active layer 126, a blocking layer 129, and the second conductive semiconductor layer 127 may all contain aluminum.

Accordingly, the first conductive semiconductor layer 124, the active layer 126, the blocking layer 129, and the second conductive semiconductor 127 may be made of AlGaN. However, the present invention is not limited thereto. Some of the layers may be made of GaN or AlN.

The active layer 126 may include a plurality of well layers 126a and a plurality of barrier layers 126b, which are alternately disposed therein. Each of the well layers 126a may have an aluminum composition ranging from about 30% to about 50% in order to emit ultraviolet light. Each of the barrier layers 127b may have an aluminum composition ranging from 50% to 70% in order to trap carriers.

For example, a well layer closest to the blocking layer 129 among the well layers 126a is defined as a first well layer 126a, and the last barrier layer disposed between the first well layer 126a and the blocking layer 129 is defined as a first barrier layer 126b.

The blocking layer 129 may have an aluminum composition ranging from 50% to 90%. The blocking layer 129 may have a plurality of first blocking layers 129d having a relatively high aluminum composition and a plurality of second layers 129a having a relatively low aluminum composition, which are alternately disposed therein. When the aluminum composition of the blocking layer 129 is less than 50%, an energy barrier for blocking electrons may be insufficient in height, and the blocking layer 129 may absorb light emitted from the active layer 126. When the aluminum composition of the blocking layer 129 is greater than 90%, the electrical characteristics of the semiconductor device may deteriorate.

Each of the first blocking layers 129d may have an aluminum composition ranging from 70% to 90%, and each of the second blocking layers 129e may have an aluminum composition ranging from 50% to 70%. However, the present invention is not limited thereto, and the aluminum compositions of each first blocking layer 129d and each second blocking layer 129e may be appropriately adjusted.

A first intermediate layer S10 may be disposed between the blocking layer 129 and the first well layer 126a of the active layer 126. The first intermediate layer S10 may include a 3-1 section S11 having an aluminum composition lower than the blocking layer 129 and a 3-2 section S12 having an aluminum composition higher than the blocking layer 129.

The first intermediate layer S10 may be the first barrier layer 126b. Accordingly, the first intermediate layer S10 may have the same thickness as an adjacent barrier layer 126b. For example, the first intermediate layer S10 may have a thickness ranging from 2 nm to 10 nm. However, the present invention is not limited thereto, and the first intermediate layer S10 may be a portion of the blocking layer 129 or a separate semiconductor layer disposed between the first barrier layer 126b and the blocking layer.

The 3-1 section S11 may have an aluminum composition ranging from 50% to 70%. That is, the 3-1 section S11 may be substantially the same aluminum composition as an adjacent barrier layer 126b. The 3-1 section S11 may have a thickness ranging from about 1 nm to about 8 nm. When the thickness of the 3-1 section is less than or equal to 1 nm, the aluminum composition of the well layer 126a rapidly increases, and thus it may be difficult to prevent a reduction of the crystallinity. Also, when the thickness of the 3-1 section S11 is greater than 8 nm, it is possible to reduce injection efficiency of holes injected into the active layer 126 and thus reduce optical characteristics.

The 3-2 section S12 may have a higher aluminum composition than the blocking layer 129. The 3-2 section S12 may have an aluminum composition increasing toward the blocking layer 129. The aluminum composition of the 3-2 section S12 may range from 80% to 100%. That is, the 3-2 section S12 may be made of AlGaN or AlN. Alternatively, the 3-2 section S12 may be a superlattice layer in which AlGaN and AlN are alternately disposed.

The 3-2 section S12 may be thinner than the 3-1 section S11. The 3-2 section S12 may have a thickness ranging from about 0.1 nm to about 4 nm. When the thickness of the 3-2 section S12 is less than 0.1 nm, it may not be possible to block the movement of electrons. When the 3-2 section S12 has a thickness greater than 4 nm, it is possible to reduce an efficiency with which holes are injected into the active layer.

A thickness ratio of the 3-1 section S11 to the 3-2 section S12 may range from 10:1 to 1:1. When the condition is satisfied, it is possible to reduce the hole injection efficiency while blocking the movement of electrons.

The 3-2 section S12 may include an undoped section. Although the 3-2 section S12 is grown without dopants supplied thereto, Mg of the blocking layer 129 may spread to a portion of the first section. However, in order to prevent spreading of dopants to the active layer 126, at least some regions of the 3-2 section S12 may include an undoped section.

Figure 26:
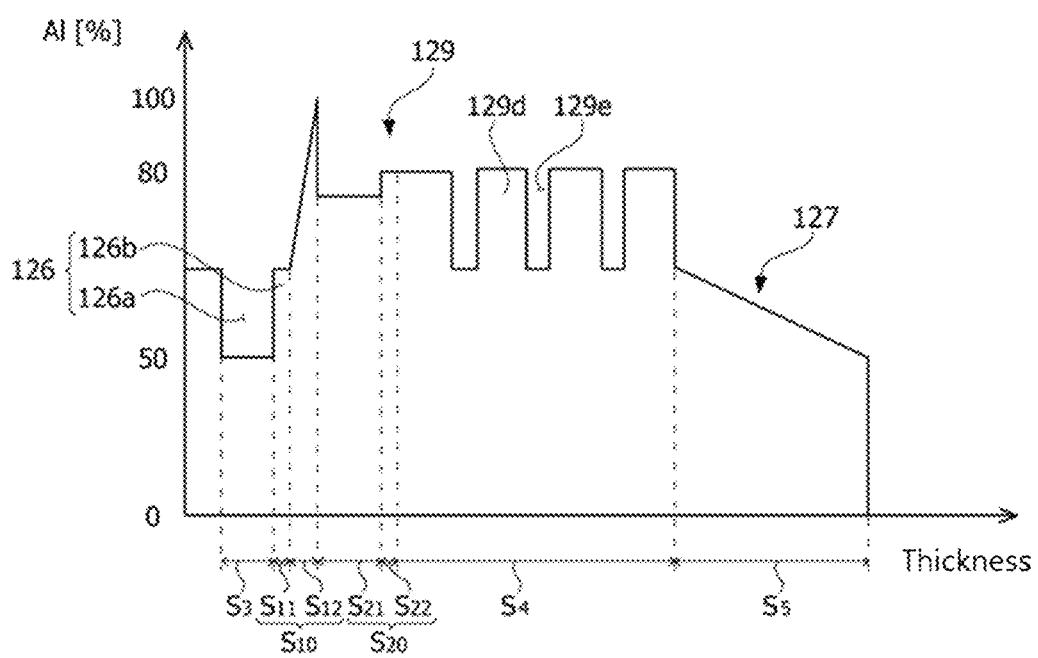
FIG. 26 is a graph showing an aluminum composition of a light emitting structure according to another embodiment of the present invention.
Figure 27:
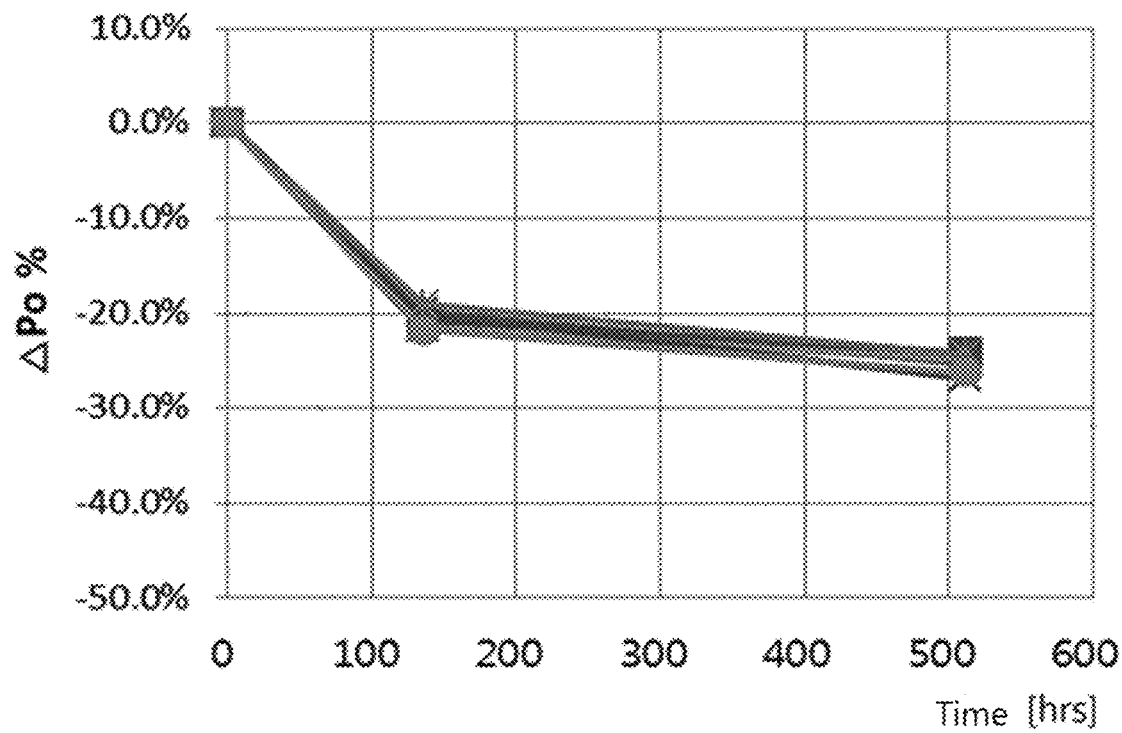
FIG. 27 is a graph obtained by measuring light efficiency of a semiconductor device including a conventional light emitting structure.
Figure 28:
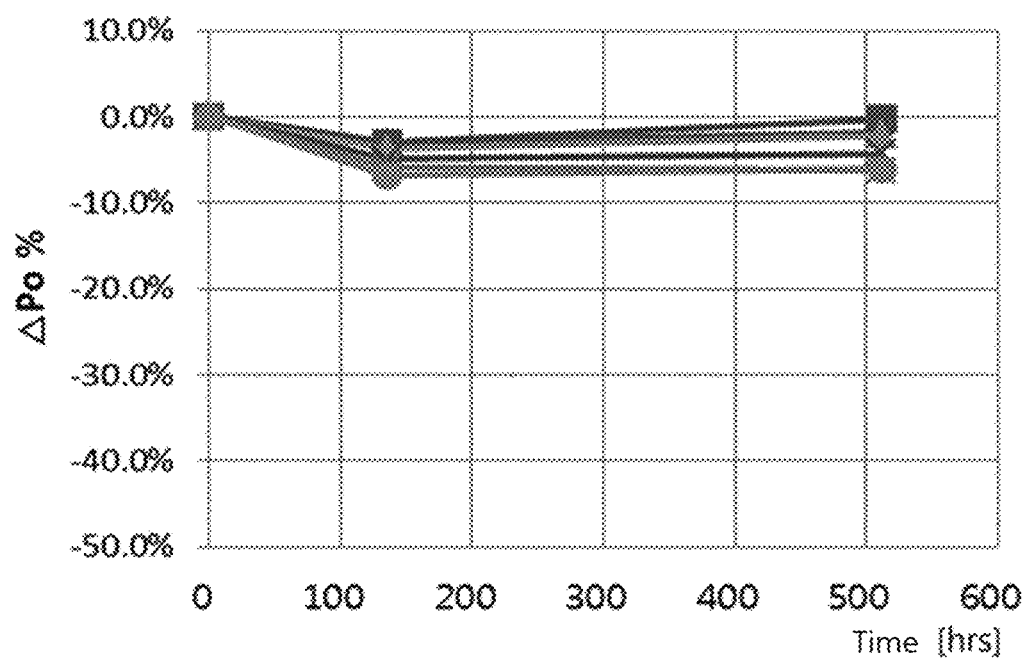
FIG. 28 is a graph obtained by measuring light efficiency of a light emitting structure according to another embodiment of the present invention.

FIG. 26 is a graph showing an aluminum composition of a light emitting structure according to another embodiment of the present invention, FIG. 27 is a graph obtained by measuring optical output power of a semiconductor device including a conventional light emitting structure, and FIG. 28 is a graph obtained by measuring optical output power of a light emitting structure according to another embodiment of the present invention.

Referring to FIG. 26, the structure that has been described with reference to FIG. 25 may be applied as it is, except for a second intermediate layer S20. The second intermediate layer S20 may be a part of the blocking layer 129, but is not limited thereto.

The second intermediate layer S20 may have a lower aluminum composition than the blocking layer 129 and may have a higher aluminum composition than the 3-1 section S11. For example, the aluminum composition of the second intermediate layer S20 may range from 50% to 80%.

The second intermediate layer S20 may include a 4-1 section S21 that does not contain a p-type dopant and a 4-2 section S22 that contains a p-type dopant.

The 4-1 section S21 may include an undoped section. Accordingly, it is possible to suppress spreading of dopants to the active layer 126 when the blocking layer 129 is grown. The 4-1 section S21 may have a thickness ranging from 4 nm to 19 nm. When the thickness of the 4-1 section S21 is less than 4 nm, it is possible to suppress spreading of dopants. When the thickness of the 4-1 section S21 is greater than 19 nm, it is possible to reduce the hole injection efficiency.

The 4-2 section S22 may contain a p-type dopant. The 4-2 section S22 contains a dopant, and it is possible to improve efficiency with which holes are injected into the 4-1 section S21. That is, the 4-2 section S22 may serve as a low-resistance layer for reducing a resistance level.

The 4-2 section S22 may have a thickness ranging from 1 nm to 6 nm. When the thickness is less than 1 nm, it is difficult to effectively reduce resistance. When the thickness is greater than 6 nm, the thickness of the 4-1 section S21 is reduced, and it may be difficult to suppress spreading of dopants. A ratio of the thickness of the 4-1 section S21 to the thickness of the 4-2 section S22 may range from 19:1 to 1:1.5.

However, the present invention is not limited thereto, and the second intermediate layer S20 may have a superlattice structure in which the 4-1 section S21 and the 4-2 section S22 are alternately disposed.

Referring to FIG. 27, it can be seen that a semiconductor device having a conventional light emitting structure has optical output power reduced by 20% when about 100 hours pass. Also, it can be seen that the optical output power is reduced by 25% when about 500 hours pass.

On the other hand, referring to FIG. 28, it can be seen that a semiconductor device having the light emitting structure according to an embodiment has a luminous intensity reduced by about 3.5% when 100 hours pass and has almost the same optical output power even when about 500 hours pass. That is, it can be seen than optical output power is enhanced by about 20% without an intermediate layer according to an embodiment, compared to a conventional structure.

Figure 29:
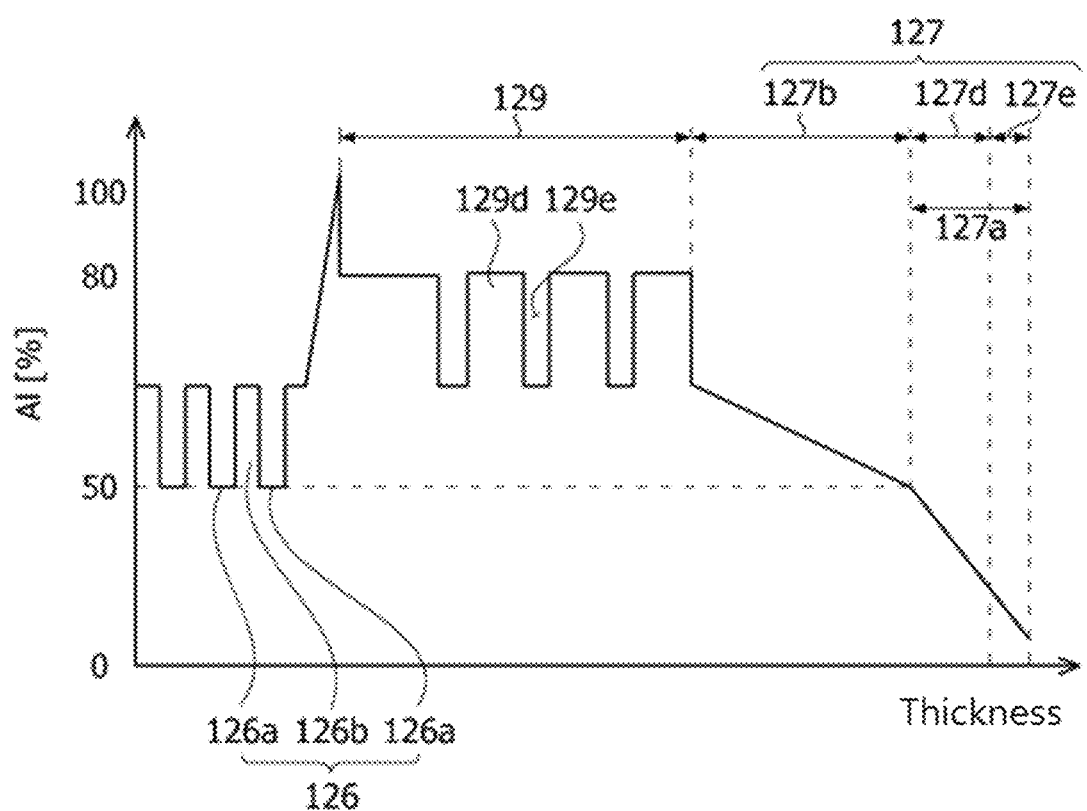
FIG. 29 is a graph showing an aluminum composition of a light emitting structure according to still another embodiment of the present invention.

FIG. 29 is a graph showing an aluminum composition of a light emitting structure according to still another embodiment of the present invention.

Referring to FIG. 29, the second conductive semiconductor layer 129 may include a 2-1 conductive semiconductor layer 129a and a 2-2 conductive semiconductor layer 129b.

The 2-1 conductive semiconductor layer 127a may have a thickness greater than 10 nm and less than 200 nm. When the thickness of the 2-1 conductive semiconductor layer 127a is less than 10 nm, resistance increases in a horizontal direction, and thus it is possible to reduce electric current injection efficiency. When the thickness of the 2-1 conductive semiconductor layer 127a is greater than 200 nm, resistance increases in a vertical direction, and thus it is possible to reduce electric current injection efficiency.

The 2-1 conductive semiconductor layer 127a may have a higher aluminum composition than the well layer 126a. In order to generate ultraviolet light, the aluminum composition of the well layer 126a may range from about 30% to about 50%. When the 2-1 conductive semiconductor layer 127a has a lower aluminum composition than the well layer 126a, the 2-1 conductive semiconductor layer 127a absorbs light, and thus it is possible to reduce light extraction efficiency.

The 2-1 conductive semiconductor layer 127a may have an aluminum composition greater than 40% and less than 80%. When the aluminum composition of the 2-1 conductive semiconductor layer 127a is less than 40%, light may be absorbed. When the aluminum composition of the 2-1 conductive semiconductor layer 127a is greater than 80%, electric current injection efficiency may deteriorate. For example, when the aluminum composition of the well layer 126a is equal to 30%, the aluminum composition of the 2-1 conductive semiconductor layer 127a may be equal to 40%.

The 2-2 conductive semiconductor layer 127a may have a lower aluminum composition than the well layer 126a. When the 2-2 conductive semiconductor layer 127a has a higher aluminum composition than the well layer 126a, the 2-2 conductive semiconductor layer 127a is unable to be sufficiently ohmic with a p-ohmic electrode due to an increase in resistance therebetween, and also it is possible to reduce electric current injection efficiency.

The aluminum composition of the 2-2 conductive semiconductor layer 127a may be greater than 1% and less than 50%. When the aluminum composition is greater than 50%, the 2-2 conductive semiconductor layer 127a may be unable to be sufficiently ohmic with a p-ohmic electrode. When the aluminum composition is less that 1%, the 2-2 conductive semiconductor layer 127a may have a composition close to GaN and thus absorbs light.

The 2-2 conductive semiconductor layer 127a may have a thickness greater than about 1 nm and less than about 30 nm. As described above, the 2-2 conductive semiconductor layer 127a has an aluminum composition low enough to be ohmic and thus may absorb ultraviolet light. Accordingly, it may be advantageous, in terms of optical output power, that the 2-2 conductive semiconductor layer 127a be adjusted to be as thin as possible.

However, when the thickness of the 2-2 conductive semiconductor layer 127a is controlled to be 1 nm or less, the 2-2 conductive semiconductor layer 127a may not be disposed in some sections, and there may be a region in which the 2-1 conductive semiconductor layer 127a is exposed outside the light emitting structure 120. Also, when the thickness is greater than 30 nm, an absorbed quantity of light is so large that optical output power efficiency may decrease.

The 2-2 conductive semiconductor layer 127a may further include a first sub-layer 127e and a second sub-layer 127d. The first sub-layer 127e may be a surface layer in contact with the second electrode, and the second sub-layer 127d may be a layer for adjusting the aluminum composition.

The first sub-layer 127e may have an aluminum composition greater than 1% and less than 20%. Alternatively, the aluminum composition may be greater than 1% and less than 10%.

When the aluminum composition is less than 1%, the first sub-layer 127e may have a too high light absorption rate. When the aluminum composition is greater than 20%, contact resistance of the second electrode (i.e., the p-ohmic electrode) increases, and thus it is possible to reduce electric current injection efficiency.

However, the present invention is not limited thereto, and the aluminum composition of the first sub-layer 127e may be adjusted in consideration of the electric current injection characteristics and the light absorption rate. Alternatively, the aluminum composition may be adjusted according to optical output power required by a product.

For example, when the electric current injection characteristics are more important than the light absorption rate, the aluminum composition may be adjusted in the range of 1% to 10%. When the optical output power characteristics are more important than the electrical characteristics in products, the aluminum composition of the first sub-layer 127e may be adjusted in the range of 1% to 20%.

When the aluminum composition of the first sub-layer 127e is greater than 1% and less than 20%, an operating voltage may decease due to a decrease in resistance between the first sub-layer 127e and the second electrode. Accordingly, it is possible to enhance electrical characteristics. The first sub-layer 127e may be formed to a thickness greater than 1 nm and less than 10 nm. Accordingly, it is possible to alleviate the light absorption problem.

The 2-2 conductive semiconductor layer 127a may have a smaller thickness than the 2-1 conductive semiconductor layer 127a. A thickness ratio of the 2-1 conductive semiconductor layer 127a to the 2-2 conductive semiconductor layer 127a may range from 1.5:1 to 20:1. When the thickness ratio is less than 1.5:1, the 2-1 conductive semiconductor layer 127a is so thin that the electric current injection efficiency may decrease. When the thickness ratio is greater than 20:1, the 2-2 conductive semiconductor layer 127a is so thin that there may be a reduction in ohmic reliability.

The 2-1 conductive semiconductor layer 127a may have an aluminum composition decreasing away from the active layer 126. Also, the 2-2 conductive semiconductor layer 127a may have an aluminum composition decreasing away from the active layer 126. Accordingly, the aluminum composition of the first sub-layer 127e may satisfy the range of 1% to 10%.

However, the present invention is not limited thereto, and the aluminum compositions of the 2-1 conductive semiconductor layer 127a and the 2-2 conductive semiconductor layer 127a may include some sections in which there is no decrease, instead of continuously decreasing.

In this case, the 2-2 conductive semiconductor layer 127a may have a greater reduction in aluminum composition than the 2-1 conductive semiconductor layer 127a. That is, the 2-2 conductive semiconductor layer 127a may have a greater variation in aluminum composition in a thickness direction than the 2-1 conductive semiconductor layer 127a. Here, the thickness direction may refer to a direction from the first conductive semiconductor layer 124 to the second conductive semiconductor layer 127 or a direction from the second conductive semiconductor layer 127 to the first conductive semiconductor layer 124.

The 2-1 conductive semiconductor layer 127a has a greater thickness than the 2-2 conductive semiconductor layer 127a and has a higher aluminum composition than the well layer 126a. Accordingly, the 2-1 conductive semiconductor layer 127a may have a relatively gradual reduction in aluminum composition.

However, the 2-2 conductive semiconductor layer 127a has a small thickness and has a large variation in aluminum composition. Accordingly, the 2-2 conductive semiconductor layer 127a may have a relatively high reduction in aluminum composition.

Figure 30:
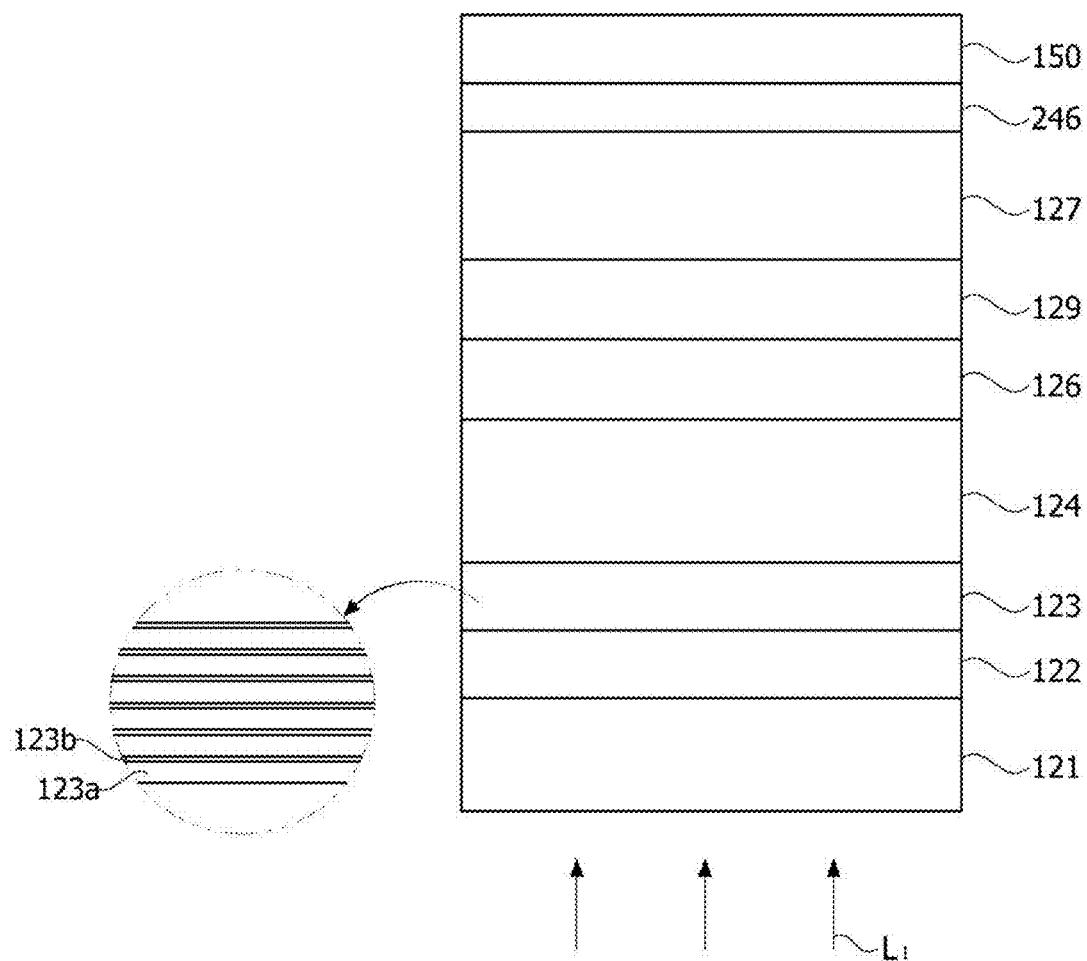
FIG. 30 is a conceptual view of a light emitting structure that is grown on a substrate.
Figure 33:
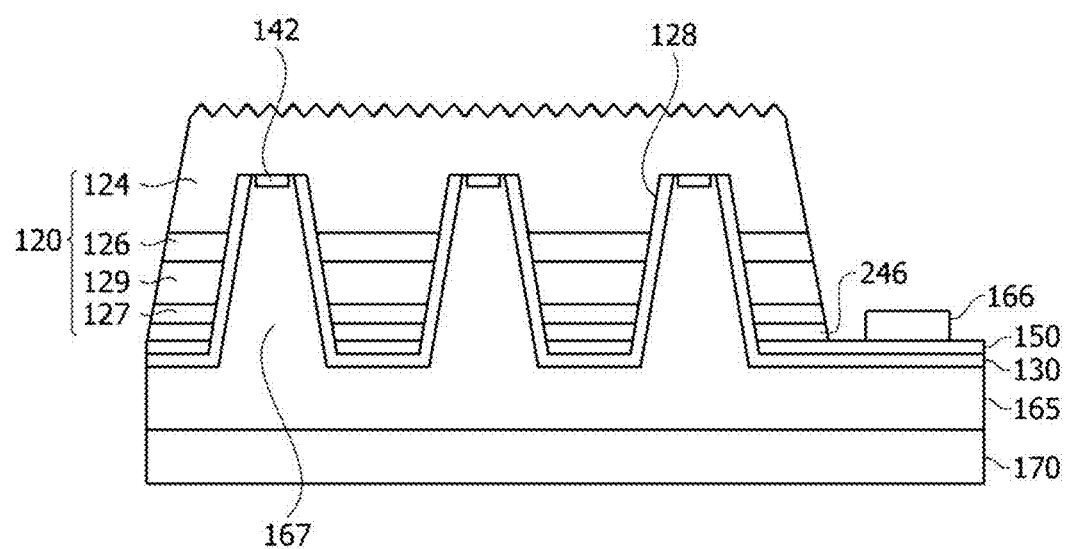
FIG. 33 is a diagram showing a produced semiconductor device.

FIG. 30 is a conceptual diagram of a light emitting structure grown on a substrate, FIG. 31 is a diagram illustrating a substrate separation process, FIG. 32 is a diagram illustrating a process of etching a light emitting structure, and FIG. 33 is a diagram showing a manufactured semiconductor device.

Referring to FIG. 30, a buffer layer 122, a light absorption layer 123, a first conductive semiconductor layer 124, an active layer 126, a second conductive semiconductor layer 127, a second electrode 246, and a second conductive layer 150 may be sequentially formed on a growth substrate 121.

In this case, a first intermediate layer and a second intermediate layer may be grown between the active layer 126 and the blocking layer 129. A first barrier layer may be grown to have a 1-1 section having an aluminum composition ranging from 50% to 70% and a 1-2 section having an aluminum composition ranging from 80% to 100%. Also, a second intermediate layer may be grown to have a 2-1 section undoped with a p-type dopant and a 2-2 section doped with a dopant.

The light absorption layer 123 includes a first light absorption layer 123a having a low aluminum composition and a second light absorption layer 123b having a high aluminum composition. A plurality of first light absorption layer 123a and a plurality of second light absorption layer 123b may be alternately disposed.

The first light absorption layer 123a may have a lower aluminum composition than the first conductive semiconductor layer 124. The first light absorption layer 123a may be separated when absorbing laser light during a laser lift-off (LLO) process. Accordingly, it is possible to remove the growth substrate.

The thickness and aluminum composition of the first light absorption layer 123a may be appropriately adjusted to absorb laser light having a predetermined wavelength (e.g., 246 nm). The aluminum composition of the first light absorption layer 123a may range from 20% to 50%, and the thickness of the first light absorption layer 123 may range from 1 nm to 10 nm. For example, the first light absorption layer 123a may be made of AlGaN, but is not limited thereto.

The second light absorption layer 123b may have a higher aluminum composition than the first conductive semiconductor layer 124. The second light absorption layer 123b may enhance crystallinity of the first conductive semiconductor layer 124, which is grown on the light absorption layer 123, by increasing an aluminum composition that has been decreased by the first light absorption layer 123a.

For example, the aluminum composition of the second light absorption layer 123b may range from 60% to 100%, and the thickness of the second light absorption layer 123b may range from 0.1 nm to 2.0 nm. The second light absorption layer 123b may be made of AlGaN or AlN.

In order to absorb laser light having a wavelength of 246 nm, the first light absorption layer 123a may be thicker than the second light absorption layer 123b. The thickness of the first light absorption layer 123a may range from 1 nm to 10 nm, and the thickness of the second light absorption layer 123b may range from 0.5 nm to 2.0 nm.

A thickness ratio of the first light absorption layer 123a to the second light absorption layer 123b may range from 2:1 to 6:1. When the thickness ratio is less than 2:1, the first light absorption layer 123a is so thin that it may be difficult to sufficiently absorb laser light. When the thickness ratio is greater than 6:1, the second light absorption layer 123b is so thin that the total aluminum composition of the light absorption layer may be reduced.

The light absorption layer 123 may have a total thickness greater than 100 nm and less than 400 nm. When the thickness is less than about 100 nm, the first light absorption layer 123a is so thin that it is difficult to sufficiently absorb 246 nm laser light. When the thickness is greater than about 400 nm, the total aluminum composition is reduced and thus it is possible for the crystallinity to deteriorate.

According to an embodiment, it is possible to enhance the crystallinity by forming the light absorption layer 123 to have a superlattice structure. Due to such a structure, the light absorption layer 123 may function as a buffer layer for alleviating a lattice mismatch between the growth substrate 121 and the light emitting structure 120.

Referring to FIG. 31, a step of removing the growth substrate 121 may include separating the growth substrate 121 by emitting laser L1 from a side where the growth substrate 121 is present. The laser light L1 may have a wavelength band absorbable by the first light absorption layer 123a. As an example, the laser light may be KrF laser light having a wavelength band of 248 nm.

The growth substrate 121 and the second light absorption layer 123b have energy band gaps too high to absorb the laser light L1. However, the first light absorption layer 123a, which has a low aluminum composition, may be disassembled by absorbing the laser light L1. Accordingly, it is possible to separate the first light absorption layer 123a together with the growth substrate 121.

Subsequently, a residual light absorption layer 123-2 on the first conductive semiconductor layer 124 may be removed through a labeling process.

Referring to FIG. 32, after the second conductive layer 150 is formed over the second conductive semiconductor layer 127, a plurality of recesses 128 may be formed to pass through up to a portion of the first conductive semiconductor layer 124 of the light emitting structure 120. Subsequently, an insulation layer 130 may be formed at one side of the recesses 128 and over the second conductive semiconductor layer 127. Subsequently, a first electrode 142 may be formed on a first conductive semiconductor layer 124b exposed by the recesses 128.

Referring to FIG. 33, a first conductive layer 165 may be formed under the insulation layer 130. The first conductive layer 165 may be electrically insulated from the second conductive layer 150 by the insulation layer 130.

Subsequently, a conductive substrate 170 may be formed under the first conductive layer 165, and a second electrode pad 166 may be formed on a second conductive layer 150 exposed through a mesa etching process.

The semiconductor device may be applied to various kinds of light source devices. For example, conceptually, the light source devices may include a sterilizing device, a curing device, a lighting device, a display device, and a vehicle lamp. That is, the semiconductor device may be applied to various electronic devices for providing light by being disposed on housings thereof.

The sterilizing device may sterilize a desired region by having the semiconductor device according to an embodiment. The sterilizing device may be applied to home appliances such as water purifiers, air conditioners, and refrigerators, but is not limited thereto. That is, the sterilizing device may be applied to various products needing to be sterilized (e.g., medical apparatuses).

For example, a water purifier may sterilize circulating water by having the sterilizing device according to an embodiment. The sterilizing device may be placed at a nozzle or a discharging port through which water circulates and configured to emit ultraviolet light. In this case, the sterilizing device may include a water-proof structure.

The curing device may cure various kinds of liquids by having the semiconductor device according to an embodiment. Conceptually, the liquids may include various materials that are cured when ultraviolet light is emitted. For example, the curing device may cure various types of resins. Alternatively, the curing device may also be applied to cure beauty products such as manicure products.

The lighting device may include a light source module including a substrate and the semiconductor device according to an embodiment. The lighting device may further include a heat dissipation unit configured to dissipate heat of the light source module, and a power supply unit configured to process or convert an electric signal provided by an external source and provide the electric signal to the light source module. Also, the lighting device may include a lamp, a head lamp, or a streetlight.

The display device may include a bottom cover, a reflective plate, a light emitting module, a light guide plate, an optical sheet, a display panel, an image signal output circuit, and a color filter. The bottom cover, the reflective plate, the light emitting module, the light guide plate, and the optical sheet may constitute a backlight unit.

The reflective plate may be placed on the bottom cover, and the light emitting module may emit light. The light guide plate may be placed in front of the reflective plate to guide light emitted by the light emitting module forward. The optical sheet may include a prism sheet or the like and may be placed in front of the light guide plate. The display panel may be placed in front of the optical sheet. The image signal output circuit may supply an image signal to the display panel. The color filter may be placed in front of the display panel.

When the semiconductor device is used as a backlight unit of a display device, the semiconductor device may be used as an edge-type backlight unit or a direct-type backlight unit.

The semiconductor device may be a laser diode rather than the above-described light emitting diode.

Like the light emitting device, the laser diode may include a first conductive semiconductor layer, an active layer, and a second conductive semiconductor layer, which have the above-described structures. The laser diode may also utilize an electroluminescence phenomenon in which light is emitted when electric current flows after a p-type first conductive semiconductor and an n-type second conductive semiconductor are bonded with each other, but has a difference in directionality and phase of the emitted light. That is, the laser diode uses stimulated emission and constructive interference so that light having a specific single wavelength may be emitted at the same phase and in the same direction. Due to these characteristics, the laser diode may be used for an optical communication device, a medical device, a semiconductor processing device, or the like.

A light receiving device may include, for example, a photodetector, which is a kind of transducer configured to detect light and convert intensity of the light into an electric signal. The photodetector may include a photocell (silicon and selenium), an optical output element (cadmium sulfide and cadmium selenide), a photodiode (e.g., a PD with a peak wavelength in a visible blind spectral region or a true blind spectral region), a photo transistor, a photomultiplier, a photoelectric tube (vacuum and gas filling), an infra-red (IR) detector, or the like, but is not limited thereto.

Generally, a semiconductor device such as the photodetector may be produced using a direct bandgap semiconductor having good photoelectric transformation efficiency. Alternatively, the photodetector may have various structures. As the most common structure, the photodetector may include a pin-type photodetector using a p-n junction, a Schottky photodetector using a Schottky junction, a metal-semiconductor-metal (MSM) photodetector, or the like.

Like the light emitting device, the photodiode may include a first conductive semiconductor layer, an active layer, and a second conductive semiconductor layer, which have the above-described structures, and may be formed as a p-n junction or a pin structure. The photodiode operates when a reverse bias or a zero bias is applied. When light is incident on the photodiode, electrons and holes are generated such that electric current flows. In this case, the magnitude of electric current may be approximately proportional to intensity of light incident on the photodiode.

A photocell or a solar cell, which is a kind of photodiode, may convert light into electric current. Like the light emitting device, the solar cell may include a first conductive semiconductor layer, an active layer, and a second conductive semiconductor layer, which have the above-described structures.

Also, the solar cell may be used as a rectifier of an electronic circuit through rectification characteristics of a general diode using a p-n junction and may be applied to an oscillation circuit or the like of a microwave circuit.

Also, the above-described semiconductor device is not necessarily implemented only with semiconductors. Depending on the case, the semiconductor device may additionally include a metal material. For example, a semiconductor device such as the light receiving device may be implemented using at least one of Ag, Al, Au, In, Ga, N, Zn, Se, P, and As and may be implemented using an intrinsic semiconductor material or a semiconductor material doped with a p-type dopant or an n-type dopant.

While the present invention has been described with reference to exemplary embodiments, these are just examples and do not limit the present invention. It will be understood by those skilled in the art that various modifications and applications may be made therein without departing from the essential characteristics of the embodiments. For example, the elements described in the embodiments above in detail may be modified and implemented. Furthermore, differences associated with such modifications and applications should be construed as being included in the scope of the present invention defined by the appended claims.

The invention claimed is:

1. A semiconductor device comprising:
  a light emitting structure that includes:
    a first conductivity type semiconductor layer having aluminum;
    a second conductivity type semiconductor layer having aluminum; and
    an active layer having aluminum and provided between the first conductivity type semiconductor layer and the second conductivity type semiconductor layer,
  wherein when primary ions are bombarded on the light emitting structure to sputter away secondary ions of aluminum from the first conductivity type semiconductor layer, the active layer and the second conductivity type semiconductor layer, secondary ions of aluminum are produced in respective intensities for the first conductivity type semiconductor layer, the active layer, and the second conductivity type semiconductor layer,
  wherein an intensity of the secondary ions of aluminum comprises a maximum intensity in the light emitting structure, a minimum intensity in the light emitting structure, a second intensity which is a smallest intensity in a region spaced away from the maximum intensity in a first direction, and a first peak intensity spaced away from the maximum intensity which is a greatest peak intensity in a region disposed between the maximum intensity and the second intensity,
  wherein the maximum intensity is spaced away from the minimum intensity in the first direction, and the first peak intensity is spaced away from the maximum intensity in the first direction,
  wherein the first conductivity type semiconductor layer includes a first region having the intensity of the secondary ions be between the first peak intensity and the second intensity, the second conductivity type semiconductor layer includes a second region having the intensity of the secondary ions be between the maximum intensity and the minimum intensity, and the active layer includes a third region having the intensity of the secondary ions be between the maximum intensity and the first peak intensity,
  wherein the first direction is a thickness direction of the light emitting structure from the second conductivity type semiconductor layer towards the first conductivity type semiconductor layer, and
  wherein a first intensity difference between the first peak intensity and the second intensity is less than a second intensity difference between the maximum intensity and the minimum intensity.

2. The semiconductor device of claim 1, wherein a ratio of the first intensity difference to the second intensity difference ranges from 1:1.5 to 1:2.5.

3. The semiconductor device of claim 1, wherein the second conductivity type semiconductor layer is an P-type semiconductor layer and a blocking layer, and the first conductivity type semiconductor layer is a N-type semiconductor layer.

4. The semiconductor device of claim 3, wherein:
the P-type semiconductor layer includes a first sublayer, a second sublayer, and a third sublayer,
the third sublayer is positioned relatively closer to the active layer than the first sublayer and the second sublayer, and the second sublayer is positioned between the first sublayer and the third sublayer,
an aluminum composition of first sublayer is lower than an aluminum composition of the second sublayer, and
an aluminum composition of third sublayer is higher than the aluminum compositions of the first and second sublayers.

5. The semiconductor device of claim 4, wherein each of the first sublayer, the second sublayer, and the third sublayer of the P-type semiconductor layer includes aluminum-gallium-nitride (AlGaN).

6. The semiconductor device of claim 1, further comprising:
a first electrode electrically connected with the first conductivity type semiconductor layer; and
a second electrode electrically connected with the second conductivity type semiconductor layer,
wherein the second conductivity type semiconductor layer includes a first surface on which the second electrode is positioned, the first surface being positioned opposite the active layer.

7. The semiconductor device of claim 1, wherein the second conductivity type semiconductor layer includes a blocking layer provided at a portion of second conductivity type semiconductor layer closest to the active layer.

8. The semiconductor device of claim 7, wherein the maximum intensity is exhibited in the blocking layer.

9. The semiconductor device of claim 7, wherein the blocking layer has an aluminum composition ranging from 50% to 90%.

10. The semiconductor device of claim 7, wherein:
the blocking layer includes a plurality of first blocking layers and a plurality of second layers, the first blocking layers and the second blocking layers are alternately provided in the blocking layer, and
an aluminum composition of the first blocking layers is greater than an aluminum composition of the second blocking layers.

11. The semiconductor device of claim 10, wherein the aluminum composition of the first blocking layers ranges from 70% to 90%, and the aluminum composition of the second blocking layers ranges from 50% to 70%.

12. The semiconductor device of claim 1, wherein the active layer includes one of a single-well structure, a multi-well structure, a single-quantum-well structure, a multi-quantum-well (MQW) structure, a quantum dot structure, or a quantum wire structure.

13. The semiconductor device of claim 1, wherein the active layer includes a plurality of well layers and a plurality of barrier layers that are alternately provided in the active layer.

14. The semiconductor device of claim 1, wherein the first conductivity type semiconductor layer exhibits the first peak intensity at a portion of the first conductivity type semiconductor layer closest to the active layer.

15. The semiconductor device of claim 1, wherein the intensity exhibited in the active layer is lower than the maximum intensities intensity and is higher than the minimum intensity.

16. The semiconductor device of claim 1, wherein the intensity exhibited in the active layer includes a plurality of peaks and a plurality of valleys.

17. The semiconductor device of claim 16, wherein a ratio of the intensity exhibited in the peaks and in the valleys of the active layer ranges from 1:0.5 to 1:0.75.

18. The semiconductor device of claim 1, wherein the secondary ions further include at least one of gallium, nitrogen, or carbon.

19. The semiconductor device of claim 1, wherein the second conductivity type semiconductor layer includes a first semiconductor material having an empirical formula $In_{x5}Al_{y2}Ga_{1-x5-y2}N(0 \leq x5 \leq 1, 0 \leq y2 \leq 1, 0 \leq x5=y2 \leq 1)$, and the first conductivity type semiconductor layer includes a second semiconductor material having an empirical formula $In_{x1}Al_{y1}G_{a1-x1-y1}N(0 \leq x1, 0 \leq y1 \leq 1, $ and $ 0 \leq x1=y1 \leq 1)$.

20. A semiconductor device package comprising:
a body; and
a semiconductor device disposed on the body, wherein the semiconductor device has a light emitting structure including:
a first conductivity type semiconductor layer having aluminum;
a second conductivity type semiconductor layer having aluminum; and
an active layer having aluminum and provided between the first conductivity type semiconductor layer and the second conductivity type semiconductor layer;
wherein when primary ions are bombarded on the light emitting structure to sputter away secondary ions of aluminum from the first conductivity type semiconductor layer, the active layer and the second conductivity type semiconductor layer, secondary ions of aluminum are produced in respective intensities for the first conductivity type semiconductor layer, the active layer, and the second conductivity type semiconductor layer,
wherein an intensity of the secondary ions of aluminum comprises a maximum intensity in the light emitting structure, a minimum intensity in the light emitting structure, a second intensity which is a smallest intensity in a region spaced away from the maximum intensity in a first direction, and a first peak intensity spaced away from the maximum intensity which is greatest peak intensity in a region disposed between the maximum intensity and the second intensity,
wherein the maximum intensity is spaced away from the minimum intensity in the first direction, and the first peak intensity is spaced away from the maximum intensity in the first direction,
wherein the first conductivity type semiconductor layer includes a first region having the intensity of the secondary ions be between the first peak intensity and the second intensity, the second conductivity type semiconductor layer includes a second region having the intensity of the secondary ions be between the maximum intensity and the minimum intensity, and the active layer includes a third region having the intensity of the secondary ions be between the maximum intensity and the first peak intensity,
wherein the first direction is a thickness direction of the light emitting structure from the second conductivity type semiconductor layer towards the first conductivity type semiconductor layer, and wherein a first intensity difference between the first peak intensity and the second intensity is less than a second intensity difference between the maximum intensity and the minimum intensity.

\* \* \* \* \*